(12) United States Patent
Uefuji et al.

(10) Patent No.: US 10,923,382 B2
(45) Date of Patent: Feb. 16, 2021

(54) ELECTROSTATIC CHUCK

(71) Applicant: TOTO LTD., Kitakyushu (JP)

(72) Inventors: Jumpei Uefuji, Kitakyushu (JP);
Hitoshi Sasaki, Kitakyushu (JP);
Kosuke Yamaguchi, Kitakyushu (JP);
Kengo Maehata, Kitakyushu (JP);
Yuichi Yoshii, Kitakyushu (JP)

(73) Assignee: Toto Ltd., Fukuoka (JP)

( * ) Notice: Subject to any disclaimer, the term of this patent is extended or adjusted under 35 U.S.C. 154(b) by 253 days.

(21) Appl. No.: 16/131,245

(22) Filed: Sep. 14, 2018

(65) Prior Publication Data

US 2019/0019715 A1 Jan. 17, 2019

Related U.S. Application Data

(63) Continuation of application No. PCT/JP2017/009894, filed on Mar. 13, 2017.

(30) Foreign Application Priority Data

Mar. 14, 2016 (JP) .............................. JP2016-049902
Jan. 24, 2017 (JP) .............................. JP2017-010353

(51) Int. Cl.
*H01L 21/683* (2006.01)
*B32B 18/00* (2006.01)
*H01L 21/67* (2006.01)

(52) U.S. Cl.
CPC .......... *H01L 21/6833* (2013.01); *B32B 18/00* (2013.01); *H01L 21/67103* (2013.01); *H01L 21/6831* (2013.01)

(58) Field of Classification Search
CPC ...... B32B 18/00; C12N 15/52; C12N 9/0036; C12N 9/1007; C12P 13/04; C12P 13/10;
(Continued)

(56) References Cited

U.S. PATENT DOCUMENTS 5,645,921 A * 7/1997 Matsunaga ......... H01L 21/6833
428/209
5,691,876 A * 11/1997 Chen .................... H01L 21/6833
361/234

(Continued)

FOREIGN PATENT DOCUMENTS

JP S51-13248 U 1/1976
JP S62-133721 A 6/1987
(Continued)

OTHER PUBLICATIONS

Translation JP 2011222257A (Year: 2020).*
Translation JPS2113248 (Year: 2020).*
Translation JP2011222257 (Year: 2020).*

*Primary Examiner* — Ibrahime A Abraham
*Assistant Examiner* — Frederick F Calvetti
(74) *Attorney, Agent, or Firm* — Carrier Blackman & Associates, P.C.; Joseph P. Carrier; William D. Blackman

(57) ABSTRACT

An electrostatic chuck includes a ceramic dielectric substrate, a base plate, and a heater plate. The heater plate is provided between the ceramic dielectric substrate and the base plate. The heater plate includes first and second support plates, first and second resin layers, and a heater element. Each of the first and second resin layers is provided between the first support plate and the second support plate. The heater element includes first and second electrically conductive portions. The first electrically conductive portion is provided between the first resin layer and the second resin layer. The second electrically conductive portion is separated from the first electrically conductive portion in an in-plane direction. The first resin layer contacts the second resin layer between the first electrically conductive portion and the second electrically conductive portion.

27 Claims, 29 Drawing Sheets

(58) Field of Classification Search
CPC .......... H01L 21/67103; H01L 21/6831; H01L 21/6833
USPC ....................................................... 118/725
See application file for complete search history.

(56) References Cited

U.S. PATENT DOCUMENTS

| | | | | |
|---|---|---|---|---|
| 5,851,641 | A * | 12/1998 | Matsunaga | H01L 21/6833 428/209 |
| 6,795,292 | B2 * | 9/2004 | Grimard | H01L 21/67103 361/234 |
| 7,582,186 | B2 * | 9/2009 | Strang | H01J 37/32642 118/728 |
| 8,449,679 | B2 * | 5/2013 | Dhindsa | H01J 37/32642 118/728 |
| 8,461,674 | B2 * | 6/2013 | Gaff | H01L 21/67109 257/690 |
| 8,587,113 | B2 * | 11/2013 | Gaff | F25B 21/04 257/690 |
| 9,159,767 | B2 * | 10/2015 | Park | H01L 43/12 |
| 9,281,226 | B2 * | 3/2016 | Makhratchev | H01R 43/16 |
| 9,392,643 | B2 * | 7/2016 | Singh | C23C 4/134 |
| 9,412,579 | B2 * | 8/2016 | Sadjadi | C23C 14/22 |
| 9,775,194 | B2 * | 9/2017 | Pease | H01L 21/67103 |
| 10,049,948 | B2 * | 8/2018 | Gaff | H01L 21/6831 |
| 2004/0027781 | A1 * | 2/2004 | Hanawa | H01L 21/67109 361/234 |
| 2008/0048311 | A1 * | 2/2008 | Ikenaga | H01L 23/3107 257/690 |
| 2008/0110874 | A1 * | 5/2008 | Hayashi | H05B 3/283 219/444.1 |
| 2012/0028057 | A1 * | 2/2012 | Aihara | C04B 37/028 428/457 |
| 2012/0238040 | A1 * | 9/2012 | Kubota | H01L 21/67069 438/5 |
| 2012/0250212 | A1 * | 10/2012 | Kimura | B28B 3/025 361/234 |
| 2013/0026720 | A1 * | 1/2013 | Hori | H01L 21/6833 279/128 |
| 2013/0105457 | A1 * | 5/2013 | Swanson | H05B 3/02 219/209 |
| 2013/0161305 | A1 * | 6/2013 | Ptasienski | H05B 3/06 219/201 |
| 2014/0154819 | A1 * | 6/2014 | Gaff | H01L 21/67109 438/17 |
| 2014/0209245 | A1 * | 7/2014 | Yamamoto | H01L 21/67109 156/345.53 |
| 2014/0263274 | A1 * | 9/2014 | Singh | H05B 1/0233 219/444.1 |
| 2015/0279714 | A1 * | 10/2015 | Yamaguchi | H01L 21/6831 279/128 |
| 2016/0013065 | A1 * | 1/2016 | Kubota | H01L 21/31116 438/5 |
| 2017/0178944 | A1 * | 6/2017 | Yamaguchi | H02N 13/00 |
| 2017/0229327 | A1 * | 8/2017 | Singh | C23C 4/134 |
| 2019/0019715 | A1 * | 1/2019 | Uefuji | H01L 21/67103 |
| 2019/0148204 | A1 * | 5/2019 | Yamaguchi | H02N 13/00 219/444.1 |
| 2019/0148206 | A1 * | 5/2019 | Yamaguchi | H01L 21/68735 219/444.1 |

FOREIGN PATENT DOCUMENTS

| | | |
|---|---|---|
| JP | H10-64984 A | 3/1998 |
| JP | 2000-243821 A | 9/2000 |
| JP | 2004-103648 A | 4/2004 |
| JP | 2011-222257 A | 11/2011 |
| JP | 2014-130908 A | 7/2014 |

* cited by examiner

US 10,923,382 B2

ELECTROSTATIC CHUCK

CROSS-REFERENCE TO RELATED APPLICATIONS

This application is a continuation application of International Application PCT/JP2017/009894, filed on Mar. 13, 2017. This application also claims priority to Japanese Application No. 2016-049902, filed on Mar. 14, 2016, and Japanese Application No. 2017-010353, filed on Jan. 24, 2017; the entire contents of each are incorporated herein by reference.

FIELD OF THE INVENTION

Embodiments of the invention relate generally to an electrostatic chuck.

BACKGROUND OF THE INVENTION

An electrostatic chuck is used to attract and hold a processing object such as a semiconductor wafer, a glass substrate, etc., inside a plasma processing chamber that performs etching, CVD (Chemical Vapor Deposition), sputtering, ion implantation, ashing, etc. The electrostatic chuck applies electrical power for electrostatic attraction to a built-in electrode and attracts and holds a substrate such as a silicon wafer, etc., by an electrostatic force.

In recent years, it is desirable to downsize and/or increase the processing speed of an IC chip including a semiconductor element such as a transistor, etc. Accordingly, it is desirable to increase the precision of the patterning such as etching, etc., when forming the semiconductor element on the wafer. The patterning precision of the etching indicates whether or not a pattern having the designed width and/or depth can be formed by patterning the wafer. By increasing the patterning precision of the etching, etc., the semiconductor element can be downscaled; and the integration can be increased. In other words, by increasing the patterning precision, faster speeds and downsizing of the chip are possible.

It is known that the patterning precision of etching or the like is dependent on the temperature of the wafer when patterning. Therefore, it is desirable to stably control the temperature of the wafer when patterning in a substrate processing apparatus including an electrostatic chuck. For example, the ability to cause the temperature distribution in the wafer surface to be uniform (temperature uniformity) is desirable. Also, the ability to deliberately set a temperature difference in the wafer surface (temperature controllability) is desirable. As a method for controlling the temperature of the wafer, a method is known in which an electrostatic chuck including a heater (a heating element) and/or a cooling plate is used. Generally, the temperature uniformity has a trade-off relationship with the temperature controllability.

The temperature of the wafer is affected by the fluctuation of the temperature of the cooling plate, the fluctuation of the temperature of the heater, the fluctuation of the thickness of the support plate supporting the heater, the fluctuation of the thickness of the resin layers provided at the periphery of the heater, etc. In the case where the heater is built into the electrostatic chuck, the method used to include the heater (e.g., the method for bonding) is one important element.

An RF (Radio Frequency) voltage (high frequency voltage) is applied in the processes of wafer patterning. When the RF voltage is applied, a general heater is affected by the high frequency waves and generates heat. Thereby, the temperature of the wafer is affected. Also, when the RF voltage is applied, a leakage current flows in the equipment side. Therefore, a mechanism such as a filter or the like is necessary on the equipment side.

In the processes in a plasma etching apparatus, etc., plasma that has various intensities and various distributions is irradiated on the wafer. When the plasma is irradiated on the wafer, temperature uniformity and temperature controllability are desirable simultaneously with controlling the temperature of the wafer to be a temperature suited to the process. Further, to increase the productivity, it is desirable to cause the temperature of the wafer to reach the prescribed temperature in a relatively short length of time. An abrupt temperature change, and/or the supply of heat, and/or the application of a high frequency voltage occur. Thereby, thermal/electrical/mechanical loads on the electrostatic chuck are generated. It is desirable for the electrostatic chuck to withstand these loads and control the wafer temperature with high reliability. It is difficult to simultaneously satisfy such requirements.

SUMMARY OF THE INVENTION

According to an embodiment of the invention, an electrostatic chuck that includes a ceramic dielectric substrate, a base plate, and a heater plate is provided; wherein a processing object is placed on the ceramic dielectric substrate; the base plate supports the ceramic dielectric substrate and is provided at a position separated from the ceramic dielectric substrate in a stacking direction; and the heater plate is provided between the ceramic dielectric substrate and the base plate, the heater plate includes a first support plate, a second support plate, a first resin layer, a second resin layer, a heater element, and a first hollow portion; the first support plate includes a metal and is provided between the ceramic dielectric substrate and the base plate, the second support plate includes a metal and is provided between the first support plate and the base plate, the first resin layer is provided between the first support plate and the second support plate, the second resin layer is provided between the first resin layer and the second support plate, the heater element is provided between the first resin layer and the second resin layer, the heater element emits heat due to a current flowing, the heater element includes a first electrically conductive portion and a second electrically conductive portion, the second electrically conductive portion is separated from the first electrically conductive portion in an in-plane direction perpendicular to the stacking direction, and the first hollow portion is defined by the second resin layer, the first resin layer, and a first side end portion in the in-plane direction of the first electrically conductive portion, the first resin layer contacts the second resin layer between the first electrically conductive portion and the second electrically conductive portion.

In other words, a first invention is an electrostatic chuck including a ceramic dielectric substrate, a base plate, and a heater plate, wherein a processing object is placed on the ceramic dielectric substrate; the base plate supports the ceramic dielectric substrate and is provided at a position separated from the ceramic dielectric substrate in a stacking direction; the heater plate is provided between the ceramic dielectric substrate and the base plate; the heater plate includes a first support plate, a second support plate, a first resin layer, a second resin layer, a heater element, and a first hollow portion; the first support plate includes a metal and is provided between the ceramic dielectric substrate and the base plate; the second support plate includes a metal and is provided between the first support plate and the base plate; the first resin layer is provided between the first support plate and the second support plate; the second resin layer is provided between the first resin layer and the second support plate; the heater element includes a first electrically conductive portion and a second electrically conductive portion; the first electrically conductive portion is provided between the first resin layer and the second resin layer; the second electrically conductive portion is separated from the first electrically conductive portion in an in-plane direction perpendicular to the stacking direction; the heater element generates heat due to a current flowing; the first hollow portion is defined by the second resin layer, the first resin layer, and a first side end portion in the in-plane direction of the first electrically conductive portion; and the first resin layer contacts the second resin layer between the first electrically conductive portion and the second electrically conductive portion.

According to the electrostatic chuck, the first hollow portion (a gap) is provided at the end portion of the first electrically conductive portion of the heater element. Even when the heater element undergoes thermal expansion, the first electrically conductive portion deforms to fill the first hollow portion. Therefore, the stress that is applied to the first resin layer and the second resin layer when the heater element deforms due to the thermal expansion can be reduced. Accordingly, peeling between the heater element and the first resin layer and peeling between the heater element and the second resin layer can be suppressed. Accordingly, the resistance to the load is high; and the reliability can be increased. The temperature change of the processing object occurring due to the peeling can be suppressed.

A second invention is the chuck of the first invention, wherein the first electrically conductive portion includes a second side end portion separated from the first side end portion in the in-plane direction; and the heater plate has a second hollow portion defined by the second side end portion, the first resin layer, and the second resin layer.

According to the electrostatic chuck, the second hollow portion (a gap) is provided at the end portion of the first electrically conductive portion of the heater element. Even when the heater element undergoes thermal expansion, the first electrically conductive portion deforms to fill the second hollow portion. Therefore, the stress that is applied to the first resin layer and the second resin layer when the heater element deforms due to the thermal expansion can be reduced. Accordingly, peeling between the heater element and the first resin layer and peeling between the heater element and the second resin layer can be suppressed. The temperature change of the processing object occurring due to the peeling can be suppressed.

A third invention is the electrostatic chuck of the first invention, wherein a width along the stacking direction of the first hollow portion is not more than a width along the stacking direction of the first electrically conductive portion.

According to the electrostatic chuck, even when the heater element deforms due to the thermal expansion, the stress that is applied to the first resin layer and the second resin layer can be reduced because the hollow portion is filled. Accordingly, peeling between the heater element and the first resin layer and peeling between the heater element and the second resin layer can be suppressed. The temperature change of the processing object occurring due to the peeling can be suppressed.

A fourth invention is the electrostatic chuck of the first invention, wherein a width along the stacking direction of the first hollow portion becomes narrower away from the first side end portion in the in-plane direction.

According to the electrostatic chuck, even when the heater element deforms due to the thermal expansion, the stress that is applied to the first resin layer and the second resin layer can be reduced because the hollow portion is filled. Accordingly, peeling between the heater element and the first resin layer and peeling between the heater element and the second resin layer can be suppressed. The temperature change of the processing object occurring due to the peeling can be suppressed.

A fifth invention is the electrostatic chuck of the first invention, wherein a boundary between the first hollow portion and the first resin layer approaches a virtual plane away from the first side end portion in the in-plane direction; the virtual plane extends in the in-plane direction and passes through a center in the stacking direction of the first electrically conductive portion; and a boundary between the first hollow portion and the second resin layer approaches the virtual plane away from the first side end portion in the in-plane direction.

According to the electrostatic chuck, even when the heater element deforms due to the thermal expansion, the stress that is applied to the first resin layer and the second resin layer can be reduced because the hollow portion is filled. Accordingly, peeling between the heater element and the first resin layer and peeling between the heater element and the second resin layer can be suppressed. The temperature change of the processing object occurring due to the peeling can be suppressed.

A sixth invention is the electrostatic chuck of the first invention, wherein the first electrically conductive portion has an upper surface opposing the first resin layer; a boundary between the first hollow portion and the second resin layer approaches a virtual plane away from the first side end portion in the in-plane direction; and the virtual plane extends in the in-plane direction and passes through the upper surface.

According to the electrostatic chuck, even when the heater element deforms due to the thermal expansion, the stress that is applied to the first resin layer and the second resin layer can be reduced because the hollow portion is filled. Accordingly, peeling between the heater element and the first resin layer and peeling between the heater element and the second resin layer can be suppressed. The temperature change of the processing object occurring due to the peeling can be suppressed.

The seventh invention is the electrostatic chuck of the first invention, wherein the first electrically conductive portion has a lower surface opposing the second resin layer; a boundary between the first hollow portion and the first resin layer approaches a virtual plane away from the first electrically conductive portion in the in-plane direction; and the virtual plane extends in the in-plane direction and passes through the lower surface.

According to the electrostatic chuck, even when the heater element deforms due to the thermal expansion, the stress that is applied to the first resin layer and the second resin layer can be reduced because the hollow portion is filled. Accordingly, peeling between the heater element and the first resin layer and peeling between the heater element and the second resin layer can be suppressed. The temperature change of the processing object occurring due to the peeling can be suppressed.

An eighth invention is the electrostatic chuck of the first invention, wherein the first electrically conductive portion has an upper surface opposing the first resin layer, and a lower surface opposing the second resin layer; and a width along the in-plane direction of one surface of the upper surface or the lower surface is narrower than a width along the in-plane direction of the other surface of the upper surface or the lower surface.

According to the electrostatic chuck, even when the heater element deforms due to the thermal expansion, the stress that is applied to the first resin layer and the second resin layer can be reduced because the hollow portion is filled. Accordingly, peeling between the heater element and the first resin layer and peeling between the heater element and the second resin layer can be suppressed. The temperature change of the processing object occurring due to the peeling can be suppressed.

A ninth invention is the electrostatic chuck of the eighth invention, wherein the one surface and a side surface of the first electrically conductive portion are connected by a curved surface.

According to the electrostatic chuck, even when the heater element deforms due to the thermal expansion, the stress that is applied to the first resin layer and the second resin layer can be reduced because the hollow portion is filled. Accordingly, peeling between the heater element and the first resin layer and peeling between the heater element and the second resin layer can be suppressed. The temperature change of the processing object occurring due to the peeling can be suppressed.

A tenth invention is the electrostatic chuck of the eighth invention, wherein a side surface of the first electrically conductive portion is rougher than the other surface.

According to the electrostatic chuck, even when the heater element deforms due to the thermal expansion, the stress that is applied to the first resin layer and the second resin layer can be reduced because the hollow portion is filled. Accordingly, peeling between the heater element and the first resin layer and peeling between the heater element and the second resin layer can be suppressed. The temperature change of the processing object occurring due to the peeling can be suppressed.

A eleventh invention is the electrostatic chuck of the eighth invention, wherein a distance between a center virtual plane and one support plate of the first support plate or the second support plate is shorter than a distance between the center virtual plane and the other support plate of the first support plate or the second support plate; the center virtual plane extends in the in-plane direction and passes through a center in the stacking direction of the first electrically conductive portion; and the one surface is positioned between the one support plate and the center virtual plane.

According to the electrostatic chuck, even when the heater element deforms due to the thermal expansion, the stress that is applied to the first resin layer and the second resin layer can be reduced because the hollow portion is filled. Accordingly, peeling between the heater element and the first resin layer and peeling between the heater element and the second resin layer can be suppressed. The temperature change of the processing object occurring due to the peeling can be suppressed.

A twelfth invention is the electrostatic chuck of the first invention, wherein the first support plate is electrically coupled to the second support plate.

According to the electrostatic chuck, the heater element can be shielded from high frequency waves. Thereby, the heat generation of the heater element to an abnormal temperature can be suppressed. Also, the impedance of the heater plate can be suppressed.

A thirteenth invention is the electrostatic chuck of the twelfth invention, wherein a surface area of the region where the first support plate is coupled to the second support plate is narrower than a surface area of an upper surface of the first support plate and narrower than a surface area of a lower surface of the second support plate.

According to the electrostatic chuck, the heater element can be shielded from high frequency waves. Thereby, the heat generation of the heater element to an abnormal temperature can be suppressed. Also, the impedance of the heater plate can be suppressed.

A fourteenth invention is the electrostatic chuck of the first invention, wherein an upper surface of the first support plate has a first unevenness; and a lower surface of the second support plate has a second unevenness.

According to the electrostatic chuck, because the upper surface of the first support plate has the first unevenness, the bonding surface area between the first support plate and the heater element can be wider; and the bonding strength between the first support plate and the heater element can be increased. Also, because the lower surface of the second support plate has the second unevenness, the bonding surface area between the second support plate and the heater element can be wider; and the bonding strength between the second support plate and the heater element can be increased. Further, because the upper surface of the first support plate has the first unevenness, the distance between the heater element and the processing object can be shorter. Thereby, the speed of increasing the temperature of the processing object can be increased.

A fifteenth invention is the electrostatic chuck of the fourteenth invention, wherein the first unevenness follows a configuration of the heater element; and the second unevenness follows a configuration of the heater element.

According to the electrostatic chuck, the bonding surface area between the first support plate and the heater element can be wider; and the bonding strength between the first support plate and the heater element can be increased. Also, the bonding surface area between the second support plate and the heater element can be wider; and the bonding strength between the second support plate and the heater element can be increased. Further, the distance between the heater element and the processing object can be shorter. Thereby, the speed of increasing the temperature of the processing object can be increased.

An sixteenth invention is the electrostatic chuck of the fifteenth invention, wherein a distance between a recess of the first unevenness and a recess of the second unevenness is shorter than a distance between a protrusion of the first unevenness and a protrusion of the second unevenness.

According to the electrostatic chuck, the bonding surface area between the first support plate and the heater element can be wider; and the bonding strength between the first support plate and the heater element can be increased. Also, the bonding surface area between the second support plate and the heater element can be wider; and the bonding strength between the second support plate and the heater element can be increased. Further, the distance between the heater element and the processing object can be shorter. Thereby, the speed of increasing the temperature of the processing object can be increased.

A seventeenth invention is the electrostatic chuck of the fourteenth invention, wherein a height of the first unevenness is different from a height of the second unevenness.

According to the electrostatic chuck, the bonding surface area between the first support plate and the heater element can be wider; and the bonding strength between the first support plate and the heater element can be increased. Also, the bonding surface area between the second support plate and the heater element can be wider; and the bonding strength between the second support plate and the heater element can be increased. Further, the distance between the heater element and the processing object can be shorter. Thereby, the speed of increasing the temperature of the processing object can be increased.

A eighteenth invention is the electrostatic chuck of the first invention, wherein the heater element includes a heater electrode having a band configuration; and the heater electrode is provided in a state of being mutually-independent in multiple regions.

According to the electrostatic chuck, the temperature in the surface of the processing object can be controlled independently for each region because the heater electrode is provided in the state of being mutually-independent in multiple regions. Thereby, a difference of the temperature in the surface of the processing object can be provided deliberately (temperature controllability).

A nineteenth invention is the electrostatic chuck of the first invention, wherein the heater element is multiply provided; and the multiple heater elements are provided in a state of being independent in mutually-different layers.

According to the electrostatic chuck, the temperature in the surface of the processing object can be controlled independently for each region because the heater element is provided in the state of being independent in mutually-different layers. Thereby, a difference of the temperature in the surface of the processing object can be provided deliberately (temperature controllability).

A twentieth invention is the electrostatic chuck of the first invention, wherein the heater plate further includes a bypass layer provided between the first support plate and the second support plate; and the bypass layer is electrically conductive.

According to the electrostatic chuck, the degrees of freedom of the arrangement of the terminals supplying electrical power to the heater element can be increased. By providing the bypass layer, terminals that have large thermal capacities may not be directly coupled to the heater element compared to the case where the bypass layer is not provided. Thereby, the uniformity of the temperature distribution in the surface of the processing object can be increased. Also, compared to the case where the bypass layer is not provided, the terminals may not be coupled to the thin heater element. Thereby, the reliability of the heater plate can be increased.

A twenty-first invention is the electrostatic chuck of the twentieth invention, wherein the heater element is electrically coupled to the bypass layer and electrically insulated from the first support plate and the second support plate.

According to the electrostatic chuck, the electrical power from the outside can be supplied to the heater element via the bypass layer.

A twenty-second invention is the electrostatic chuck of the twentieth invention, wherein the heater plate further has a hollow portion provided at a side of the bypass layer.

According to the electrostatic chuck, even when the bypass layer undergoes thermal expansion, the bypass layer deforms to fill the hollow portion. Therefore, the stress that is applied to the resin layers, etc., adjacent to the bypass layer can be reduced. Accordingly, peeling of the resin layers, etc., adjacent to the bypass layer can be suppressed. For example, the resistance of the heater plate to the load can be improved; and the reliability of the electrostatic chuck can be increased further. Further, the temperature change of the processing object occurring due to the peeling of the layers adjacent to the bypass layer can be suppressed.

A twenty-third invention is the electrostatic chuck of the twenty-second invention, wherein a side end of the first hollow portion is shifted toward the first support plate side or the second support plate side with respect to a center in a thickness direction of the first electrically conductive portion; and a side end of the hollow portion at the side of the bypass layer is shifted in the same direction as the side end of the first hollow portion with respect to a center in a thickness direction of the bypass layer.

According to the electrostatic chuck, it is unnecessary to use a complex method, etc., to form the first hollow portion and the hollow portion of the bypass layer; and the formation of the first hollow portion and the hollow portion of the bypass layer can be easy.

The twenty-fourth invention is the electrostatic chuck of the twentieth invention, wherein the heater element has a first surface on the first support plate side, and a second surface on the second support plate side; a width of the first surface is different from a width of the second surface; the bypass layer has a third surface on the first support plate side, and a fourth surface on the second support plate side; a width of the third surface is different from a width of the fourth surface; and a width size relationship of the third surface to the fourth surface is the same as a width size relationship of the first surface to the second surface.

According to the electrostatic chuck, in the case where the widths of the first surface and the third surface are narrow, the fluctuation of the heat distribution in a direction perpendicular to the first to fourth surfaces can be suppressed further. Conversely, in the case where the widths of the first surface and the third surface are wide, the first surface side and the third surface side retain heat easily; the heat of the second surface side and the fourth surface side is cooled easily; and the temperature responsiveness (the ramp rate) can be improved further.

A twenty-fifth invention is the electrostatic chuck of the twentieth invention, wherein the heater element has a first surface on the first support plate side, and a second surface on the second support plate side; a width of the first surface is different from a width of the second surface; the bypass layer has a third surface on the first support plate side, and a fourth surface on the second support plate side; a width of the third surface is different from a width of the fourth surface; and a width size relationship of the third surface to the fourth surface is the opposite of a width size relationship of the first surface to the second surface.

According to the electrostatic chuck, the direction of the stress applied by the thermal expansion of the bypass layer can have the reverse orientation of the direction of the stress applied by the thermal expansion of the heater element. Thereby, the effects of the stress can be suppressed further.

A twenty-sixth invention is the electrostatic chuck of the first invention, wherein a surface area of an upper surface of the first support plate is greater than a surface area of a lower surface of the second support plate.

According to the electrostatic chuck, the terminals that supply electrical power to the heater element can be connected more easily on the second support plate side when viewed from the heater element.

A twenty-seventh invention is the electrostatic chuck of the first invention, wherein the first support plate includes multiple supporters; and the multiple supporters are provided in a mutually-independent state.

According to the electrostatic chuck, a temperature difference in the diametrical direction can be provided deliberately in the surface of the first support plate (temperature controllability). For example, a temperature difference can be provided in a step configuration from the central portion to the outer perimeter portion in the surface of the first support plate. Thereby, a temperature difference can be provided deliberately in the surface of the processing object (temperature controllability).

A twenty-eighth invention is the electrostatic chuck of the first invention, wherein a surface of the first support plate on the second support plate side includes a first region and a second region; when viewed along the stacking direction, the first region overlaps the heater element, and the second region does not overlap the heater element; and in a cross section parallel to the stacking direction, the second region protrudes toward the second support plate side compared to the first region.

According to the electrostatic chuck, the adhesion between the first support plate and the layers proximal to the first support plate can be improved. Thereby, the designed thermal uniformity and withstand voltage characteristics can be realized.

A twenty-ninth invention is the electrostatic chuck of the twenty-eighth invention, wherein a surface of the second support plate on the first support plate side includes a third region and a fourth region; when viewed along the stacking direction, the third region overlaps the heater element, and the fourth region does not overlap the heater element; and in a cross section parallel to the stacking direction, the fourth region protrudes toward the first support plate side compared to the third region.

According to the electrostatic chuck, the adhesion between the second support plate and the layers proximal to the second support plate can be improved. Thereby, the designed thermal uniformity and withstand voltage characteristics can be realized.

DETAILED DESCRIPTION

Figure 1:
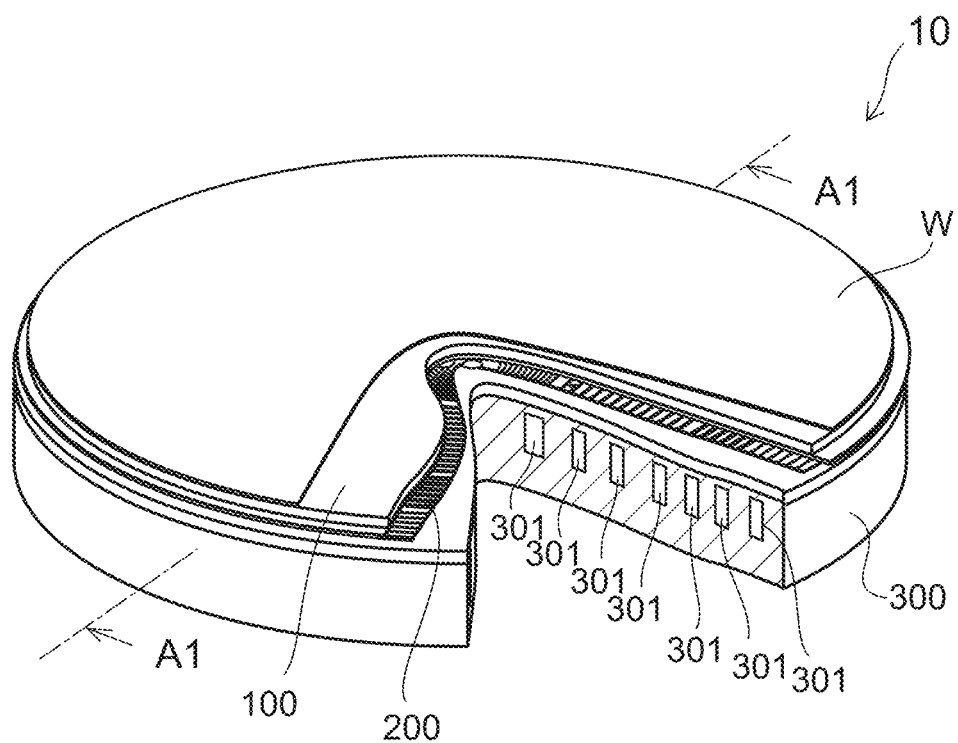
FIG. 1 is a schematic perspective view illustrating an electrostatic chuck according to the embodiment.

Embodiments of the invention will now be described with reference to the drawings. Similar components in the drawings are marked with the same reference numerals; and a detailed description is omitted as appropriate.

FIG. 1 is a schematic perspective view illustrating an electrostatic chuck according to the embodiment.

Figure 2A:
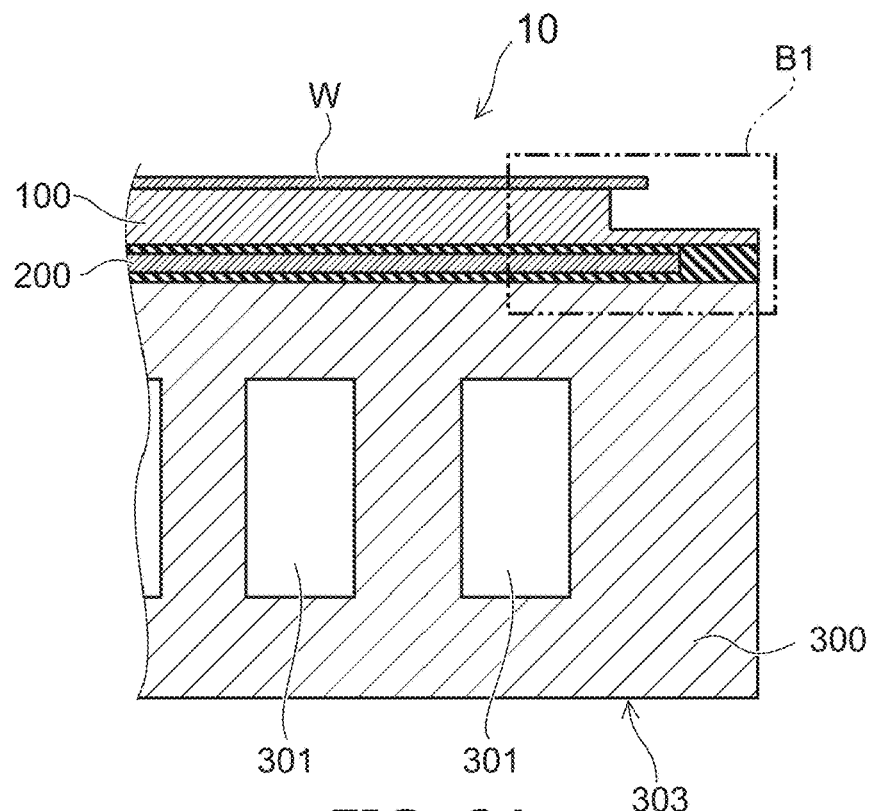
FIG. 2A and FIG. 2B are schematic cross-sectional views illustrating the electrostatic chuck according to the embodiment.
Figure 2B:
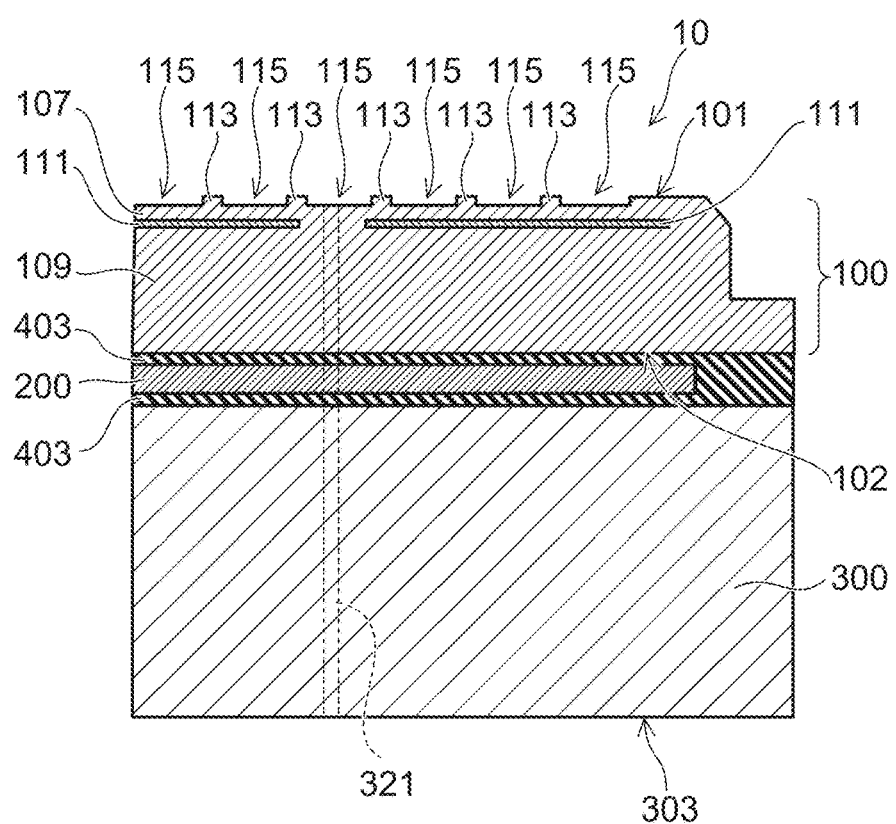

FIG. 2A and FIG. 2B are schematic cross-sectional views illustrating the electrostatic chuck according to the embodiment.

In FIG. 1, a cross-sectional view of a portion of the electrostatic chuck is illustrated for convenience of description. FIG. 2A is, for example, a schematic cross-sectional view of an A1-A1 cross section illustrated in FIG. 1. FIG. 2B is an enlarged schematic view of region B1 illustrated in FIG. 2A.

The electrostatic chuck 10 according to the embodiment includes a ceramic dielectric substrate 100, a heater plate 200, and a base plate 300.

The ceramic dielectric substrate 100 is provided at a position separated from the base plate 300 in the stacking direction (a Z-direction). The heater plate 200 is provided between the base plate 300 and the ceramic dielectric substrate 100.

A bonding agent 403 is provided between the base plate 300 and the heater plate 200. The bonding agent 403 is provided between the heater plate 200 and the ceramic dielectric substrate 100. A heat-resistant resin such as silicone that has a relatively high thermal conductivity or the like is an example of the material of the bonding agent 403. The thickness of the bonding agent 403 is, for example, not less than about 0.1 millimeters (mm) and not more than about 1.0 mm. The thickness of the bonding agent 403 is the same as the distance between the base plate 300 and the heater plate 200 or the distance between the heater plate 200 and the ceramic dielectric substrate 100.

The ceramic dielectric substrate 100 is, for example, a base material having a flat plate configuration made of a polycrystalline ceramic sintered body, has a first major surface 101 where a processing object W such as a semiconductor wafer or the like is placed, and has a second major surface 102 on the side opposite to the first major surface 101.

Here, in the description of the embodiment, a direction that connects the first major surface 101 and the second major surface 102 is taken as the Z-direction; one direction orthogonal to the Z-direction is taken as an X-direction; and a direction orthogonal to the Z-direction and the X-direction is taken as a Y-direction. The Z-direction is substantially parallel to the stacking direction of the base plate 300, the heater plate 200, and the ceramic dielectric substrate 100. In the description of the embodiment, the in-plane direction is one direction parallel to a plane including the X-direction and the Y-direction.

For example, $Al_2O_3$, $Y_2O_3$, YAG, etc., are examples of the material of the crystal included in the ceramic dielectric substrate 100. By using such materials, the infrared transmissivity, the insulation stability, and the plasma resistance of the ceramic dielectric substrate 100 can be increased.

An electrode layer 111 is provided in the interior of the ceramic dielectric substrate 100. The electrode layer 111 is interposed between the first major surface 101 and the second major surface 102. In other words, the electrode layer 111 is formed to be inserted into the ceramic dielectric substrate 100. The electrode layer 111 is sintered as one body with the ceramic dielectric substrate 100.

The electrode layer 111 is not limited to being interposed between the first major surface 101 and the second major surface 102 and may be accessorily provided at the second major surface 102.

By applying an attracting/holding voltage to the electrode layer 111, the electrostatic chuck 10 generates a charge on the first major surface 101 side of the electrode layer 111 and holds the processing object W by an electrostatic force.

The heater plate 200 generates heat by a heater current flowing; and the temperature of the processing object W can be higher compared to the case where the heater plate 200 does not generate heat.

The electrode layer 111 is provided along the first major surface 101 and the second major surface 102. The electrode layer 111 is an attraction electrode for attracting and holding the processing object W. The electrode layer 111 may be a unipole-type or a dipole-type. The electrode layer 111 also may be a tripole-type or another multi-pole type. The number of the electrode layers 111 and the arrangement of the electrode layers 111 are appropriately selected.

The ceramic dielectric substrate 100 includes a first dielectric layer 107 between the electrode layer 111 and the first major surface 101, and a second dielectric layer 109 between the electrode layer 111 and the second major surface 102. In the ceramic dielectric substrate 100, it is favorable for the infrared spectral transmittance of at least the first dielectric layer 107 to be 20% or more. In the embodiment, the infrared spectral transmittance is a value converted to a thickness of 1 mm.

The infrared rays that are emitted from the heater plate 200 in the state in which the processing object W is placed on the first major surface 101 can efficiently pass through the ceramic dielectric substrate 100 by setting the infrared spectral transmittance of at least the first dielectric layer 107 of the ceramic dielectric substrate 100 to be 20% or more. Accordingly, the heat is not stored easily in the processing object W; and the controllability of the temperature of the processing object W increases.

For example, in the case where the electrostatic chuck 10 is used inside a chamber in which plasma processing is performed, the temperature of the processing object W increases more easily as the plasma power increases. In the electrostatic chuck 10 of the embodiment, the heat that is transferred to the processing object W by the plasma power is transferred efficiently to the ceramic dielectric substrate 100. Further, the heat that is transferred to the ceramic dielectric substrate 100 by the heater plate 200 is transferred efficiently to the processing object W. Accordingly, the processing object W is maintained more easily at the desired temperature by efficiently transferring heat.

In the electrostatic chuck 10 according to the embodiment, it is desirable for the infrared spectral transmittance of the second dielectric layer 109, in addition to the first dielectric layer 107, to be 20% or more. By setting the infrared spectral transmittances of the first dielectric layer 107 and the second dielectric layer 109 to be 20% or more, the infrared rays that are emitted from the heater plate 200 pass through the ceramic dielectric substrate 100 more efficiently; and the temperature controllability of the processing object W can be increased.

The base plate 300 is provided on the second major surface 102 side of the ceramic dielectric substrate 100 and supports the ceramic dielectric substrate 100 via the heater plate 200. A passageway 301 is provided in the base plate 300. Namely, the passageway 301 is provided in the interior of the base plate 300. For example, aluminum is an example of the material of the base plate 300.

The base plate 300 performs the role of the temperature adjustment of the ceramic dielectric substrate 100. For example, in the case where the ceramic dielectric substrate 100 is cooled, a cooling medium is caused to flow into the passageway 301. The cooling medium that flows in passes through the passageway 301 and flows out from the passageway 301. Thereby, the heat of the base plate 300 is absorbed by the cooling medium; and the ceramic dielectric substrate 100 that is mounted on the base plate 300 can be cooled.

On the other hand, in the case where the ceramic dielectric substrate 100 is heated, it is also possible to provide a heating medium into the passageway 301. Or, it is also possible for a not-illustrated heater to be built into the base plate 300. Thus, when the temperature of the ceramic dielectric substrate 100 is adjusted by the base plate 300, the temperature of the processing object W held by the electrostatic chuck 10 can be adjusted easily.

Also, protrusions 113 are provided as necessary on the first major surface 101 side of the ceramic dielectric substrate 100. Grooves 115 are provided between mutually-adjacent protrusions 113. The grooves 115 communicate with each other. A space is formed between the grooves 115 and the back surface of the processing object W placed on the electrostatic chuck 10.

An introduction path 321 that pierces the base plate 300 and the ceramic dielectric substrate 100 is connected to the grooves 115. If a transfer gas such as helium (He) or the like is introduced from the introduction path 321 in the state in which the processing object W is held, the transfer gas flows in the space provided between the processing object W and the grooves 115; and the processing object W can be directly heated or cooled by the transfer gas.

Figure 3:
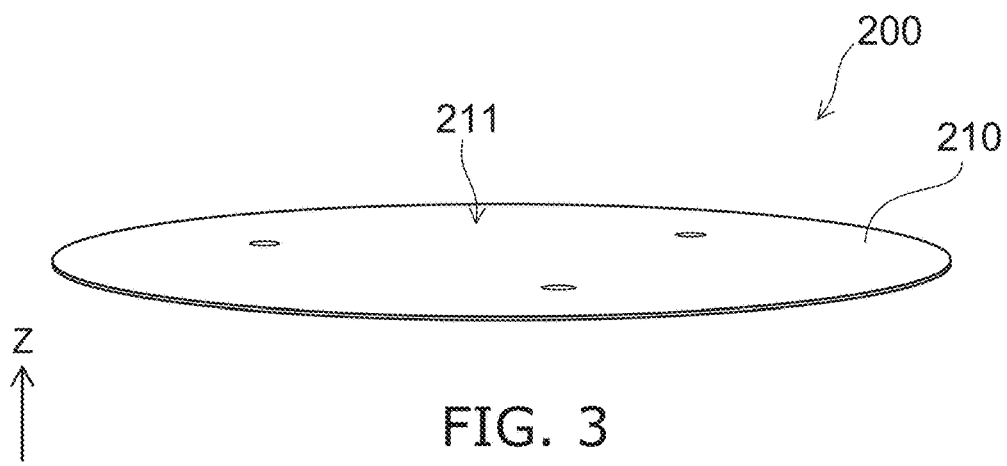
FIG. 3 is a schematic perspective view illustrating the heater plate of the embodiment.

FIG. 3 is a schematic perspective view illustrating the heater plate of the embodiment.

Figure 4A:
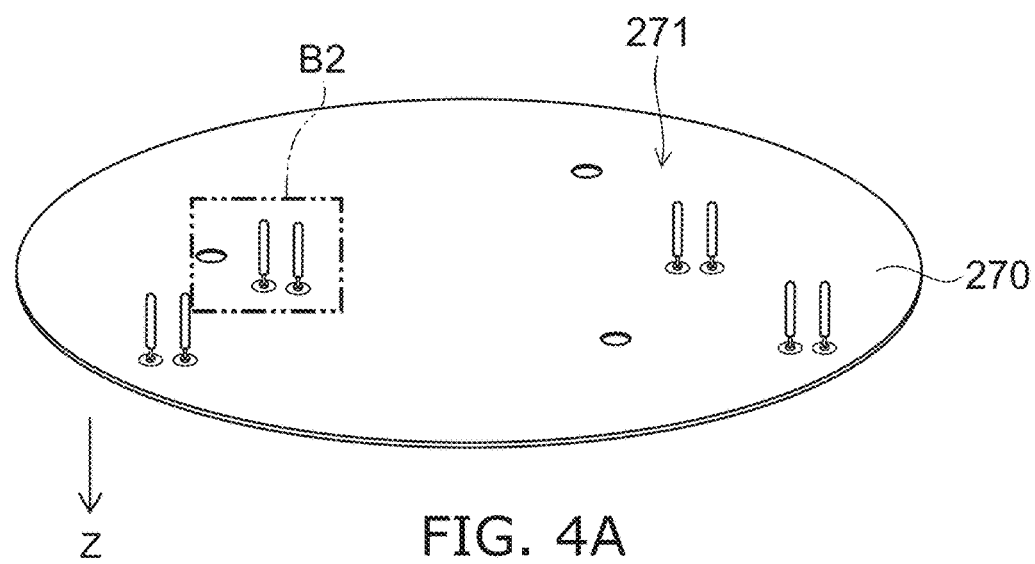
FIG. 4A and FIG. 4B are schematic perspective views illustrating the heater plate of the embodiment.
Figure 4B:
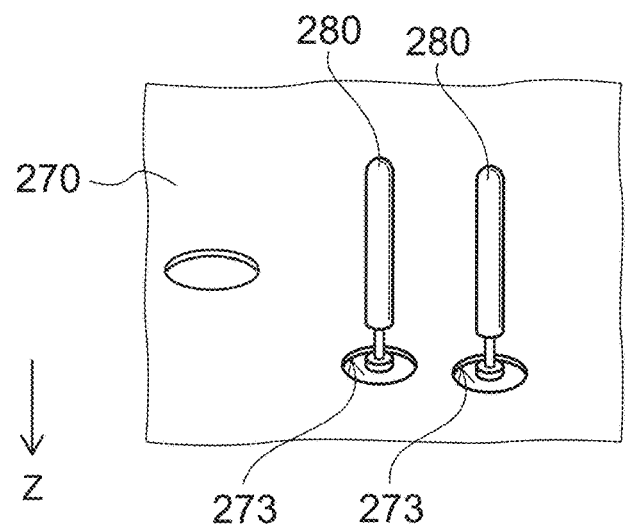

FIG. 4A and FIG. 4B are schematic perspective views illustrating the heater plate of the embodiment.

Figure 5:
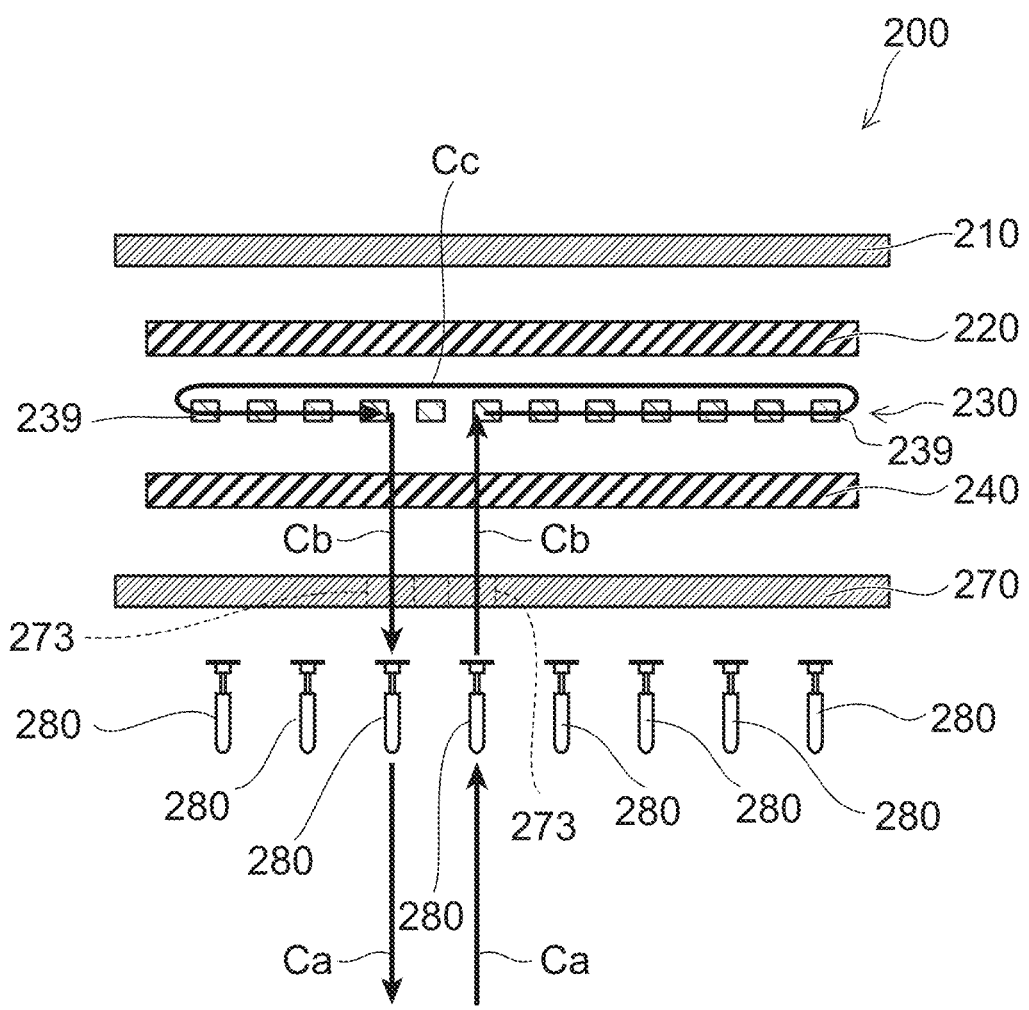
FIG. 5 is a schematic exploded view illustrating the heater plate of the embodiment.

FIG. 5 is a schematic exploded view illustrating the heater plate of the embodiment.

FIG. 3 is a schematic perspective view of the heater plate of the embodiment viewed from the upper surface (the surface on the ceramic dielectric substrate 100 side). FIG. 4A is a schematic perspective view of the heater plate of the embodiment viewed from the lower surface (the surface on the base plate 300 side). FIG. 4B is an enlarged schematic view of region B2 illustrated in FIG. 4A.

As illustrated in FIG. 5, the heater plate 200 of the embodiment includes a first support plate 210, a first resin layer 220, a heater element (a heating layer) 230, a second resin layer 240, a second support plate 270, and power supply terminals 280. As illustrated in FIG. 3, a surface 211 (the upper surface) of the first support plate 210 forms the upper surface of the heater plate 200. As illustrated in FIG. 4, a surface 271 (the lower surface) of the second support plate 270 forms the lower surface of the heater plate 200. The first support plate 210 and the second support plate 270 are support plates that support the heater element 230, etc. In the example, the first support plate 210 and the second support plate 270 clamp and support the first resin layer 220, the heater element 230, and the second resin layer 240.

The first support plate 210 is provided between the ceramic dielectric substrate 100 and the base plate 300. The second support plate 270 is provided between the first support plate 210 and the base plate 300. The first resin layer 220 is provided between the first support plate 210 and the second support plate 270. The second resin layer 240 is provided between the first resin layer 220 and the second support plate 270. The heater element 230 is provided between the first resin layer 220 and the second resin layer 240.

The first support plate 210 has a relatively high thermal conductivity. For example, a metal that includes at least one of aluminum, copper, or nickel, graphite that has a multi-layered structure, etc., are examples of the material of the first support plate 210. Aluminum or an aluminum alloy is suitable as the material of the first support plate 210 from the perspective of the magnetic properties and/or the contamination of the chamber and from the perspective of realizing both "high throughput" and "in-plane temperature uniformity of the processing object" which generally have an antinomic relationship. The thickness (the length in the Z-direction) of the first support plate 210 is, for example, not less than about 0.1 mm and not more than about 5.0 mm. More favorably, the thickness of the first support plate 210 is, for example, not less than about 0.3 mm and not more than about 1.0 mm. The first support plate 210 increases the uniformity of the temperature distribution in the surface of the heater plate 200. The first support plate 210 suppresses the warp of the heater plate 200. The first support plate 210 increases the strength of the bond between the heater plate 200 and the ceramic dielectric substrate 100.

An RF (Radio Frequency) voltage (high frequency voltage) is applied in the processing processes of the processing object W. When the high frequency voltage is applied, the heater element 230 may generate heat due to the effects of the high frequency waves. Thereby, the temperature controllability of the heater element 230 degrades.

Conversely, in the embodiment, the first support plate 210 shields the heater element 230 and a bypass layer 250 from the high frequency waves. Thereby, the heat generation of the heater element 230 to an abnormal temperature can be suppressed by the first support plate 210.

The material, thickness, and function of the second support plate 270 can be set freely according to the desired performance, dimensions, etc. For example, the material, thickness, and function of the second support plate 270 can be respectively the same as the material, thickness, and function of the first support plate 210. The first support plate 210 is electrically coupled to the second support plate 270. Here, in this specification, contact is within the scope of "coupled." Details of the electrical coupling between the second support plate 270 and the first support plate 210 are described below.

Thus, the first support plate 210 and the second support plate 270 have relatively high thermal conductivities. Thereby, the first support plate 210 and the second support plate 270 improve the thermal diffusion of the heat supplied from the heater element 230. Also, by providing the first support plate 210 and the second support plate 270 with moderate thicknesses and rigidities, for example, the warp of the heater plate 200 is suppressed. Further, for example, the first support plate 210 and the second support plate 270 improve the shielding performance for the RF voltage applied to the electrodes of the wafer processing apparatus, etc. For example, the effects of the RF voltage on the heater element 230 are suppressed. Thus, the first support plate 210 and the second support plate 270 have the function of thermal diffusion, the function of warp suppression, and the function of shielding from the RF voltage.

For example, polyimide, polyamide-imide, etc., are examples of the material of the first resin layer 220. The thickness (the length in the Z-direction) of the first resin layer 220 is not less than about 20 μm and not more than about 0.20 mm, e.g., 50 μm. The first resin layer 220 couples the first support plate 210 and the heater element 230 to each other. The first resin layer 220 electrically insulates between the first support plate 210 and the heater element 230. Thus, the first resin layer 220 has the function of electric insulation and the function of surface coupling.

The material and thickness of the second resin layer 240 are respectively about the same as the material and thickness of the first resin layer 220.

The second resin layer 240 couples the heater element 230 and the second support plate 270 to each other. The second resin layer 240 electrically insulates between the heater element 230 and the second support plate 270. Thus, the second resin layer 240 has the function of electric insulation and the function of surface coupling.

For example, a metal that includes at least one of stainless steel, titanium, chrome, nickel, copper, or aluminum or the like is an example of the material of the heater element 230. The thickness (the length in the Z-direction) of the heater element 230 is not less than about 10 μm and not more than about 0.20 mm, e.g., 30 μm. The heater element 230 is electrically insulated from the first support plate 210 and the second support plate 270.

The heater element 230 generates heat when a current flows, and controls the temperature of the processing object W. For example, the heater element 230 heats the processing object W to a prescribed temperature. For example, the heater element 230 causes the temperature distribution in the surface of the processing object W to be uniform. For example, the heater element 230 deliberately provides a difference of the temperature in the surface of the processing object W. The heater element 230 includes a heater electrode 239 having a band configuration.

The power supply terminals 280 are electrically coupled to the heater element 230. The power supply terminals 280 are provided from the heater plate 200 toward the base plate 300 in the state in which the heater plate 200 is provided between the base plate 300 and the ceramic dielectric substrate 100. The power supply terminals 280 supply, to the heater element 230, electrical power that is supplied from outside the electrostatic chuck 10.

The heater plate 200 includes multiple power supply terminals 280. The heater plate 200 illustrated in FIG. 3 to FIG. 5 includes eight power supply terminals 280. The number of the power supply terminals 280 is not limited to eight. One power supply terminal 280 is electrically coupled to one heater electrode 239. Holes 273 pierce the second support plate 270. The power supply terminals 280 are electrically coupled to the heater electrode 239 via the holes 273.

When the electrical power is supplied to the power supply terminal 280 from outside the electrostatic chuck 10 as illustrated by arrow Ca and arrow Cb illustrated in FIG. 5, the current flows through the prescribed zone (the region) of the heater element 230 as illustrated by arrow Cc illustrated in FIG. 5. The details of the zone of the heater element 230 are described below. The current that flows toward the heater element 230 flows toward the power supply terminal 280 and flows outside the electrostatic chuck 10 from the power supply terminal 280 as illustrated by arrow Cd and arrow Ce illustrated in FIG. 5.

Thus, a portion where the current enters the heater element 230 and a portion where the current exits from the heater element 230 exist in the coupling portions between the heater element 230 and the power supply terminal 280. That is, a pair of coupling portions exists between the heater element 230 and the power supply terminals 280. Because the heater plate 200 illustrated in FIG. 3 to FIG. 5 includes the eight power supply terminals 280, four pairs of coupling portions exist between the heater element 230 and the power supply terminals 280.

According to the embodiment, the heater element 230 is provided between the first support plate 210 and the second support plate 270. Thereby, the uniformity of the temperature distribution in the surface of the heater plate 200 can be improved; and the uniformity of the temperature distribution in the surface of the processing object W can be increased. Also, the first support plate 210 and the second support plate 270 shield the heater element 230 (and the bypass layer 250 described below) from the high frequency waves; and the heat generation of the heater element 230 to an abnormal temperature can be suppressed.

As described above, the power supply terminal 280 is provided from the heater plate 200 toward the base plate 300. Therefore, the electrical power can be supplied to the power supply terminal 280 via a member called a socket, etc., from a lower surface 303 (referring to FIG. 2A and FIG. 2B) side of the base plate 300. Thereby, the wiring of the heater is realized while suppressing the exposure of the power supply terminal 280 inside the chamber where the electrostatic chuck 10 is placed.

A method for manufacturing the heater plate 200 of the embodiment will now be described.

First, in the method for manufacturing the heater plate 200 according to the embodiment, for example, the first support plate 210 and the second support plate 270 are manufactured by performing machining of aluminum. For example, an inspection of the first support plate 210 and the second support plate 270 is performed using a three-dimensional measuring instrument, etc.

Then, for example, the first resin layer 220 and the second resin layer 240 are manufactured by cutting a polyimide film by using a laser, machining, punching, dissolving, etc. For example, an inspection of the first resin layer 220 and the second resin layer 240 is performed by naked eye, etc.

Then, the heater pattern is formed by cutting a metal including at least one of stainless steel, titanium, chrome, nickel, copper, or aluminum by punching, machining, etching utilizing photolithography technology and/or printing technology, etc. Thereby, the heater element 230 is manufactured. Also, a measurement of the resistance value of the heater element 230 or the like is performed.

Continuing, a stacked body in which the members of the heater plate 200 are stacked is compression-bonded.

Thus, the heater plate 200 of the embodiment is manufactured.

An inspection of the heater plate 200 after the manufacturing or the like is performed as appropriate.

The structure of the heater plate 200 according to the embodiment will now be described further with reference to the drawings.

Figure 6:
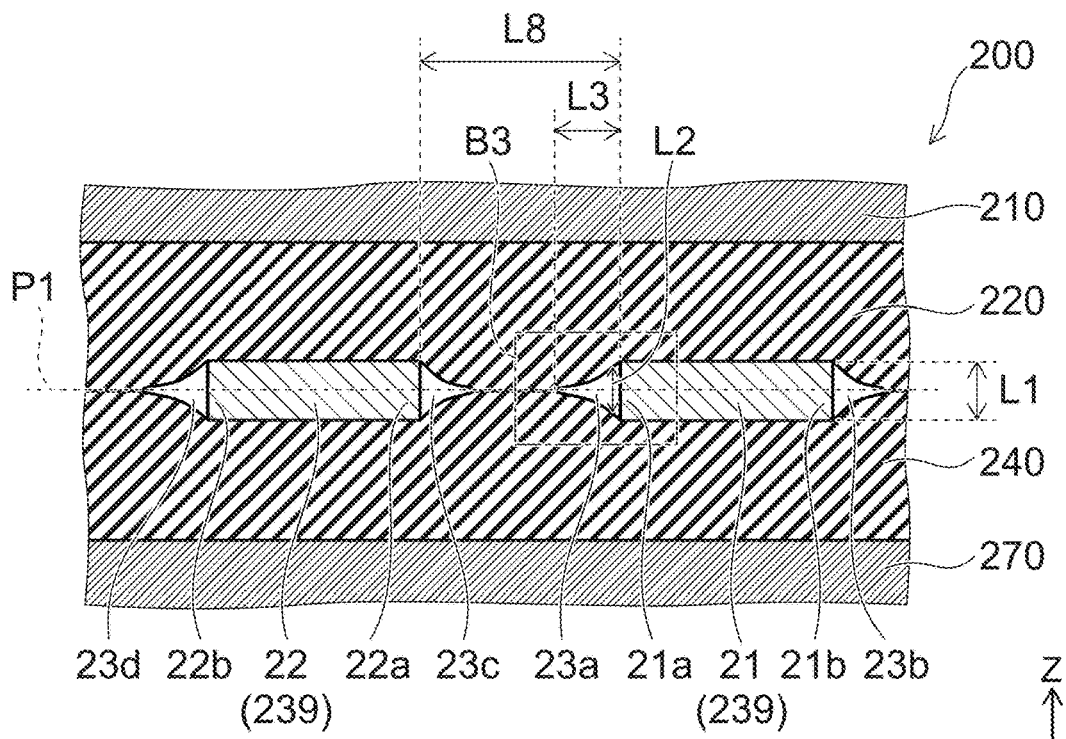
FIG. 6 is a cross-sectional view illustrating a portion of the heater plate of the embodiment.

FIG. 6 is a cross-sectional view illustrating a portion of the heater plate of the embodiment.

Figure 7:
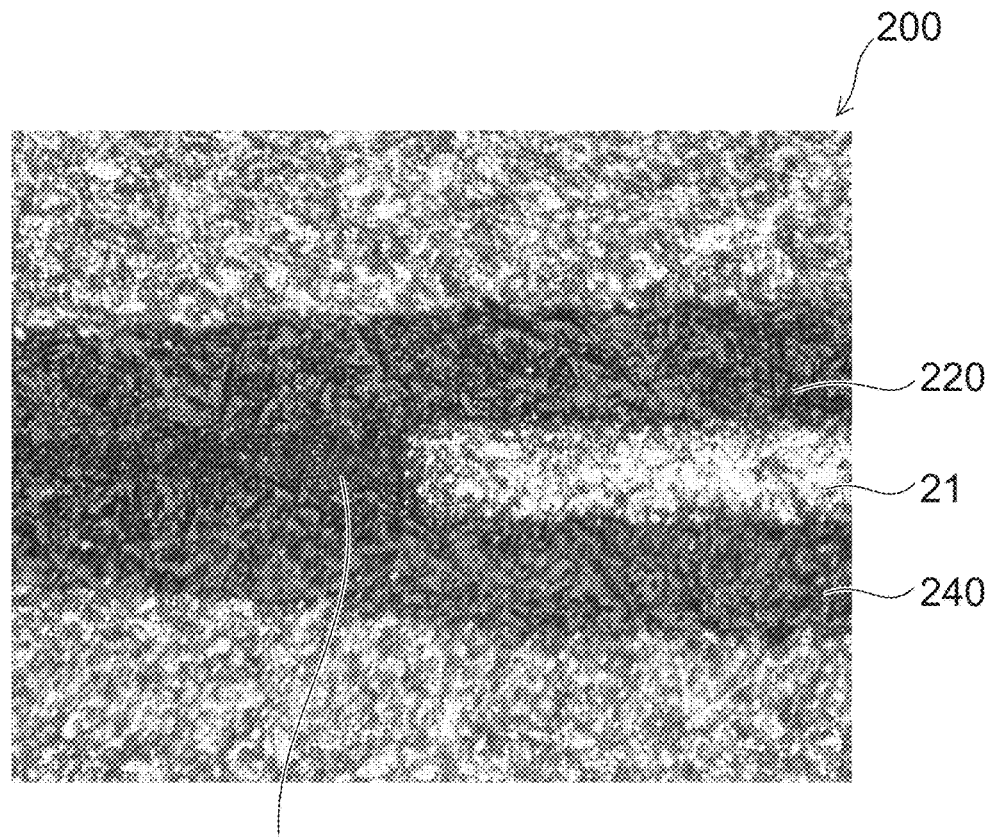
FIG. 7 is a photograph of the heater plate of the embodiment.

FIG. 7 is a photograph of the heater plate of the embodiment. A cross section corresponding to region B3 illustrated in FIG. 6 is observed in FIG. 7.

In the embodiment, the heater electrode 239 is disposed independently in multiple regions. For example, as illustrated in FIG. 6, the heater electrode 239 (the heater element 230) includes a first electrically conductive portion 21 and a second electrically conductive portion 22. The second electrically conductive portion 22 is separated from the first electrically conductive portion 21 in an in-plane direction Dp (e.g., the X-direction). The first electrically conductive portion 21 and the second electrically conductive portion 22 are portions of the heater electrode 239. The distance between the first electrically conductive portion 21 and the second electrically conductive portion 22 (a width L8 of a separating portion 235 between the first electrically conductive portion 21 and the second electrically conductive portion 22) is, for example, 500 μm or more. Thus, by disposing the heater electrode 239 in the multiple regions, the temperature in the surface of the processing object W can be controlled in each region. Specific examples of the pattern of the heater electrode 239 are described below with reference to FIG. 19A, FIG. 19B, and FIG. 20.

The first electrically conductive portion 21 includes a side end portion 21a (a first side end portion) and a side end portion 21b (a second side end portion). The side end portion 21a and the side end portion 21b are two end portions in the in-plane direction Dp of the first electrically conductive portion 21. The side end portion 21a is positioned on the second electrically conductive portion 22 side. The side end portion 21b is the end portion on the side opposite to the side end portion 21a and is separated from the side end portion 21a in the in-plane direction Dp.

Similarly, the second electrically conductive portion 22 includes a side end portion 22a (a third side end portion) and a side end portion 22b (a fourth side end portion). The side end portion 22a and the side end portion 22b are two end portions in the in-plane direction Dp of the second electrically conductive portion 22. The side end portion 22a is positioned on the first electrically conductive portion 21 side. The side end portion 22b is the end portion on the side opposite to the side end portion 22a and is separated from the side end portion 22a in the in-plane direction Dp.

The heater plate 200 includes first to fourth hollow portions 23a to 23d.

The first hollow portion 23a is a space defined (surrounded) by the side end portion 21a, the first resin layer 220, and the second resin layer 240. The first hollow portion 23a is adjacent to the side end portion 21a in the in-plane direction Dp and is positioned between the first electrically conductive portion 21 and the second electrically conductive portion 22.

The second hollow portion 23b is a space defined by the side end portion 21b, the first resin layer 220, and the second resin layer 240. The second hollow portion 23a is adjacent to the side end portion 21b in the in-plane direction Dp. The first electrically conductive portion 21 is positioned between the first hollow portion 23a and the second hollow portion 23b.

The third hollow portion 23c is a space defined by the side end portion 22a, the first resin layer 220, and the second resin layer 240. The third hollow portion 23c is adjacent to the side end portion 22a in the in-plane direction Dp and is positioned between the first electrically conductive portion 21 and the second electrically conductive portion 22.

The fourth hollow portion 23d is a space defined by the side end portion 22b, the first resin layer 220, and the second resin layer 240. The fourth hollow portion 23d is adjacent to the side end portion 22b in the in-plane direction Dp. The second electrically conductive portion 22 is positioned between the third hollow portion 23c and the fourth hollow portion 23d.

A width L2 along the Z-direction of the first hollow portion 23a is not more than a width L1 along the Z-direction of the first electrically conductive portion 21. The width along the Z-direction of the second hollow portion 23b is not more than the width along the Z-direction of the first electrically conductive portion 21. Similarly, the width along the Z-direction of the third hollow portion 23c and the width along the Z-direction of the fourth hollow portion 23d each are not more than the width along the Z-direction of the second electrically conductive portion 22.

The first resin layer 220 and the second resin layer 240 contact each other between the regions where the heater electrode 239 is separated from each other. For example, in FIG. 6, the width L2 along the Z-direction of the first hollow portion 23a becomes narrow away from the side end portion 21a in the in-plane direction Dp. Also, the first resin layer 220 contacts the second resin layer 240 between the first electrically conductive portion 21 and the second electrically conductive portion 22. For example, a length L3 along the in-plane direction Dp of the first hollow portion 23a is not less than about 1 times and not more than about 15 times the width L1 along the Z-direction of the first electrically conductive portion 21. The width L1 along the Z-direction of the first electrically conductive portion 21 is, for example, 30 μm (not less than 10 μm and not more than 50 μm).

In the example, the first hollow portion 23a has a configuration that is mashed from the upper side and the lower side away from the side end portion 21a. In other words, the boundary between the first hollow portion 23a and the first resin layer 220 approaches a virtual plane P1 (an imaginary line) shown in FIG. 6 away from the side end portion 21a in the in-plane direction Dp. Also, the boundary between the first hollow portion 23a and the second resin layer 240 approaches the virtual plane P1 away from the side end portion 21a in the in-plane direction Dp. The virtual plane P1 is a plane that is parallel to the in-plane direction Dp and passes through the center vicinity in the Z-direction of the first electrically conductive portion 21. Similarly, the second to fourth hollow portions 23b to 23d also have configurations that are mashed from the upper side and the lower side.

Thermal expansion of the heater electrode 239 occurs when a current flows in the heater electrode 239 and the heater plate 200 generates heat. For example, the thermal expansion coefficient of the first resin layer 220 and the thermal expansion coefficient of the heater electrode 239 may be different. Also, for example, the temperature of the first resin layer 220 and the temperature of the heater electrode 239 may be different. Therefore, stress is applied to the first resin layer 220 when the heater electrode 239 deforms due to the thermal expansion. Peeling between the first resin layer 220 and the heater electrode 239 may occur due to the stress. The thermal conduction from the heater electrode 239 to the processing object W is obstructed in the region where the peeling occurs. Therefore, the temperature of the processing object W may decrease locally.

Similarly, the second resin layer 240 and the heater electrode 239 may peel. The thermal conduction from the heater electrode 239 to the cooling medium is obstructed in the region where the peeling occurs. Therefore, the temperature of the processing object W may increase locally. In the case where the local change of the temperature of the processing object W occurs, the precision of the patterning such as the etching, etc., becomes low. As a result, the yield of the semiconductor chip, etc., may decrease.

Conversely, in the electrostatic chuck according to the embodiment, the gaps (the first to fourth hollow portions 23a to 23d, etc.) are provided at each side end portion of the heater electrode 239 provided to be separated in the multiple regions. Thereby, for example, the heater electrode 239 can expand toward the gaps. Even when the heater electrode 239 deforms due to the thermal expansion, the stress that is applied to the first resin layer 220 and the second resin layer 240 can be reduced because the gaps are filled. Thereby, the peeling between the heater electrode 239 and the first resin layer 220 and the peeling between the heater electrode 239 and the second resin layer 240 can be suppressed. Accordingly, the local obstruction of the thermal conduction can be suppressed; and the local temperature change of the processing object W can be suppressed. In other words, the temperature uniformity and the temperature controllability can be improved; and the temperature of the processing object can be controlled stably. The yield and the patterning precision of the etching, etc., can be increased.

The inventor of the application performed an evaluation of the reduction of the stress described above by using a simulation.

FIG. 8A to FIG. 8D, FIG. 9A, and FIG. 9B are cross-sectional views illustrating heater plates.

Figure 8A:
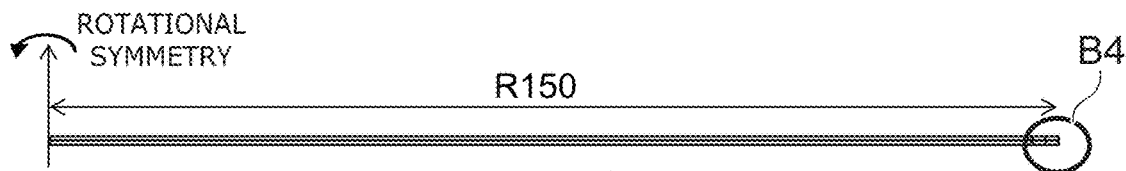
FIG. 8A to FIG. 8D are cross-sectional views illustrating heater plates.
Figure 8B:
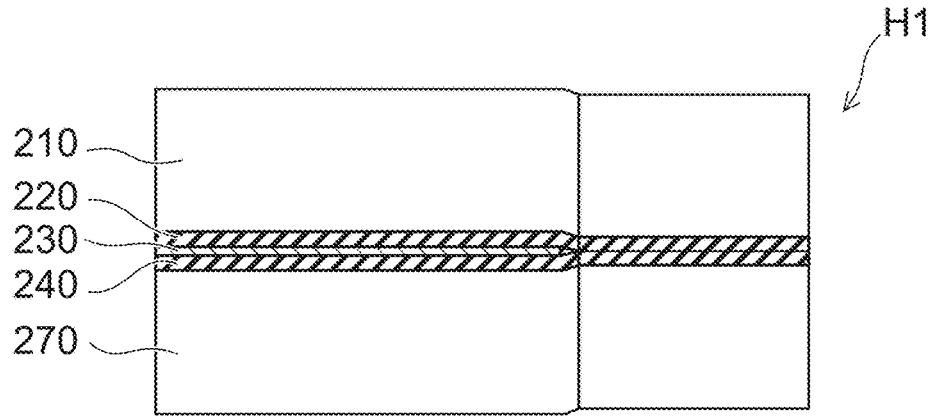
Figure 8C:
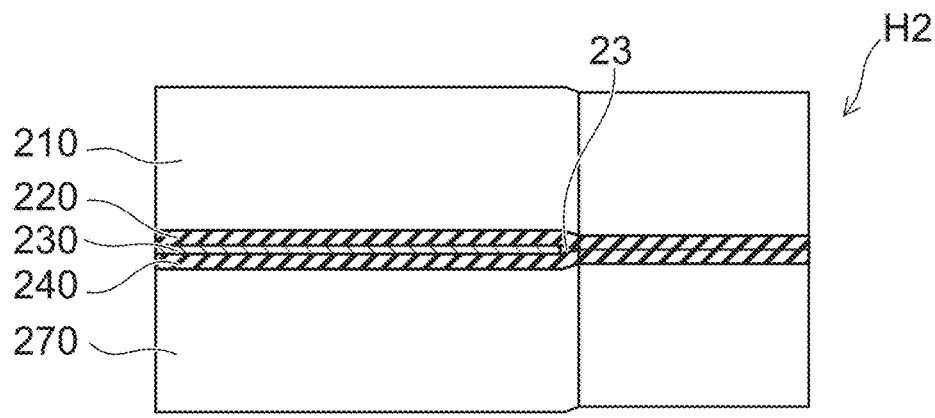

FIG. 8A to FIG. 8D illustrate the conditions of the simulation. FIG. 8A shows the structure of the heater plates used in the simulation. FIG. 8B and FIG. 8C are enlarged cross-sectional views of region B4 illustrated in FIG. 8A.

FIG. 8B shows the structure of a heater plate H1 according to a comparative example; and FIG. 8C shows the structure of a heater plate H2 according to an example.

The heater plate H2 according to the example has a hollow portion 23 similarly to the heater plate 200 described above. The hollow portion 23 is defined by the side end portion of the heater element 230 (the heater electrode 239), the first resin layer 220, and the second resin layer 240. The hollow portion 23 is not provided in the heater plate H1 according to the comparative example. Otherwise, the heater plate H1 is similar to the heater plate H2.

Figure 8D:
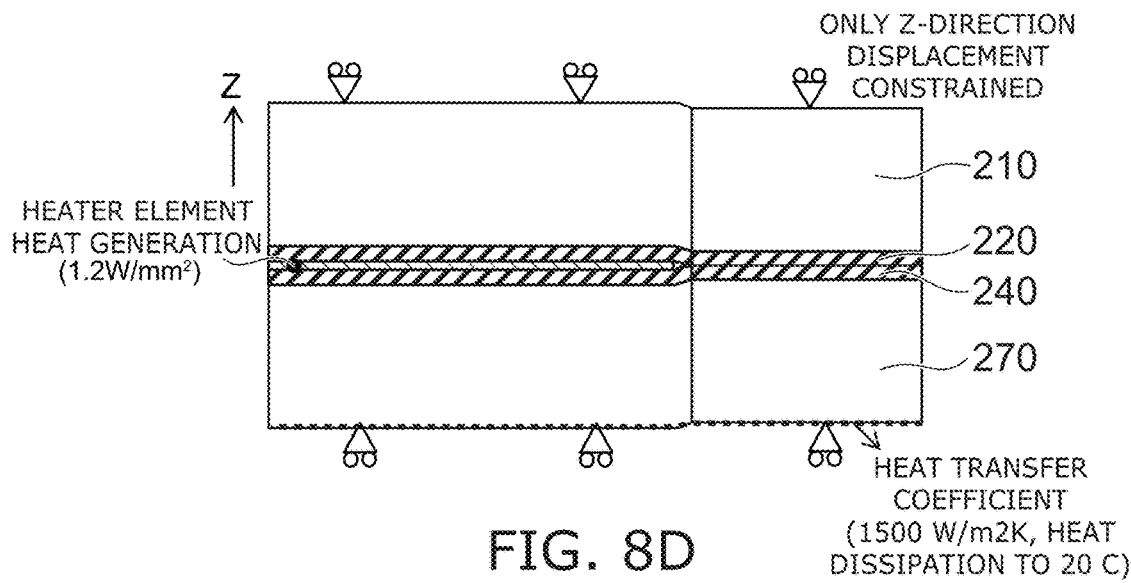

The stress that is generated in the heater plate when the heater element 230 generates heat in the state in which the displacement in the Z-direction is constrained as illustrated in FIG. 8D was calculated.

Figure 9A:
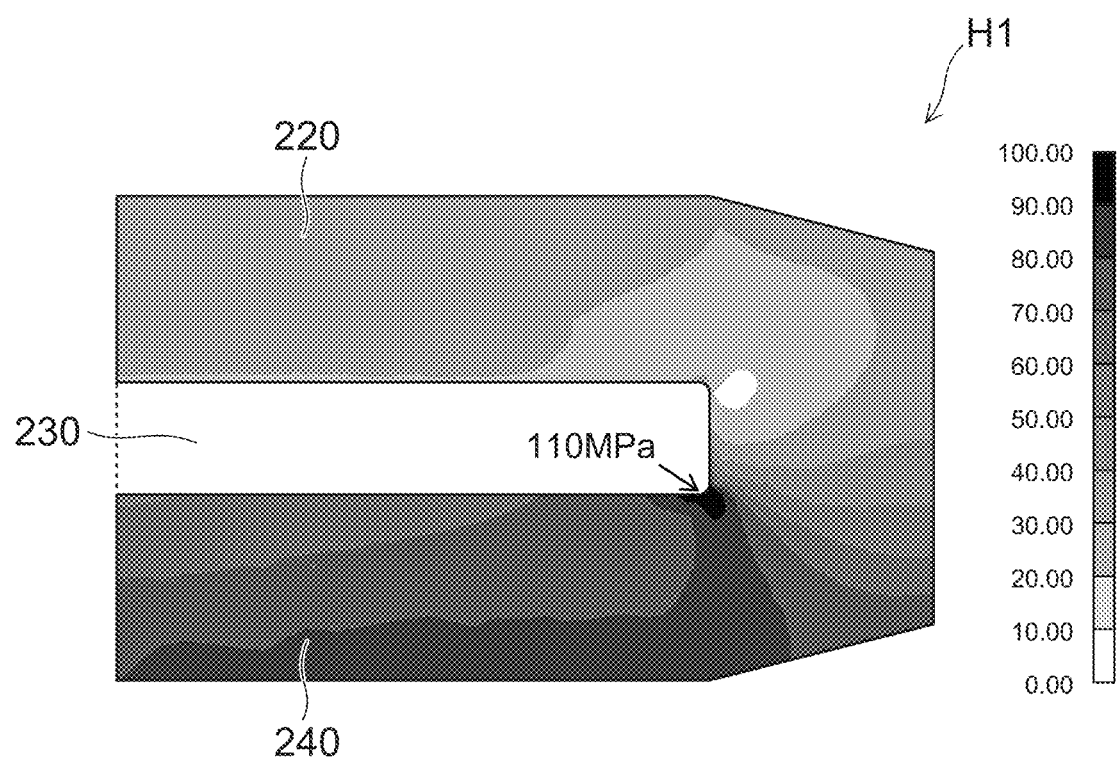
FIG. 9A and FIG. 9B are cross-sectional views illustrating heater plates.
Figure 9B:
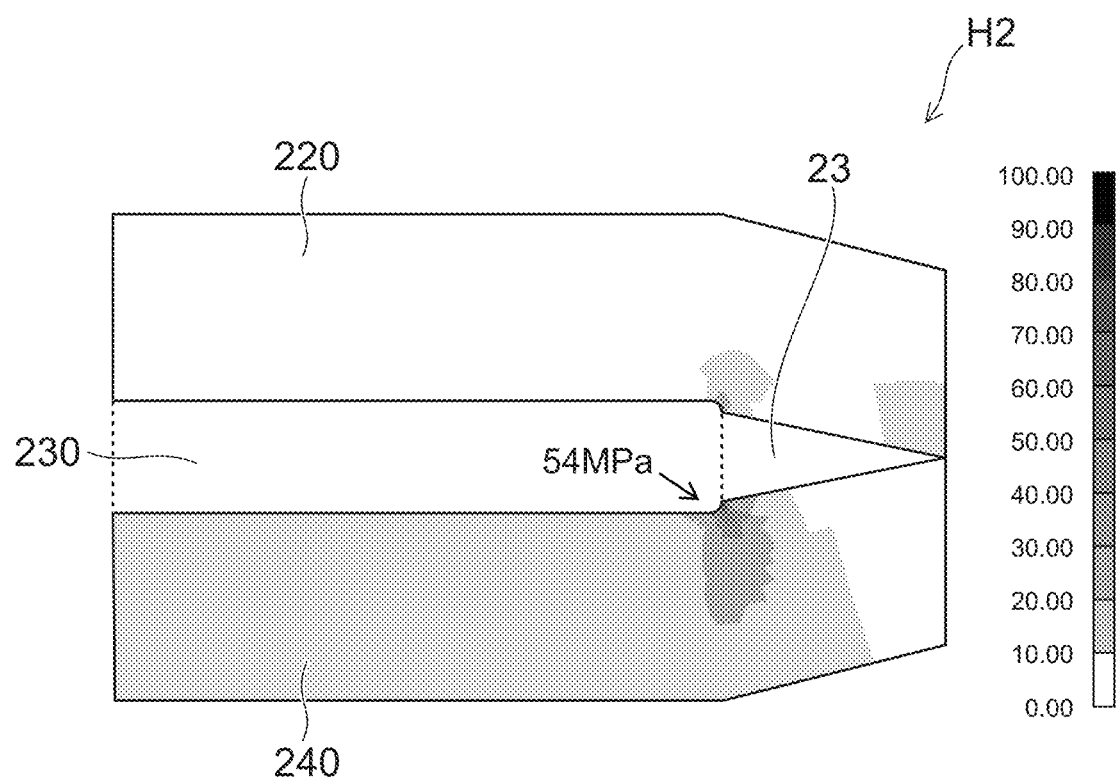

FIG. 9A and FIG. 9B illustrate the results of the simulation. FIG. 9A shows the magnitude of the stress generated in the first resin layer 220 and the second resin layer 240 for the heater plate H1 according to the comparative example. FIG. 9B shows the magnitude of the stress generated in the first resin layer 220 and the second resin layer 240 for the heater plate H2 according to the example.

As illustrated in FIG. 9A and FIG. 9B, the stress is large at the side end portion vicinity of the heater element 230. Also, the stress that is generated in the heater plate H2 according to the example is smaller than the stress generated in the heater plate H1 according to the comparative example. For example, the maximum value of the stress in the heater plate H1 is about 110 megapascals. On the other hand, the maximum value of the stress in the heater plate H2 is about 54 megapascals.

As described above, the stress that is generated in the first resin layer 220 and the second resin layer 240 can be relaxed by providing the hollow portion adjacent to the side end portion of the heater element in the electrostatic chuck according to the embodiment. Thereby, the peeling can be suppressed; and the temperature of the processing object can be controlled stably.

As described above, the heater plate 200 of the embodiment is formed by compression-bonding. If the pressure of the compression-bonding is small, the bond between the members becomes insufficient; and the thermal conduction is obstructed. Therefore, the members of the heater plate 200 are compression-bonded by a sufficient pressure. At this time, the space at the side end portion of the heater electrode 239 is mashed from the upper side and the lower side. Therefore, the first to fourth hollow portions 23a to 23d may become small; and the stress that is generated by the thermal expansion may not be reduced sufficiently. By adjusting the compression-bonding conditions and/or the configuration (the materials, etc.) of the stacked body, the first to fourth hollow portions 23a to 23d that have moderate sizes can be formed. Also, in the case where the first to fourth hollow portions 23a to 23d are too large, the contact between the first resin layer 220 and the second resin layer 240 may become insufficient; and the thermal conduction may be obstructed.

Figure 10A:
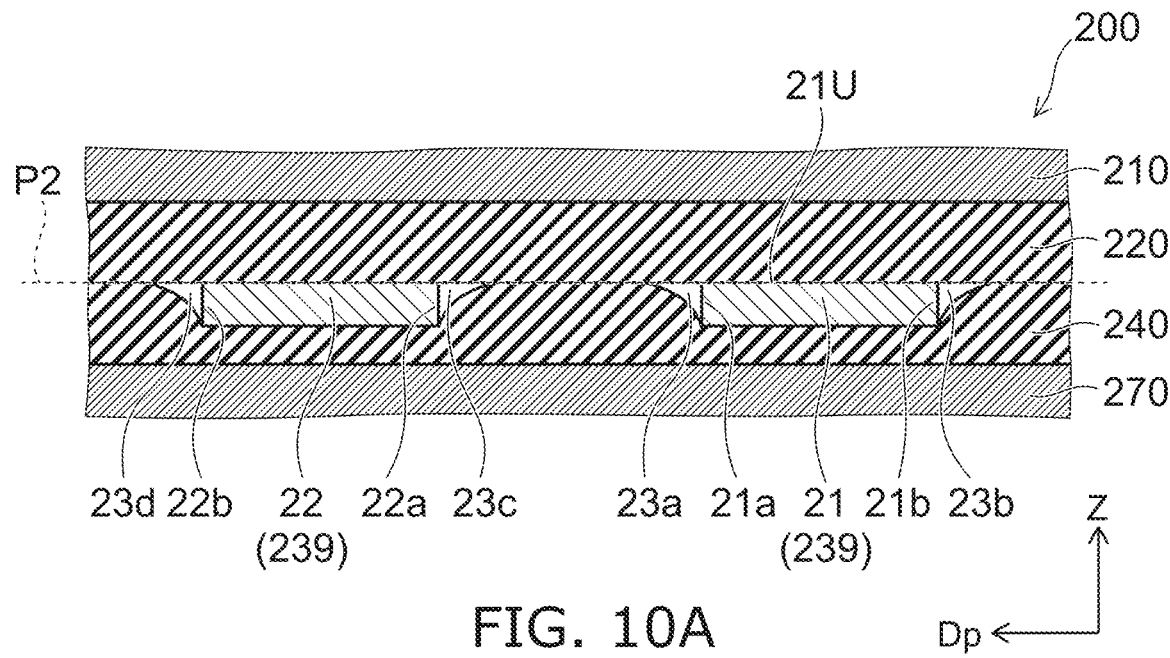
FIG. 10A and FIG. 10B are cross-sectional views illustrating portions of modifications of the heater plate of the embodiment.
Figure 10B:
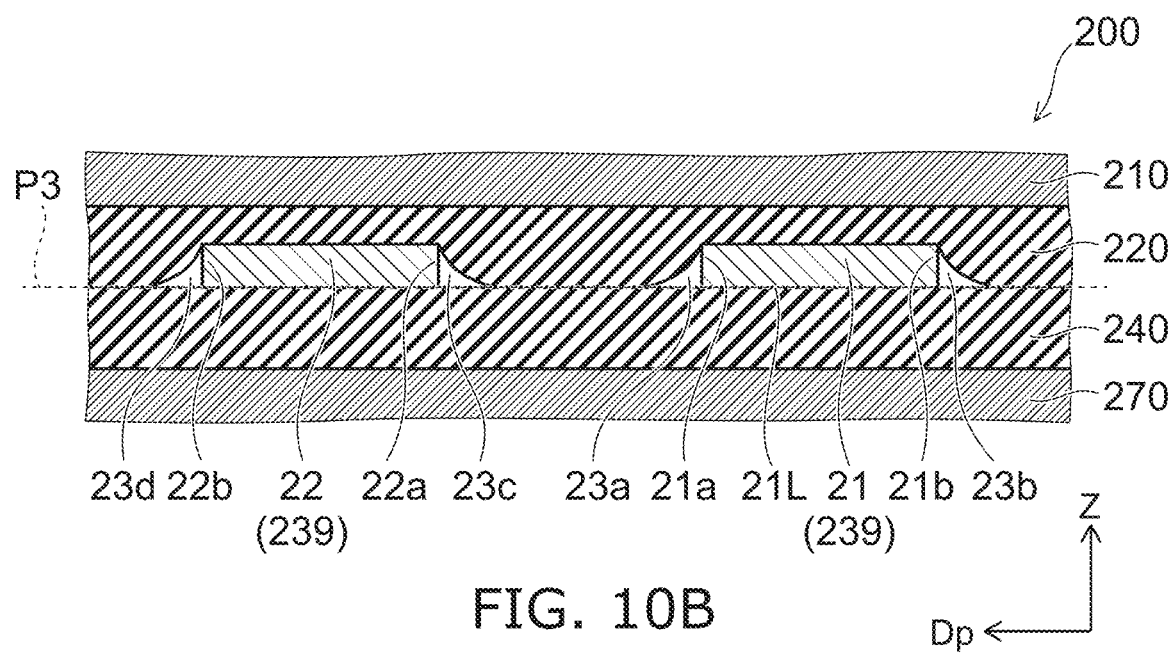

FIG. 10A and FIG. 10B are cross-sectional views illustrating portions of modifications of the heater plate of the embodiment.

In the example illustrated in FIG. 10A, the first hollow portion 23a has a configuration that is mashed from the lower side away from the side end portion 21a. In other words, the boundary between the first hollow portion 23a and the second resin layer 240 approaches a virtual plane P2 (an imaginary line) shown in FIG. 10A away from the side end portion 21a in the in-plane direction Dp. Also, the boundary between the first hollow portion 23a and the first resin layer 220 extends along the virtual plane P2. The virtual plane P2 is a plane that extends in the in-plane direction Dp and passes through an upper surface 21U of the first electrically conductive portion 21. The upper surface 21U is a surface that opposes the first resin layer 220; and the first electrically conductive portion 21 contacts the first resin layer 220 at the upper surface 21U. Similarly, the second to fourth hollow portions 23b to 23d also have configurations that are mashed from the lower side.

In the example illustrated in FIG. 10B, the first hollow portion 23a has a configuration that is mashed from the upper side away from the side end portion 21a. In other words, the boundary between the first hollow portion 23a and the first resin layer 220 approaches a virtual plane P3 (an imaginary line) shown in FIG. 10B away from the side end portion 21a in the in-plane direction Dp. Also, the boundary between the first hollow portion 23a and the second resin layer 240 extends along the virtual plane P3. The virtual plane P3 is a plane that extends in the in-plane direction Dp and passes through a lower surface 21L of the first electrically conductive portion 21. The lower surface 21L is a surface that opposes the second resin layer 240; and the first electrically conductive portion 21 contacts the second resin layer 240 at the lower surface 21L. Similarly, the second to fourth hollow portions 23b to 23d also have configurations that are mashed from the lower side.

Because the first to fourth hollow portions 23a to 23d have configurations that are mashed from one of the upper side or the lower side, the sizes of the first to fourth hollow portions 23a to 23d when compression-bonding are ensured easily compared to a configuration that is mashed from two sides. The configurations of the first to fourth hollow portions 23a to 23d can be adjusted by adjusting the compression-bonding conditions and/or the configuration (the materials, etc.) of the stacked body.

In the examples illustrated in FIG. 6, FIG. 10A, and FIG. 10B, the width along the in-plane direction Dp of the upper surface 21U is substantially the same as the width along the in-plane direction Dp of the lower surface 21L.

Figure 11A:
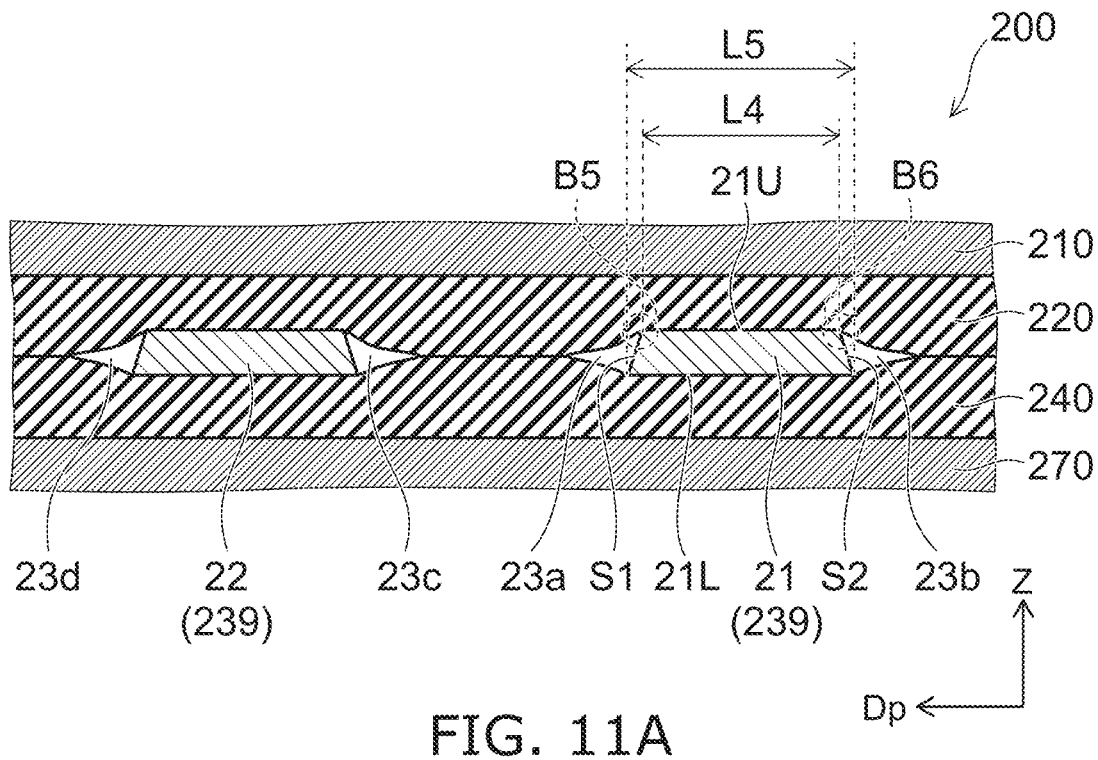
FIG. 11A and FIG. 11B are cross-sectional views illustrating portions of modifications of the heater plate of the embodiment.
Figure 11B:
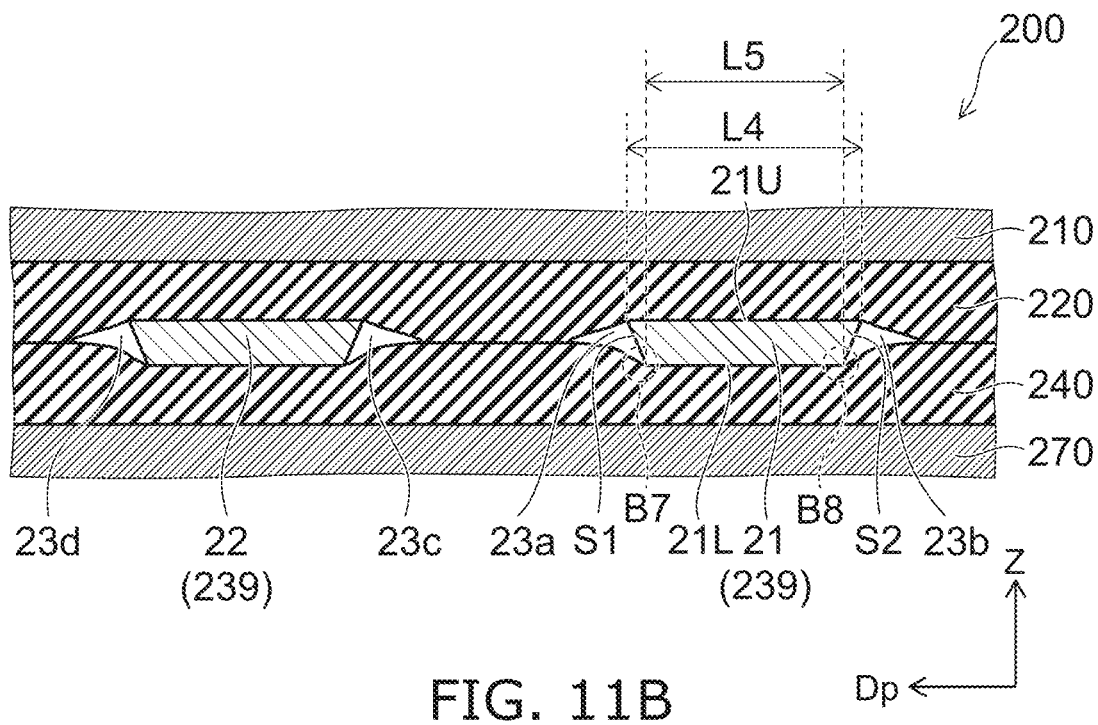

FIG. 11A and FIG. 11B are cross-sectional views illustrating portions of modifications of the heater plate of the embodiment.

In the examples illustrated in FIG. 11A and FIG. 11B, the width of the upper surface of the heater electrode 239 is different from the width of the lower surface of the heater electrode 239. Specifically, for example, a width L4 along the in-plane direction Dp of the upper surface 21U of the first electrically conductive portion 21 is different from a width L5 along the in-plane direction Dp of the lower surface 21L of the first electrically conductive portion 21. In other words, the width along the in-plane direction Dp of one surface of the upper surface 21U or the lower surface 21L is shorter than the width along the in-plane direction Dp of the other surface of the upper surface 21U or the lower surface 21L.

FIG. 11A shows an example in which the width of the upper surface of the heater electrode 239 is narrower than the width of the lower surface of the heater electrode 239. For example, the width L4 is narrower than the width L5. FIG. 11B shows an example in which the width of the lower surface of the heater electrode 239 is narrower than the width of the upper surface of the heater electrode 239. For example, the width L5 is narrower than the width L4.

The heater electrode 239 has a side surface that links the upper surface and the lower surface. The side surface is a surface that contacts the hollow portion (the gap) adjacent to the heater electrode 239. The side surface is rougher than the surface of the upper surface or the lower surface of the heater electrode 239 that has the wider width along the in-plane direction.

For example, the first electrically conductive portion 21 has a side surface 51 and a side surface S2 that link the upper surface 21U and the lower surface 21L. The side surface 51 is the surface that contacts the first hollow portion 23a; and the side surface S2 is the surface that contacts the second hollow portion 23b. The side surface 51 and the side surface S2 each are rougher than the surface of the upper surface 21U or the lower surface 21L that has a wider width along the in-plane direction Dp. For example, in the example illustrated in FIG. 11A, the side surface 51 and the side surface S2 each are rougher than the lower surface 21L. Also, in the example illustrated in FIG. 11B, the side surface 51 and the side surface S2 each are rougher than the upper surface 21U.

The side surface and the surface of the upper surface 21U or the lower surface 21L that has the narrower width are connected by a curved surface. For example, in the example illustrated in FIG. 11A, a connection portion B5 that is between the side surface 51 and the upper surface 21U and a connection portion B6 that is between the side surface S2 and the upper surface 21U have curved-surface configurations. In the example illustrated in FIG. 11B, a connection portion B7 that is between the side surface 51 and the lower surface 21L and a connection portion B8 that is between the side surface S2 and the lower surface 21L have curved-surface configurations. In other words, the corners of the heater electrode 239 are rounded.

For example, by rounding the corners, the concentration of the stress is suppressed. In the example illustrated in FIG. 11A, the stress that is applied to the first resin layer 220 by the thermal expansion of the heater electrode 239 is suppressed. Thereby, the peeling between the heater electrode 239 and the first resin layer 220 can be suppressed further. Accordingly, the stability of the thermal conduction from the heater electrode 239 to the processing object W increases.

On the other hand, in the example illustrated in FIG. 11B, the stress that is applied to the second resin layer 240 by the thermal expansion of the heater electrode 239 is suppressed. Thereby, the peeling between the heater electrode 239 and the second resin layer 240 can be suppressed further. Accordingly, the stability of the thermal conduction from the heater electrode 239 to the cooling medium increases.

Figure 12A:
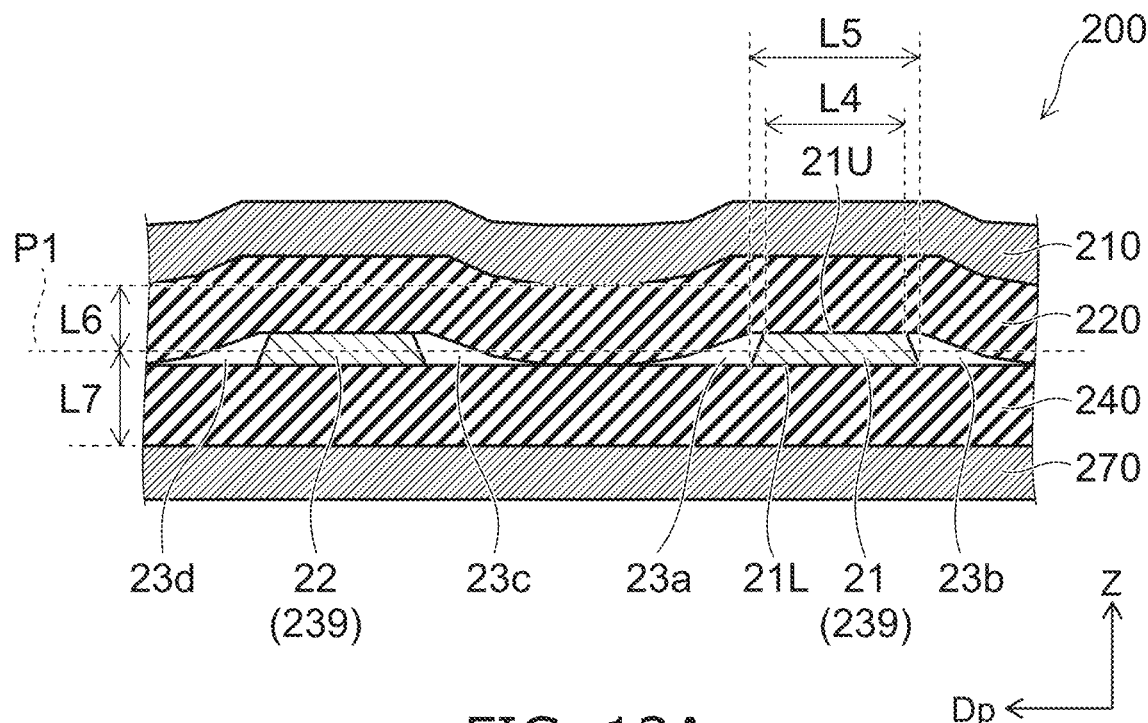
FIG. 12A and FIG. 12B are cross-sectional views illustrating portions of modifications of the heater plate of the embodiment.
Figure 12B:
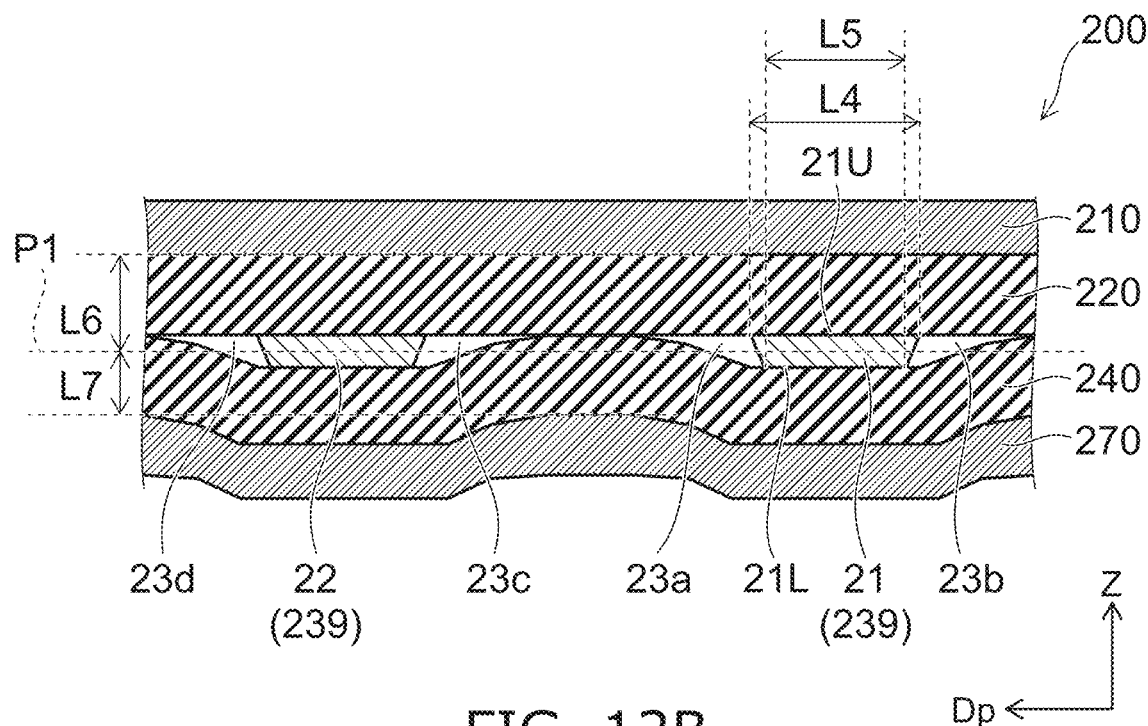

FIG. 12A and FIG. 12B are cross-sectional views illustrating portions of modifications of the heater plate of the embodiment.

In the example illustrated in FIG. 12A and FIG. 12B as well, the width of the upper surface of the heater electrode 239 is different from the width of the lower surface of the heater electrode 239. In the example, the configuration of the resin layer contacting the surface of the upper surface or the lower surface of the heater electrode 239 that has the narrower width has an unevenness following the arrangement of the heater electrode 239. The support plate that contacts the resin layer also has an unevenness. Due to the unevenness, the bonding surface area between the layers becomes wide; and the bonding strength can be increased.

For example, in the example illustrated in FIG. 12A, the width L4 along the in-plane direction Dp of the upper surface 21U is narrower than the width L5 along the in-plane direction Dp of the lower surface 21L. The upper surface 21U is positioned between the virtual plane P1 (the center virtual plane) and the first support plate 210. A distance L6 (the shortest distance) between the first support plate 210 and the virtual plane P1 is shorter than the distance between the second support plate 270 and the virtual plane P1.

In the example illustrated in FIG. 12B, the width L5 along the in-plane direction Dp of the lower surface 21L is narrower than the width L4 along the in-plane direction Dp of the upper surface 21U. The lower surface 21L is positioned between the virtual plane P1 and the second support plate 270. A distance L7 between the second support plate 270 and the virtual plane P1 is shorter than the distance L6 between the first support plate 210 and the virtual plane P1.

In the heater plates according to the modifications described in reference to FIG. 10A to FIG. 12B as well, the hollow portions are provided at the end portions of the heater electrode 239. Thereby, similarly to the description relating to FIG. 6 to FIG. 9B, the peeling between the heater electrode 239 and the first resin layer 220 and the peeling between the heater electrode 239 and the second resin layer 240 can be suppressed. The temperature of the processing object can be controlled stably.

Figure 13:
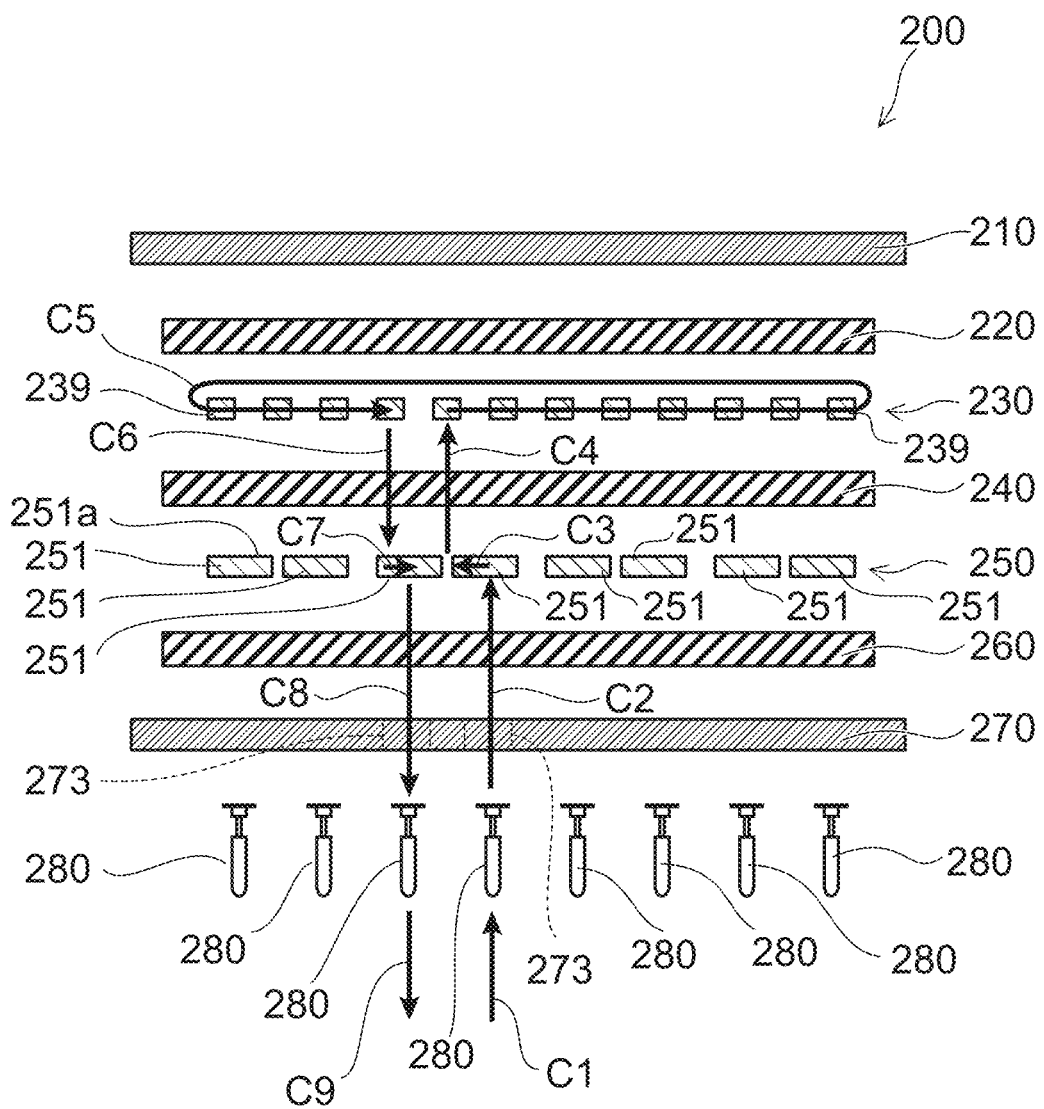
FIG. 13 is a schematic exploded view illustrating a modification of the heater plate of the embodiment.

FIG. 13 is a schematic exploded view illustrating a modification of the heater plate of the embodiment.

As illustrated in FIG. 13, the heater plate 200 may include the bypass layer 250 and a third resin layer 260. The bypass layer 250 is provided between the second resin layer 240 and the second support plate 270. The third resin layer 260 is provided between the bypass layer 250 and the second support plate 270. Otherwise, a description similar to that of the heater plate described above is applicable to the heater plate of the modification illustrated in FIG. 13.

The third resin layer 260 couples the bypass layer 250 and the second support plate 270 to each other. The third resin layer 260 electrically insulates between the bypass layer 250 and the second support plate 270. Thus, the third resin layer 260 has the function of electric insulation and the function of surface coupling. The material and thickness of the third resin layer 260 are respectively about the same as the material and thickness of the first resin layer 220.

In the example, the second resin layer 240 couples the heater element 230 and the bypass layer 250 to each other. The second resin layer 240 electrically insulates between the heater element 230 and the bypass layer 250.

The bypass layer 250 is disposed to be substantially parallel to the first support plate 210 and disposed to be substantially parallel to the second support plate 270. The bypass layer 250 includes multiple bypass portions 251. The bypass layer 250 includes, for example, eight bypass portions 251. The number of the bypass portions 251 is not limited to eight. The bypass layer 250 has a plate configuration. The surface area of the bypass layer 250 is wider than the surface area of the heater element 230 (the surface area of the heater electrode 239) when viewed perpendicularly to the surface of the bypass layer 250 (surfaces 251a of the bypass portions 251). The details are described below.

The bypass layer 250 is electrically conductive. The bypass layer 250 is electrically insulated from the first support plate 210 and the second support plate 270. For example, a metal that includes stainless steel or the like is an example of the material of the bypass layer 250. The thickness (the length in the Z-direction) of the bypass layer 250 is, for example, not less than about 0.03 mm and not more than about 0.30 mm. The thickness of the bypass layer 250 is thicker than the thickness of the first resin layer 220. The thickness of the bypass layer 250 is thicker than the thickness of the second resin layer 240. The thickness of the bypass layer 250 is thicker than the thickness of the third resin layer 260.

For example, the material of the bypass layer 250 is the same as the material of the heater element 230. On the other hand, the thickness of the bypass layer 250 is thicker than the thickness of the heater element 230. Therefore, the electrical resistance of the bypass layer 250 is lower than the electrical resistance of the heater element 230. Thereby, even in the case where the material of the bypass layer 250 is the same as the material of the heater element 230, the heat generation of the bypass layer 250 becoming such as that of the heater element 230 can be suppressed. That is, the electrical resistance of the bypass layer 250 can be suppressed; and the heat generation amount of the bypass layer 250 can be suppressed. The method for suppressing the electrical resistance of the bypass layer 250 and suppressing the heat generation amount of the bypass layer 250 may be realized not by using the thickness of the bypass layer 250 but by using a material having a relatively low volume resistivity. In other words, the material of the bypass layer 250 may be different from the material of the heater element 230. For example, a metal that includes at least one of stainless steel, titanium, chrome, nickel, copper, or aluminum or the like is an example of the material of the bypass layer 250.

The power supply terminal 280 is electrically coupled to the heater element 230 via the bypass layer 250. One power supply terminal 280 is electrically coupled to one bypass layer 250. As illustrated by arrow C1 and arrow C2 illustrated in FIG. 13, when the electrical power is supplied to the power supply terminal 280 from outside the electrostatic chuck 10, the current flows from the power supply terminal 280 toward the bypass layer 250. As illustrated by arrow C3 and arrow C4 illustrated in FIG. 13, the current that flows toward the bypass layer 250 flows from the bypass layer 250 toward the heater element 230. As illustrated by arrow C5 and arrow C6 illustrated in FIG. 13, the current that flows toward the heater element 230 flows through the prescribed zone (the region) of the heater element 230 and flows from the heater element 230 toward the bypass layer 250. As illustrated by arrow C7 and arrow C8 illustrated in FIG. 13, the current that flows toward the bypass layer 250 flows from the bypass layer 250 toward the power supply terminal 280. As illustrated by arrow C9 illustrated in FIG. 13, the current that flows toward the power supply terminal 280 flows outside the electrostatic chuck 10.

As described above, the bypass layer 250 is provided between the heater element 230 and the second support plate 270. That is, the bypass layer 250 is provided between the heater element 230 and the base plate 300. The thermal conductivity of stainless steel is lower than the thermal conductivity of aluminum and the thermal conductivity of copper. Therefore, the bypass layer 250 suppresses the transfer into the second support plate 270 of the heat supplied from the heater element 230. That is, the bypass layer 250 has a thermal insulation effect for the second support plate 270 side when viewed from the bypass layer 250; and the uniformity of the temperature distribution in the surface of the processing object W can be increased.

The bypass layer 250 can increase the degrees of freedom of the arrangement of the power supply terminals 280. By providing the bypass layer 250, the power supply terminals that have large thermal capacities may not be directly coupled to the heater element 230 compared to the case where the bypass layer 250 is not provided. Thereby, the uniformity of the temperature distribution in the surface of the processing object W can be increased. Also, the power supply terminals 280 may not be coupled to the thin heater element 230 compared to the case where the bypass layer 250 is not provided. Thereby, the reliability of the heater plate 200 can be increased.

A method for manufacturing the heater plate illustrated in FIG. 13 will now be described.

Figure 14A:
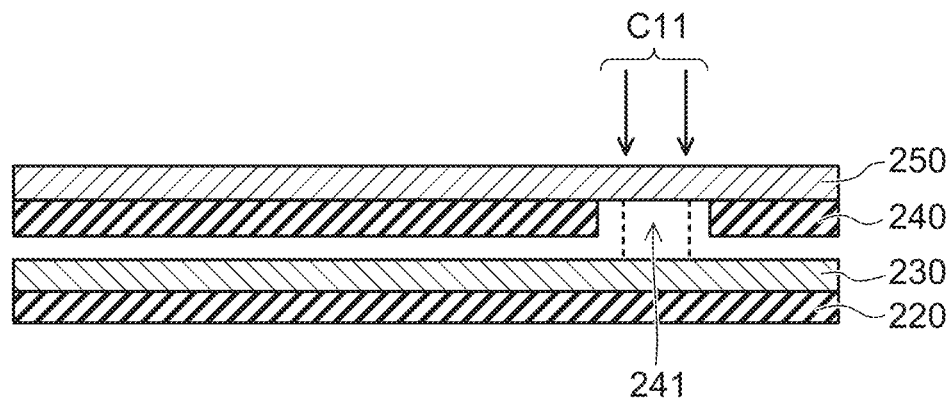
FIG. 14A and FIG. 14B are schematic cross-sectional views illustrating an example of the manufacturing method of the embodiment.
Figure 14B:
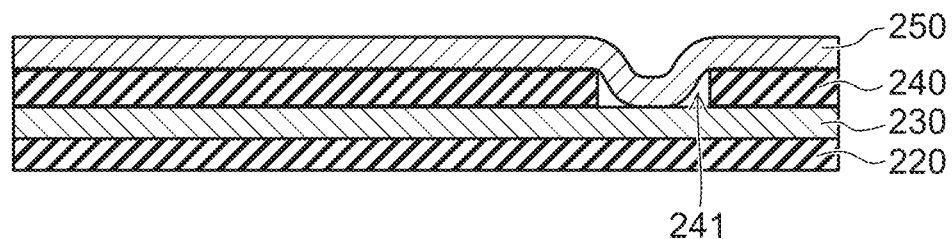

FIG. 14A and FIG. 14B are schematic cross-sectional views illustrating an example of the manufacturing method of the embodiment.

Figure 15:
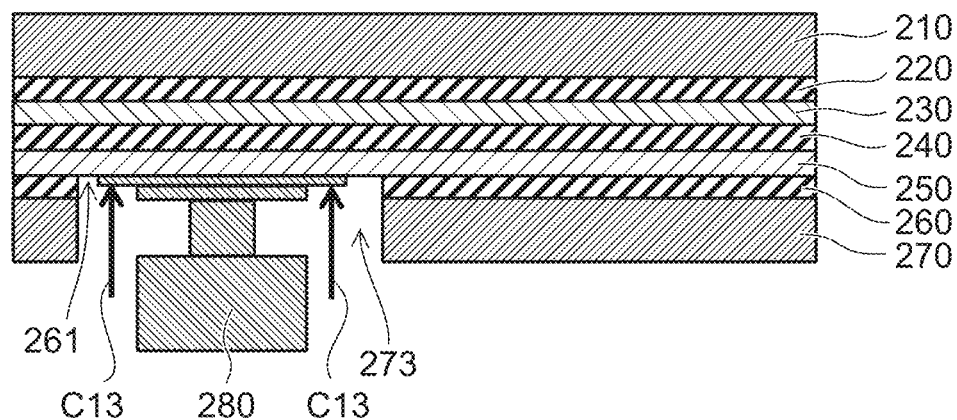
FIG. 15 is a schematic cross-sectional view illustrating another example of the manufacturing method of the embodiment.

FIG. 15 is a schematic cross-sectional view illustrating another example of the manufacturing method of the embodiment.

FIG. 14A is a schematic cross-sectional view illustrating the state before coupling the bypass layer and the heater element. FIG. 14B is a schematic cross-sectional view illustrating the state after coupling the bypass layer and the heater element. FIG. 15 is a schematic cross-sectional view illustrating an example of the coupling process between the bypass layer and the power supply terminal.

First, the members of the heater plate 200 are prepared similarly to the manufacturing method described in reference to FIG. 5. Continuing as illustrated in FIG. 14A and FIG. 14B, coupling between the heater element 230 and the bypass layer 250 is performed. The coupling between the heater element 230 and the bypass layer 250 is performed by soldering, brazing, welding, contacting, etc. As illustrated in FIG. 14A, a hole 241 is provided in the second resin layer 240. The hole 241 pierces the second resin layer 240. For example, as illustrated by arrows C11 illustrated in FIG. 14A, the heater element 230 and the bypass layer 250 are coupled by performing spot welding from the bypass layer 250 side.

The coupling between the heater element 230 and the bypass layer 250 is not limited to welding. For example, the coupling between the heater element 230 and the bypass layer 250 may be performed by coupling utilizing laser light, soldering, brazing, contacting, etc. Subsequently, the stacked body in which the members of the heater plate 200 are stacked is compression-bonded.

Continuing as illustrated in FIG. 15, the coupling between the power supply terminal 280 and the bypass layer 250 is performed. The coupling between the power supply terminal 280 and the bypass layer 250 is performed by welding, laser, soldering, brazing, etc. As illustrated in FIG. 15, the hole 273 is provided in the second support plate 270. The hole 273 pierces the second support plate 270. This is as described above in reference to FIG. 4B. A hole 261 is provided in the third resin layer 260. The hole 261 pierces the third resin layer 260. As illustrated by arrows C13 illustrated in FIG. 15, the power supply terminal 280 and the bypass layer 250 are coupled by performing welding, laser, soldering, brazing, etc., from the second support plate 270 toward the first support plate 210.

Thus, the heater plate 200 of the embodiment is manufactured.

The case where the heater plate includes the bypass layer 250 and the third resin layer 260 is used as an example in the following description. However, similarly to the heater plate described in reference to FIG. 5 to FIG. 12, the bypass layer 250 and the third resin layer 260 may be omitted in the embodiment. Other than the bypass layer 250 and the third resin layer 260, the configuration is similar; and a detailed description is therefore omitted.

Figure 16:
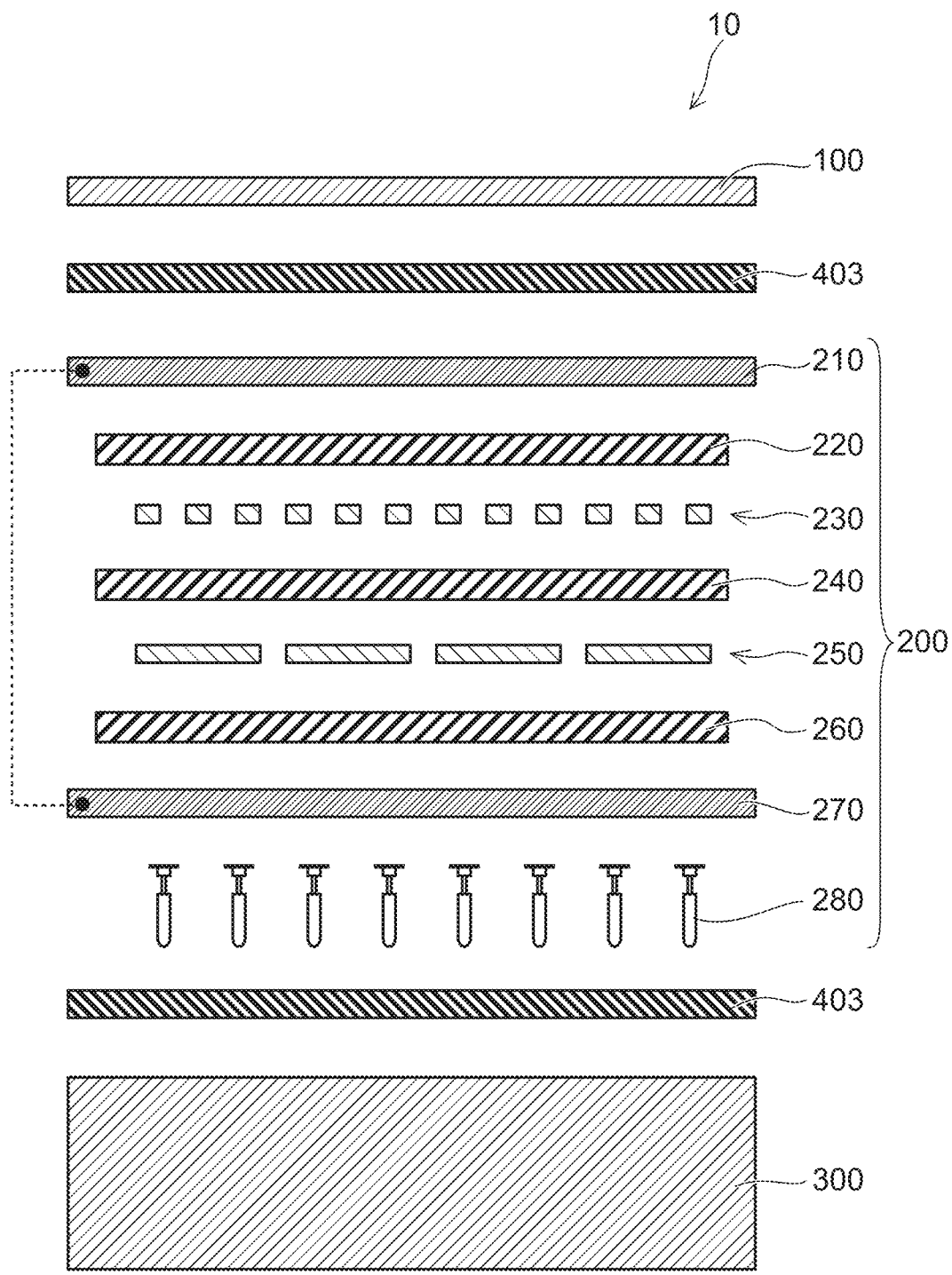
FIG. 16 is a schematic exploded view illustrating the electrostatic chuck according to the embodiment.

FIG. 16 is a schematic exploded view illustrating the electrostatic chuck according to the embodiment.

Figure 17A:
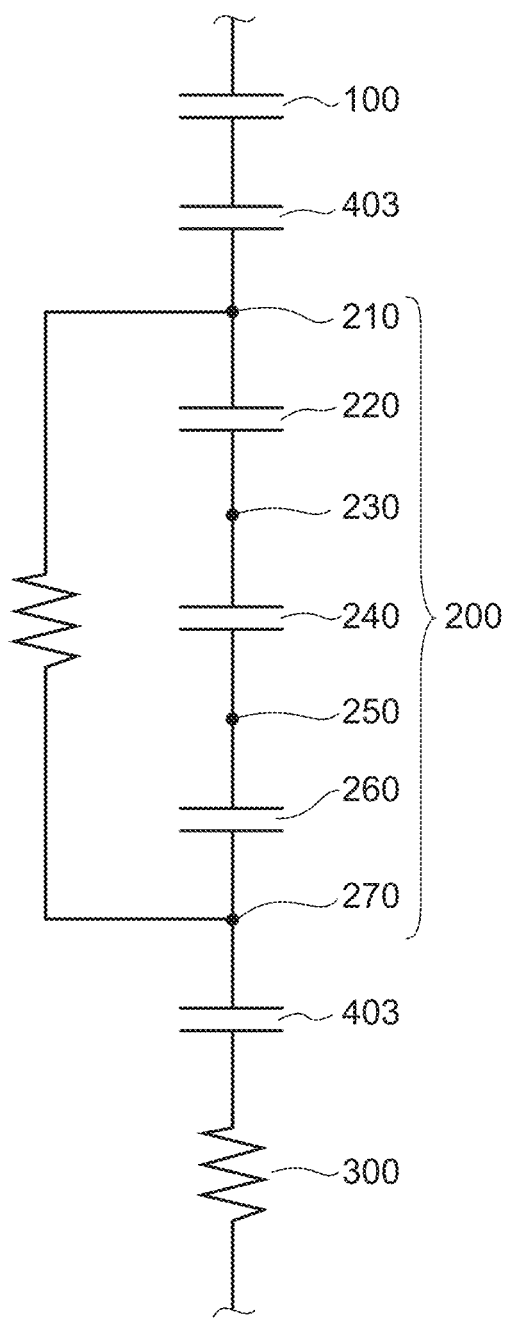
FIG. 17A and FIG. 17B are electrical circuit diagrams illustrating the electrostatic chuck.
Figure 17B:
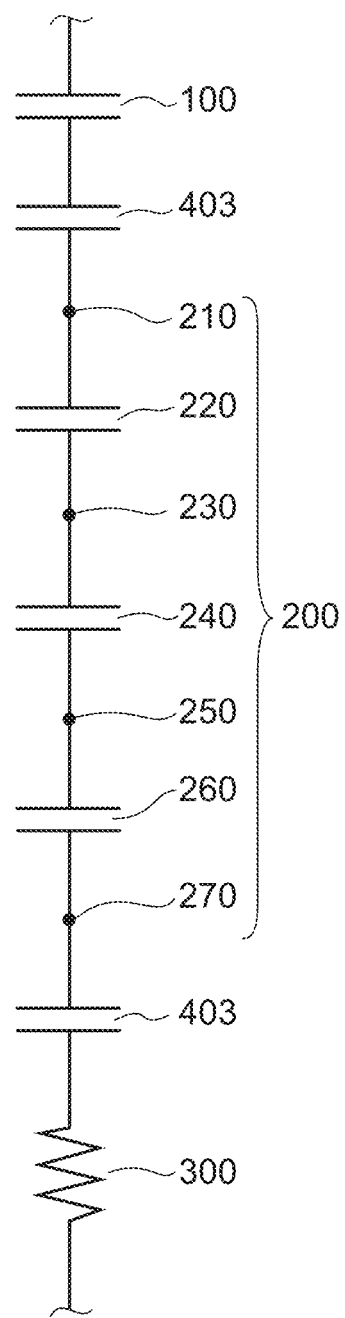

FIG. 17A and FIG. 17B are electrical circuit diagrams illustrating the electrostatic chuck.

FIG. 17A is an electrical circuit diagram illustrating an example in which the first support plate and the second support plate are electrically coupled. FIG. 17B is an electrical circuit diagram illustrating an example in which the first support plate and the second support plate are not coupled electrically.

As illustrated in FIG. 16 and FIG. 17A, the first support plate 210 is electrically coupled to the second support plate 270. For example, the coupling between the first support plate 210 and the second support plate 270 is performed by welding, coupling utilizing laser light, soldering, contacting, etc.

For example, in the case where the first support plate 210 is not electrically coupled reliably to the second support plate 270, as illustrated in FIG. 17B, the first support plate 210 may be electrically coupled to the second support plate 270 and then not be electrically coupled to the second support plate 270. Then, fluctuation may occur in the etching rate when the plasma is generated. Also, even if the first support plate 210 is not electrically coupled to the second support plate 270, a current may flow in the heater element 230 when the plasma is generated; and the heater element 230 may generate heat. In other words, if the first support plate 210 is not electrically coupled reliably to the second support plate 270, the heater element 230 may generate heat due to a current other than the heater current.

Conversely, in the electrostatic chuck 10 according to the embodiment as illustrated in FIG. 17A, the first support plate 210 is electrically coupled to the second support plate 270. Thereby, the fluctuation that occurs in the etching rate when the plasma is generated due to the current flowing from the first support plate 210 toward the second support plate 270 or due to the current flowing from the second support plate 270 toward the first support plate 210 can be suppressed. Also, the heat generation of the heater element 230 due to a current other than the heater current can be suppressed.

Further, the heater element 230 and the bypass layer 250 can be shielded from the high frequency waves. Thereby, the heat generation of the heater element 230 to an abnormal temperature can be suppressed. Also, the impedance of the heater plate 200 can be suppressed.

Specific examples of the heater plate 200 of the embodiment will now be described with reference to the drawings.

Figure 18A:
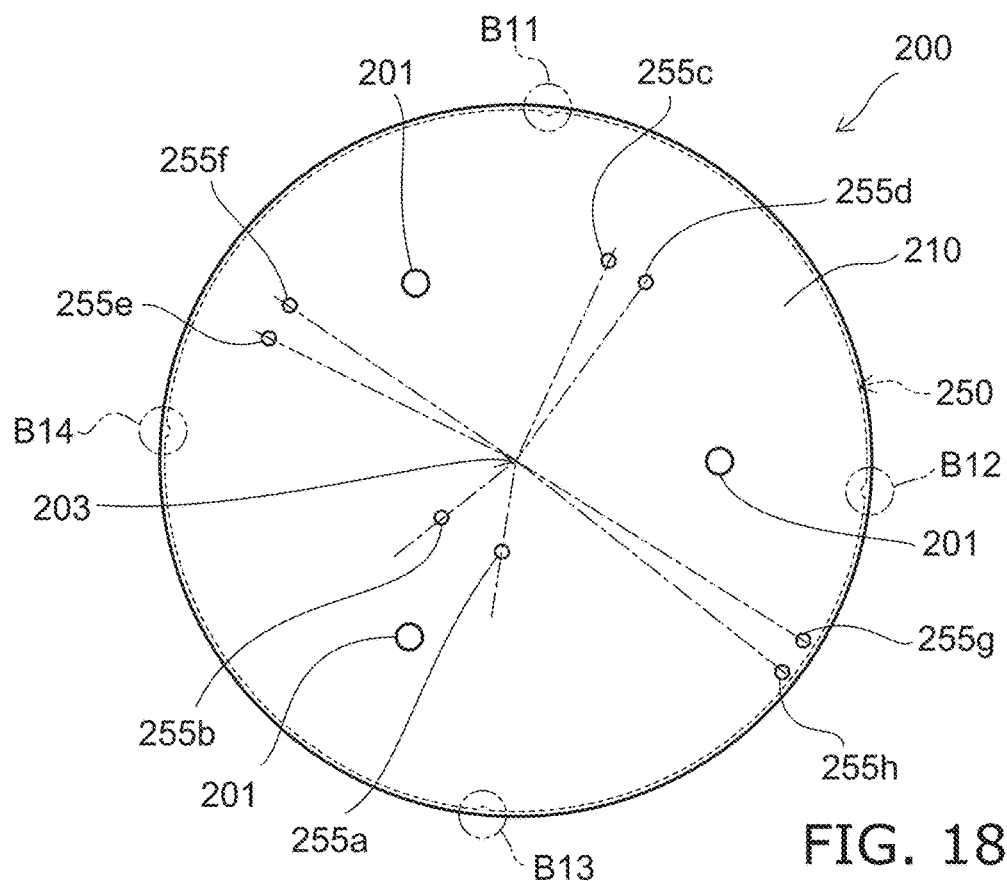
FIG. 18A and FIG. 18B are schematic plan views illustrating a specific example of the heater plate of the embodiment.
Figure 18B:
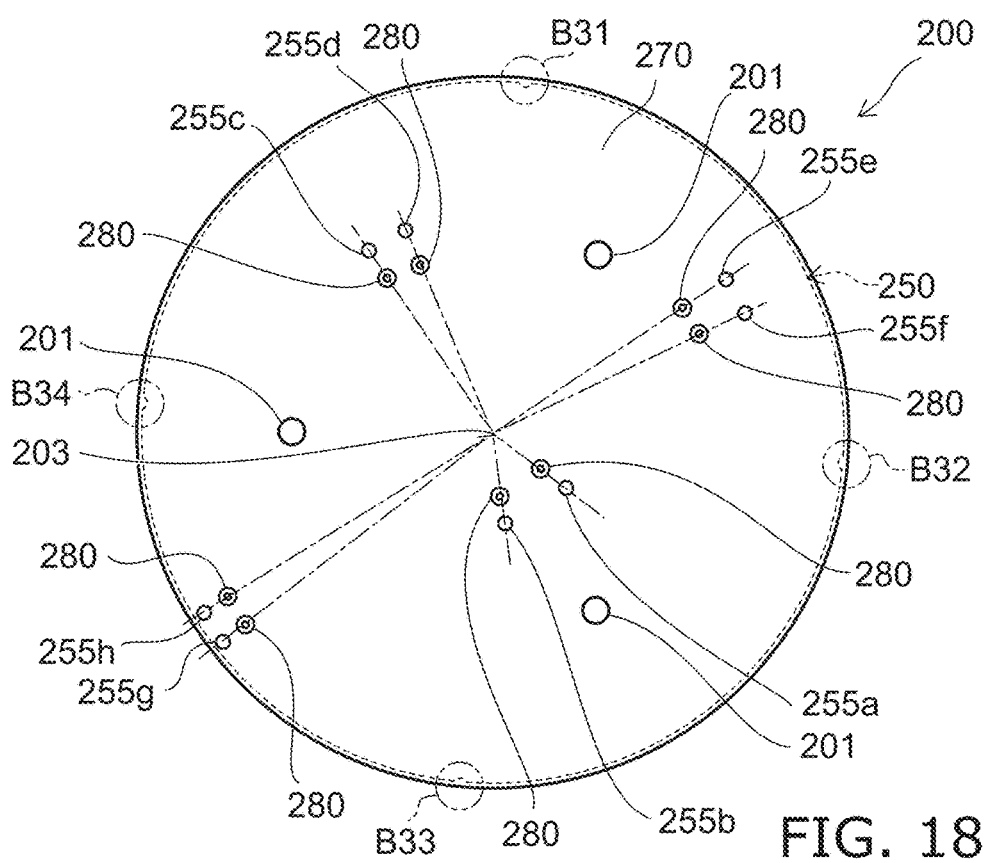

FIG. 18A and FIG. 18B are schematic plan views illustrating a specific example of the heater plate of the embodiment.

Figure 19A:
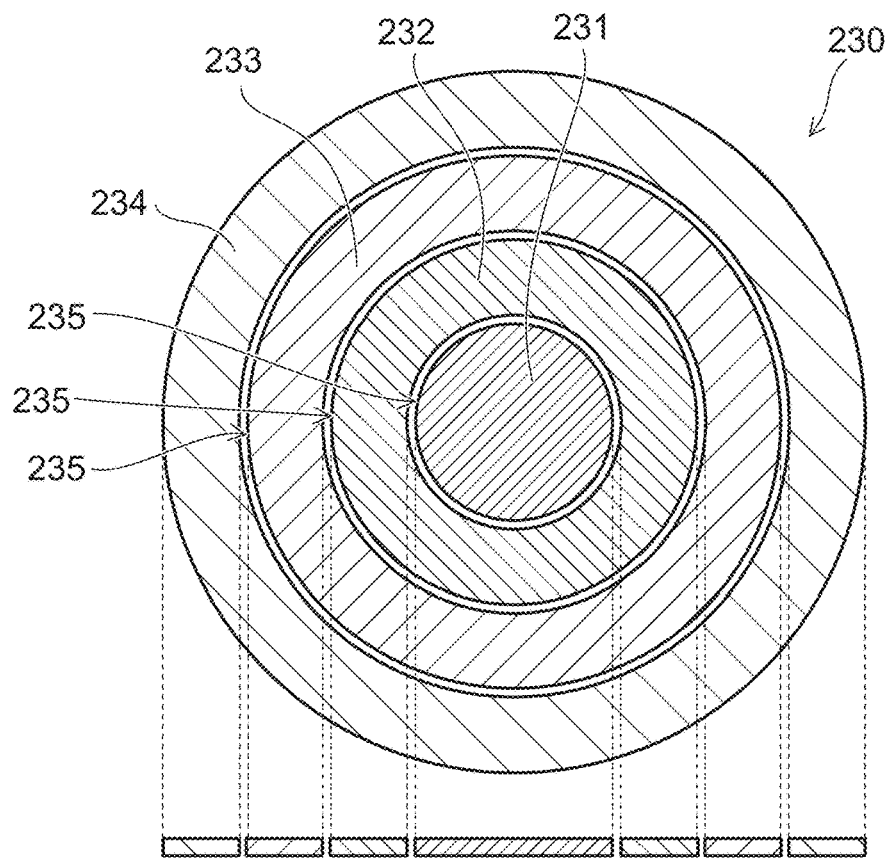
FIG. 19A and FIG. 19B are schematic plan views illustrating heater elements of this specific example.
Figure 19B:
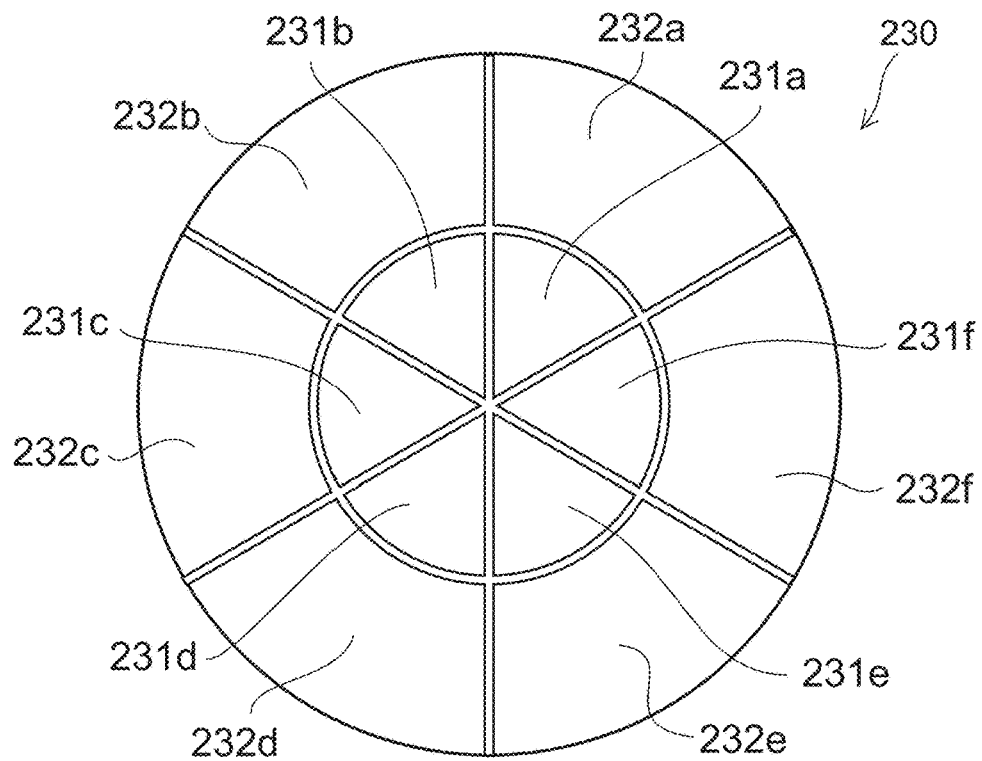
Figure 20:
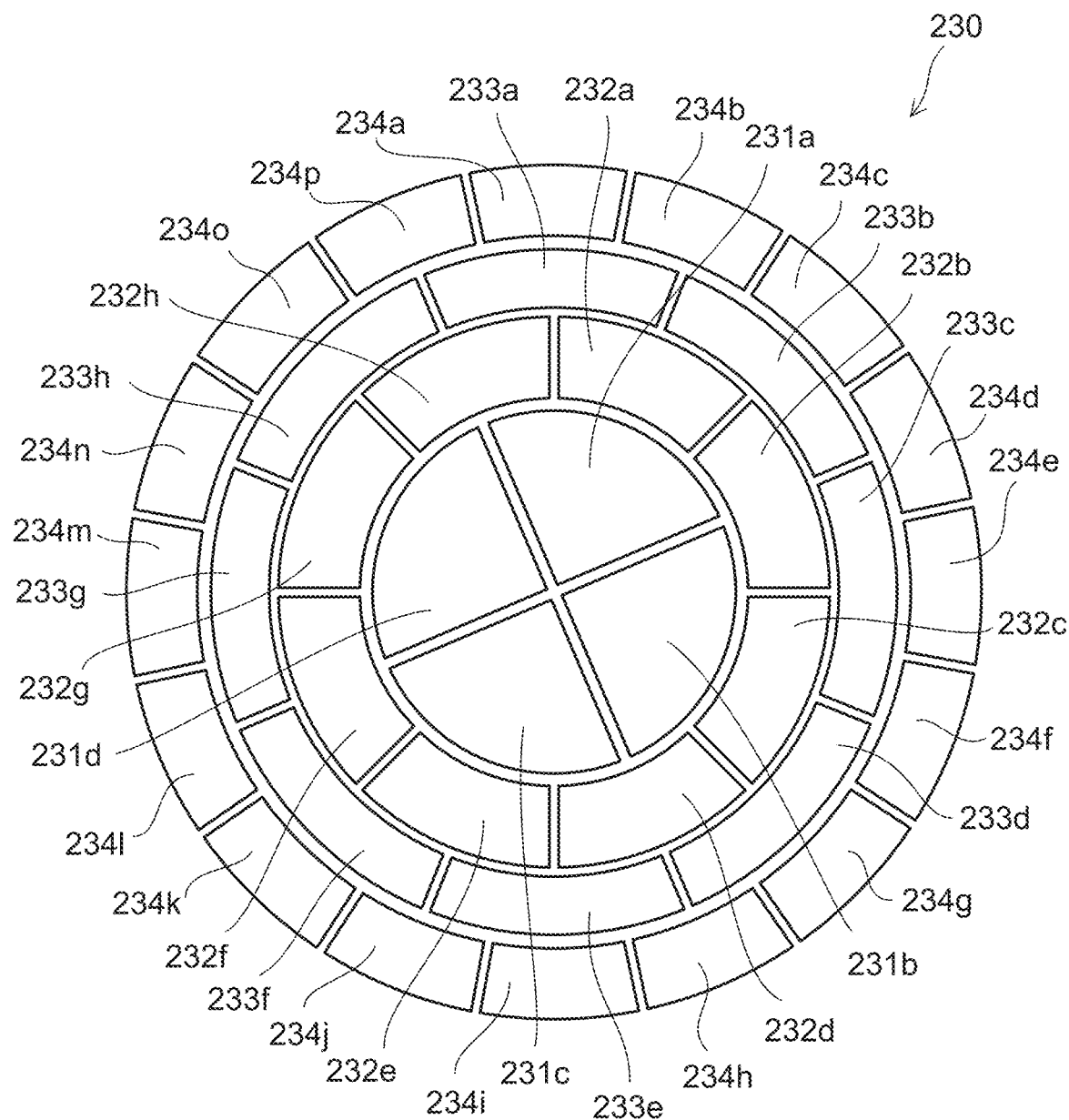
FIG. 20 is a schematic plan view illustrating heater elements of this specific example.

FIG. 19A, FIG. 19B, and FIG. 20 are schematic plan views illustrating heater elements of this specific example.

Figure 21A:
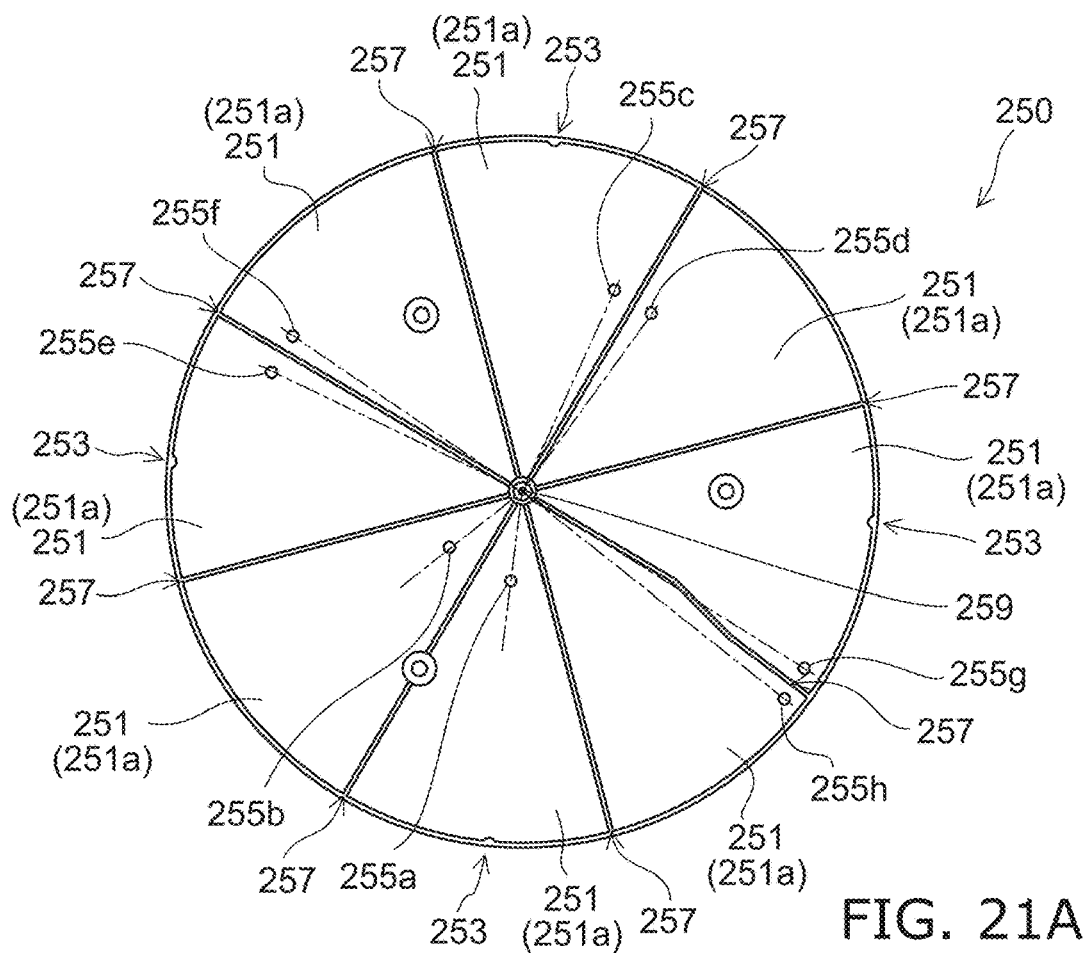
FIG. 21A and FIG. 21B are schematic plan views illustrating bypass layers of this specific example.
Figure 21B:
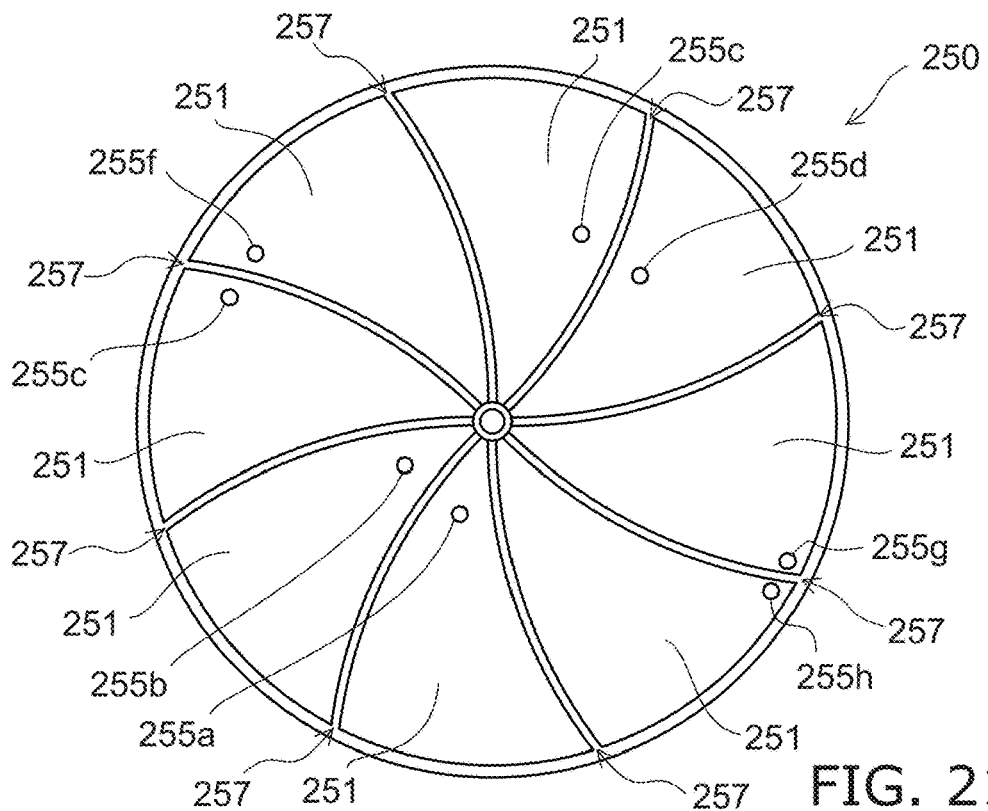

FIG. 21A and FIG. 21B are schematic plan views illustrating bypass layers of this specific example.

Figure 22A:
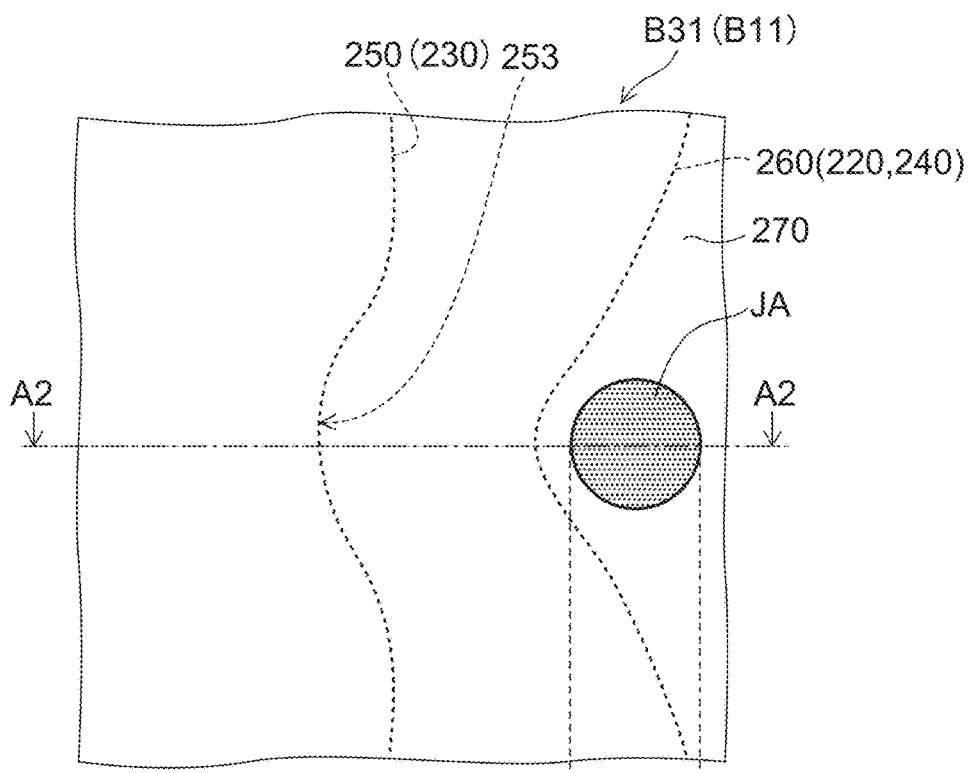
FIG. 22A to FIG. 22C are enlarged views schematically illustrating a portion of the heater plate of this specific example.
Figure 22B:
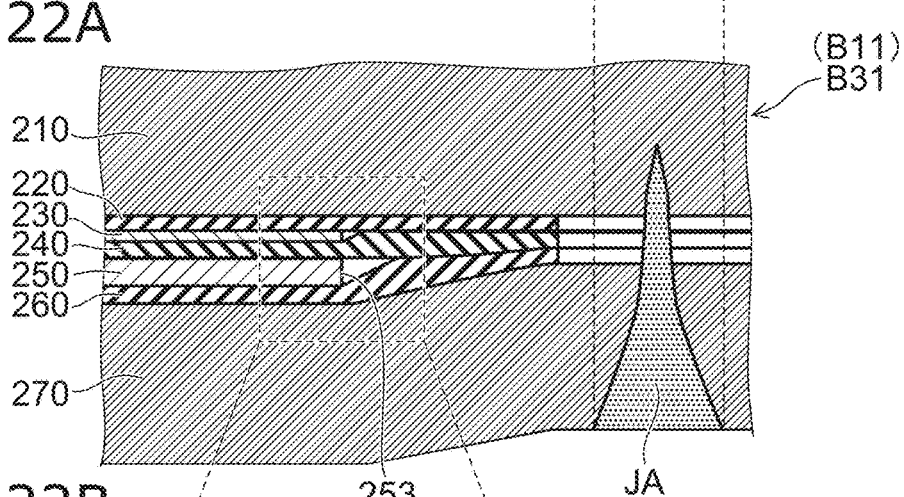
Figure 22C:
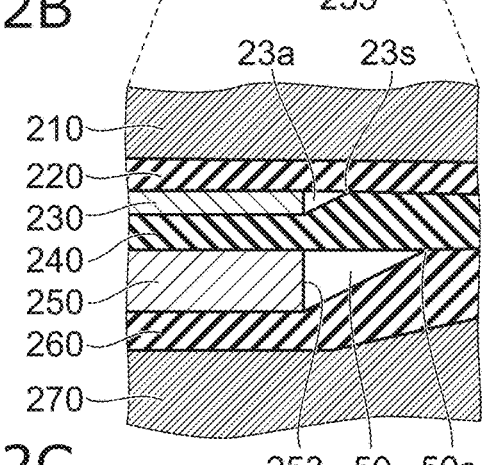

FIG. 22A to FIG. 22C are enlarged views schematically illustrating a portion of the heater plate of this specific example.

FIG. 18A is a schematic plan view of the heater plate of this specific example viewed from the upper surface. FIG. 18B is a schematic plan view of the heater plate of this specific example viewed from the lower surface. FIG. 19A is a schematic plan view illustrating an example of regions of the heater element. FIG. 19B and FIG. 20 are schematic plan views illustrating other examples of the regions of the heater element.

As illustrated in FIG. 21, at least one of the multiple bypass portions 251 of the bypass layer 250 has a notch 253 in an edge portion. Four notches 253 are provided in the bypass layer 250 illustrated in FIG. 20. The number of the notches 253 is not limited to four.

Because at least one of the multiple bypass layers 250 has the notch 253, the second support plate 270 can contact the first support plate 210.

As illustrated in FIG. 18A and FIG. 18B, the first support plate 210 is electrically coupled to the second support plate 270 in regions B11 to B14 and regions B31 to B34. The regions B11 to B14 correspond respectively to the regions B31 to B34. That is, in the specific example illustrated in FIG. 18A to FIG. 20, the first support plate 210 is electrically coupled to the second support plate 270 in four regions and is not electrically coupled to the second support plate 270 in eight regions.

FIG. 22A to FIG. 22C are enlarged views illustrating an example of the region B31 (the region B11). FIG. 22A is a schematic plan view of the region B31; FIG. 22B is a schematic cross-sectional view of the region B31; and FIG. 22C is a cross-sectional view of a portion of FIG. 22B that is enlarged further. FIG. 22B schematically illustrates an A2-A2 cross section of FIG. 22A. The other regions B12 to B14 and regions B32 to B34 are similar to the regions B11 and B31; and a detailed description is therefore omitted.

As illustrated in FIG. 22A to FIG. 22C, a coupling region JA is provided in the region B31. The coupling region JA couples the first support plate 210 and the second support plate 270 to each other. The coupling region JA is provided at the outer edges of the first support plate 210 and the second support plate 270 to correspond to the notch 253 of the bypass layer 250. The coupling region JA is formed by, for example, laser welding from the second support plate 270 side. Thereby, the coupling region JA is formed in a spot configuration. The coupling region JA may be formed from the first support plate 210 side. The method for forming the coupling region JA is not limited to laser welding and may be another method. The configuration of the coupling region JA is not limited to a spot configuration and may be an elliptical configuration, a semicircular configuration, a polygonal configuration, etc.

The surface area of the coupling region JA where the first support plate 210 is coupled to the second support plate 270 is narrower than the surface area of the surface 211 of the first support plate 210 (referring to FIG. 3). The surface area of the coupling region JA is narrower than the surface area difference of the surface area of the heater element 230 subtracted from the surface area of the surface 211. In other words, the surface area of the coupling region JA is narrower than the surface area of the region of the first support plate 210 not overlapping the heater element 230 when projected onto a plane parallel to the surface 211. The surface area of the coupling region JA where the first support plate 210 is coupled to the second support plate 270 is narrower than the surface area of the surface 271 of the second support plate 270 (referring to FIG. 4A). The surface area of the coupling region JA is narrower than the surface area difference of the surface area of the heater element 230 subtracted from the surface area of the surface 271. In other words, the surface area of the coupling region JA is narrower than the surface area of the region of the second support plate 270 not overlapping the heater element 230 when projected onto a plane parallel to the surface 271.

The diameter of the coupling region JA formed in the spot configuration is, for example, 1 mm (not less than 0.5 mm and not more than 3 mm). On the other hand, the diameter of the first support plate 210 and the second support plate 270 is, for example, 300 mm. The diameter of the first support plate 210 and the second support plate 270 is set according to the processing object W to be held. Thus, the surface area of the coupling region JA is sufficiently small compared to the surface area of the surface 211 of the first support plate 210 and the surface area of the surface 271 of the second support plate 270. The surface area of the coupling region JA is, for example, not more than ⅕₀₀₀ of the surface area of the surface 211 (the surface area of the surface 271). Here, more specifically, the surface area of the coupling region JA is the surface area when projected onto a plane parallel to the surface 211 of the first support plate 210. In other words, the surface area of the coupling region JA is the surface area when viewed in the top view.

In the example, four coupling regions JA that correspond to the regions B11 to B14 and the regions B31 to B34 are provided. The number of the coupling regions JA is not limited to four. The number of the coupling regions JA may be any number. For example, twelve coupling regions JA may be provided in the first support plate 210 and the second support plate 270 every 30°. Also, the configuration of the coupling region JA is not limited to a spot configuration. The configuration of the coupling region JA may be an elliptical configuration, a polygonal configuration, a line configuration, etc. For example, the coupling region JA may be formed in a ring configuration along the outer edge of the first support plate 210 and the second support plate 270.

The second support plate 270 has the hole 273 (referring to FIG. 4B and FIG. 15). On the other hand, the first support plate 210 does not have a hole where the power supply terminal 280 passes through. Therefore, the surface area of the surface 211 of the first support plate 210 is greater than the surface area of the surface 271 of the second support plate 270.

In the specific example illustrated in FIG. 19A, the heater electrode 239 is arranged to form substantially a circle. The heater electrode 239 is arranged in a first region 231, a second region 232, a third region 233, and a fourth region 234. The first region 231 is positioned at the central portion of the heater element 230. The second region 232 is positioned on the outer side of the first region 231. The third region 233 is positioned on the outer side of the second region 232. The fourth region 234 is positioned on the outer side of the third region 233.

The heater electrode 239 that is disposed in the first region 231 is not coupled electrically to the heater electrode 239 disposed in the second region 232. The heater electrode 239 that is disposed in the second region 232 is not coupled electrically to the heater electrode 239 disposed in the third region 233. The heater electrode 239 that is disposed in the third region 233 is not coupled electrically to the heater electrode 239 disposed in the fourth region 234. That is, the heater electrode 239 is provided in a state of being mutually-independent in multiple regions.

For example, the first electrically conductive portion 21 described in reference to FIG. 5 is the heater electrode 239 disposed in the second region 232; and the second electrically conductive portion 22 is the heater electrode 239 disposed in the third region 233. Or, the first electrically conductive portion 21 may be the heater electrode 239 disposed in the third region 233; and the second electrically conductive portion 22 may be the heater electrode 239 disposed in the fourth region 234.

As illustrated in FIG. 22C, the heater plate 200 has a hollow portion 50 provided at the side of the bypass layer 250. In other words, the hollow portion 50 is a space defined by the side end portion of the bypass layer 250, the second resin layer 240, and the third resin layer 260.

The size relationship between the cross-sectional area of the first hollow portion 23a provided at the side of the heater element 230 and the cross-sectional area of the hollow portion 50 provided at the side of the bypass layer 250 is the same as the size relationship between the thickness of the heater element 230 and the thickness of the bypass layer 250.

In the example, the thickness of the bypass layer 250 is thicker than the thickness of the heater element 230. Accordingly, in the example, the cross-sectional area of the hollow portion 50 at the side of the bypass layer 250 is greater than the cross-sectional area of the first hollow portion 23a at the side of the heater element 230. Conversely, in the case where the thickness of the heater element 230 is thicker than the thickness of the bypass layer 250, the cross-sectional area of the first hollow portion 23a is greater than the cross-sectional area of the hollow portion 50.

The first resin layer 220 contacts the second resin layer 240; and the first hollow portion 23a includes a side end 23s in the direction separated from the side end portion of the heater element 230. In other words, the side end 23s is the end portion of the contact surface between the first resin layer 220 and the second resin layer 240. Similarly, the third resin layer 260 contacts the second resin layer 240; and the hollow portion 50 includes a side end 50s in the direction separated from the side end portion of the bypass layer 250.

The side end 23s of the first hollow portion 23a is shifted toward the first support plate 210 side or the second support plate 270 side with respect to the center in the thickness direction of the heater element 230 (the first electrically conductive portion 21). The side end 50s of the hollow portion 50 at the side of the bypass layer 250 is shifted in the same direction as the side end 23s of the first hollow portion 23a with respect to the center in the thickness direction of the bypass layer 250.

In the example, the side end 23s of the first hollow portion 23a is shifted toward the first support plate 210 side. Accordingly, the side end 50s of the hollow portion 50 also is shifted toward the first support plate 210 side. Conversely, in the case where the side end 23s is shifted toward the second support plate 270 side, the side end 50s also is shifted toward the second support plate 270 side.

For example, in the case where the heater plate 200 is manufactured by compression-bonding the stack members, the side end 23s and the side end 50s are shifted toward the first support plate 210 side as illustrated in FIG. 22C in the case where the pressure toward the first support plate 210 side is strong. Conversely, the side end 23s and the side end 50s are shifted toward the second support plate 270 side in the case where the pressure toward the second support plate 270 side is strong.

Thus, in the case where the hollow portion 50 is provided at the side of the bypass layer 250, even when the bypass layer 250 undergoes thermal expansion, the bypass layer 250 deforms to fill the hollow portion 50. Therefore, the stress that is applied to the second resin layer 240, the third resin layer 260, etc., adjacent to the bypass layer 250 can be reduced. Accordingly, the peeling of the second resin layer 240, the third resin layer 260, etc., adjacent to the bypass layer 250 can be suppressed. For example, the resistance of the heater plate 200 to the load can be improved; and the reliability of the electrostatic chuck 10 can be increased further. Further, the temperature change of the processing object W occurring due to the peeling of the layers adjacent to the bypass layer 250 can be suppressed.

If the thickness of the heater element 230 and/or the bypass layer 250 is thick, the volume increase due to thermal expansion becomes large. Therefore, a larger cross-sectional area of the hollow portion is advantageous for the peeling suppression of the adjacent layers. Accordingly, by setting the size relationship between the cross-sectional area of the first hollow portion 23a and the cross-sectional area of the hollow portion 50 to be the same as the size relationship between the thickness of the heater element 230 and the thickness of the bypass layer 250, the peeling of the layers adjacent to the heater element 230 and the bypass layer 250 can be suppressed further. The temperature change of the processing object W due to the occurrence of the peeling can be suppressed more reliably.

Also, by shifting the side end 50s of the hollow portion 50 in the same direction as the side end 23s of the first hollow portion 23a, it is unnecessary to use a complex method, etc., to form the first hollow portion 23a and the hollow portion 50; and the formation of the first hollow portion 23s and the hollow portion 50 can be easy. For example, the first hollow portion 23s and the hollow portion 50 can be formed by manufacturing the heater plate 200 by compression-bonding the stack members.

In the specific example illustrated in FIG. 19B, the heater electrode 239 is arranged to form at least a portion of a substantially fan-like shape. The heater electrode 239 is disposed in a first region 231a, a second region 231b, a third region 231c, a fourth region 231d, a fifth region 231e, a sixth region 231f, a seventh region 232a, an eighth region 232b, a ninth region 232c, a tenth region 232d, an eleventh region 232e, and a twelfth region 232f. The heater electrode 239 that is disposed in any region is not coupled electrically to the heater electrode 239 disposed in the other regions. That is, the heater electrode 239 is provided in a state of being mutually-independent in multiple regions. As illustrated in FIG. 19A and FIG. 19B, the regions where the heater electrode 239 is disposed are not particularly limited.

In the specific example illustrated in FIG. 20, the heater element 230 further includes many regions. In the heater element 230 of FIG. 20, the first region 231 shown in FIG. 19A is further subdivided into four regions 231a to 231d. Also, the second region 232 shown in FIG. 19A is further subdivided into eight regions 232a to 232h. Also, the third region 233 shown in FIG. 19A is further subdivided into eight regions 233a to 233h. Also, the fourth region 234 shown in FIG. 19A is further subdivided into sixteen regions 234a to 234p. Thus, the number and configurations of the regions of the heater element 230 where the heater electrode 239 is disposed may be arbitrary.

As illustrated in FIG. 21A, the bypass portions 251 of the bypass layer 250 have a fan-like shape. The bypass portions 251 of the multiple fan-like shapes are arranged to be separated from each other; and the bypass layer 250 has a substantially circular shape as an entirety. As illustrated in FIG. 21A, a separating portion 257 that is between the mutually-adjacent bypass portions 251 extends in a diametrical direction from a center 259 of the bypass layer 250. In other words, the separating portion 257 that is between the mutually-adjacent bypass portions 251 extends in a radial configuration from the center 259 of the bypass layer 250. The surface area of the surface 251a of the bypass portion 251 is greater than the surface area of the separating portion 257. The surface area of the bypass layer 250 (the surface area of the surface 251a of the bypass portion 251) is wider than the surface area of the heater element 230 (the surface area of the heater electrode 239).

As illustrated in FIG. 21B, the configuration of the multiple bypass portions 251 of the bypass layer 250 may be, for example, a curved fan-like configuration. Thus, the number and configurations of the multiple bypass portions 251 provided in the bypass layer 250 may be arbitrary.

In the description hereinbelow relating to FIG. 18A to FIG. 21B, the region of the heater element 230 illustrated in FIG. 19A is used as an example. The heater electrode 239 is arranged to form substantially a circle; and the bypass portions 251 that have the multiple fan-like shapes are arranged to be separated from each other. Therefore, when viewed perpendicularly to the surfaces 251a of the bypass portions 251, the heater electrode 239 crosses the separating portion 257 between the mutually-adjacent bypass portions 251. Also, when viewed perpendicularly to the surfaces 251a of the bypass portions 251, a separating portion 235 that is between the regions of the mutually-adjacent heater elements 230 (the first region 231, the second region 232, the third region 233, and the fourth region 234) crosses the separating portion 257 between the mutually-adjacent bypass portions 251.

As illustrated in FIG. 18A and FIG. 18B, the multiple imaginary lines connecting a center 203 of the heater plate 200 to each of coupling portions 255a to 255h between the heater element 230 and the bypass layer 250 do not overlap each other. In other words, the coupling portions 255a to 255h between the heater element 230 and the bypass layer 250 are arranged in mutually-different directions when viewed from the center 203 of the heater plate 200. As illustrated in FIG. 18B, the power supply terminal 280 exists on an imaginary line connecting the center 203 of the heater plate 200 to each of the coupling portions 255a to 255h.

The coupling portions 255a and 255b are portions coupling the bypass layer 250 and the heater electrode 239 disposed in the first region 231. The coupling portions 255a and 255b correspond to the first region 231. One of the coupling portion 255a or the coupling portion 255b is a portion where the current enters the heater element 230. The other of the coupling portion 255a or the coupling portion 255b is a portion where the current exits from the heater element 230.

The coupling portions 255c and 255d are portions coupling the bypass layer 250 and the heater electrode 239 disposed in the second region 232. The coupling portions 255c and 255d correspond to the second region 232. One of the coupling portion 255c or the coupling portion 255d is a portion where the current enters the heater element 230. The other of the coupling portion 255c or the coupling portion 255d is a portion where the current exits from the heater element 230.

The coupling portions 255e and 255f are portions coupling the bypass layer 250 and the heater electrode 239 disposed in the third region 233. The coupling portions 255e and 255f correspond to the third region 233. One of the coupling portion 255e or the coupling portion 255f is a portion where the current enters the heater element 230. The other of the coupling portion 255e or the coupling portion 255f is a portion where the current exits from the heater element 230.

The coupling portions 255g and 255h are portions coupling the bypass layer 250 and the heater electrode 239 disposed in the fourth region 234. The coupling portions 255g and 255h correspond to the fourth region 234. One of the coupling portion 255g or the coupling portion 255h is a portion where the current enters the heater element 230. The other of the coupling portion 255g or the coupling portion 25h is a portion where the current exits from the heater element 230.

The coupling portions 255a and 255b exist on a circle that has the center 203 of the heater plate 200 as a center and is different from the circle passing through the coupling portions 255c and 255d. The coupling portions 255a and 255b exist on a circle that has the center 203 of the heater plate 200 as a center and is different from the circle passing through the coupling portions 255e and 255f. The coupling portions 255a and 255b exist on a circle that has the center 203 of the heater plate 200 as a center and is different from the circle passing through the coupling portions 255g and 255h.

The coupling portions 255c and 255d exist on a circle that has the center 203 of the heater plate 200 as a center and is different from the circle passing through the coupling portions 255e and 255f. The coupling portions 255c and 255d exist on a circle that has the center 203 of the heater plate 200 as a center and is different from the circle passing through the coupling portions 255g and 255h.

The coupling portions 255e and 255f exist on a circle that has the center 203 of the heater plate 200 as a center and is different from the circle passing through the coupling portions 255g and 255h.

As illustrated in FIG. 18A and FIG. 18B, the heater plate 200 has a lift pin hole 201. In the specific example illustrated in FIG. 18A and FIG. 18B, the heater plate 200 has three lift pin holes 201. The number of the lift pin holes 201 is not limited to three. The power supply terminal 280 is provided in a region on the center 203 side of the heater plate 200 when viewed from the lift pin hole 201.

According to this specific example, because the heater electrode 239 is disposed in the multiple regions, the temperature in the surface of the processing object W can be controlled independently for each region. Thereby, a difference of the temperature in the surface of the processing object W can be provided deliberately (temperature controllability).

Figure 23A:
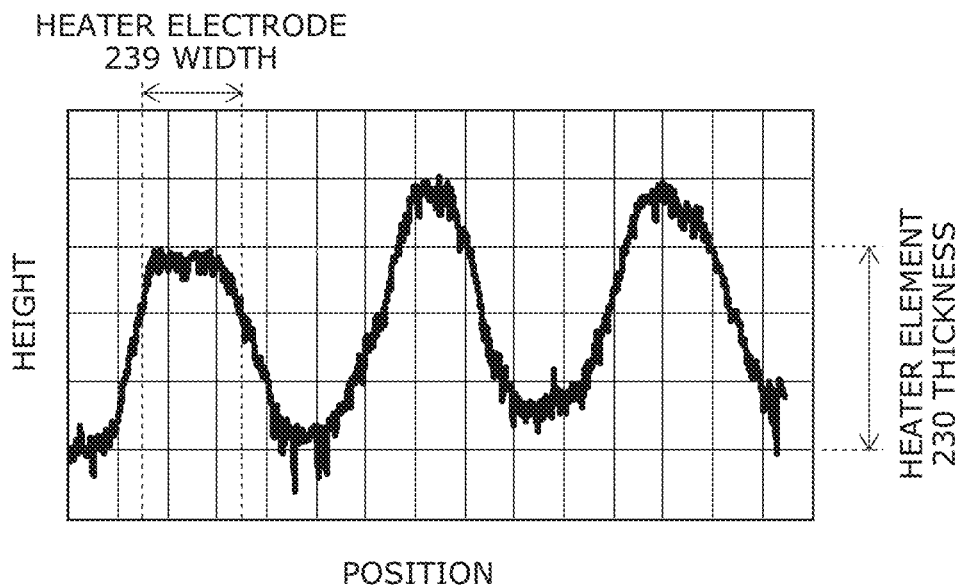
FIG. 23A and FIG. 23B are schematic views describing the configurations of the surfaces of the heater plate of the embodiment.
Figure 23B:
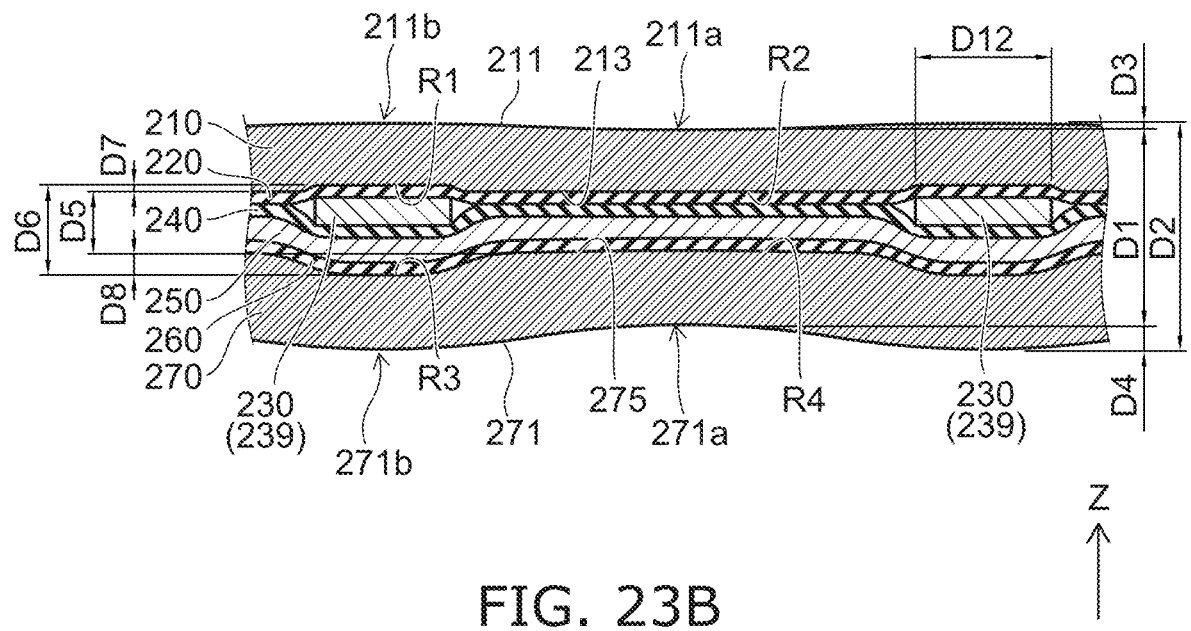

FIG. 23A and FIG. 23B are schematic views describing the configurations of the surfaces of the heater plate of the embodiment.

FIG. 23A is a graph illustrating an example of results of measurements of the configuration of the surface 271 of the second support plate 270 by the inventor. FIG. 23B is a schematic cross-sectional view describing the configuration of the surface of the heater plate 200 of the embodiment.

As described above, the members of the heater plate 200 are compression-bonded in a state of being stacked. At this time, as illustrated in FIG. 23B, a first unevenness occurs in the surface 211 (the upper surface) of the first support plate 210. And, a second unevenness occurs in the surface 271 (the lower surface) of the second support plate 270. Also, a third unevenness occurs in a surface 213 (the lower surface) of the first support plate 210. A fourth unevenness occurs in a surface 275 (the upper surface) of the second support plate 270.

The inventor measured the configuration of the surface 271 of the second support plate 270. An example of the measurement results is as illustrated in FIG. 23A. As illustrated in FIG. 23A and FIG. 23B, the configuration of the surface 211 (the upper surface) of the first support plate 210 and the configuration of the surface 271 of the second support plate 270 follow the configuration of the heater element 230 or the arrangement of the heater element 230. The configuration of the heater element 230 refers to the thickness of the heater element 230 and the width of the heater element 230 (the width of the heater electrode 239).

A distance D1 in the Z-direction between a recess 211a (the recess 211a of the first unevenness) of the surface 211 of the first support plate 210 and a recess 271a (the recess 271a of the second unevenness) of the surface 271 of the second support plate 270 is shorter than a distance D2 in the Z-direction between a protrusion 211b (the protrusion 211b of the first unevenness) of the surface 211 of the first support plate 210 and a protrusion 271b (the protrusion 271b of the second unevenness) of the surface 271 of the second support plate 270.

A distance D3 in the Z-direction between the recess 211a of the surface 211 of the first support plate 210 and the protrusion 211b of the surface 211 of the first support plate 210 (the unevenness height of the surface 211 of the first support plate 210: the height of the first unevenness) is shorter than a distance D4 in the Z-direction between the recess 271a of the surface 271 of the second support plate 270 and the protrusion 271b of the surface 271 of the second support plate 270 (the unevenness height of the surface 271 of the second support plate 270: the height of the second unevenness). That is, the unevenness height of the surface 211 of the first support plate 210 (the height of the first unevenness) is lower than the unevenness height of the surface 271 of the second support plate 270 (the height of the second unevenness).

The width of the recess 271a of the surface 271 of the second support plate 270 is about the same as the width of the region between the two mutually-adjacent heater electrodes 239 (a slit portion of the heater element 230). The width of the recess 271a of the surface 271 of the second support plate 270 is, for example, not less than 0.25 times and not more than 2.5 times the width of the region between the two mutually-adjacent heater electrodes 239.

The width of the protrusion 271b of the surface 271 of the second support plate 270 is about the same as the width of the heater electrode 239. The width of the protrusion 271b of the surface 271 of the second support plate 270 is, for example, not less than 0.8 times and not more than 1.2 times the width of the heater electrode 239.

Also, an unevenness height D4 of the surface 271 of the second support plate 270 is about the same as the thickness of the heater element 230 (the thickness of the heater electrode 239). The unevenness height D4 of the second support plate 270 is not less than 0.8 times and not more than 1.2 times the thickness of the heater element 230.

Similarly, the width of the recess 211a of the surface 211 of the first support plate 210 is about the same as the width of the region between the two mutually-adjacent heater electrodes 239. The width of the protrusion 211b of the surface 211 of the first support plate 210 is about the same as the width of the heater electrode 239. On the other hand, the unevenness height D3 of the surface 211 of the first support plate 210 is lower than the thickness of the heater element 230.

The height of the surface 271 of the second support plate 270 changes smoothly from the protrusion 271b toward the adjacent recess 271a. For example, the height of the surface 271 of the second support plate 270 decreases continuously from the center in the width direction of the protrusion 271b toward the center in the width direction of the adjacent recess 271a. More specifically, the center in the width direction of the protrusion 271b is the position of the surface 271 overlapping, in the Z-direction, the center in the width direction of the heater electrode 239. More specifically, the center in the width direction of the recess 271a is the position of the surface 271 overlapping, in the Z-direction, the center in the width direction of the region between the two mutually-adjacent heater electrodes 239.

Thus, the height of the surface 271 of the second support plate 270 changes in a wave-like configuration having the portions overlapping the heater electrode 239 as apexes and the portions not overlapping the heater electrode 239 as lowest points. Similarly, the height of the surface 211 of the first support plate 210 changes in a wave-like configuration having the portions overlapping the heater electrode 239 as apexes and the portions not overlapping the heater electrode 239 as lowest points.

According to the embodiment, because the surface 211 of the first support plate 210 has the first unevenness, the bonding surface area between the first support plate 210 and the heater element 230 can be wider; and the bonding strength between the first support plate 210 and the heater element 230 can be increased. Due to the first unevenness, the bonding surface area between the first support plate 210 and the bonding agent 403 also can be wider. Thereby, the coupling strength between the first support plate 210 and the bonding agent 403 also can be increased. Also, because the first support plate 210 has the unevenness, the rigidity of the first support plate 210 is high. Therefore, the warp and/or deformation of the heater plate 200 can be reduced even in the case where the first support plate 210 is thin. Thereby, for example, both "thermal capacity reduction" that affects high throughput and "warp reduction of the heater plate," which generally have an antinomic relationship, can be realized. Also, because the surface 271 of the second support plate 270 has the second unevenness, the bonding surface area between the second support plate 270 and the bypass layer 250 can be wider; and the bonding strength between the second support plate 270 and the bypass layer 250 can be increased. Due to the second unevenness, the bonding surface area between the second support plate 270 and the bonding agent 403 also can be wider. Thereby, the coupling strength between the second support plate 270 and the bonding agent 403 also can be increased. Also, because the second support plate 270 has the unevenness, the rigidity of the second support plate 270 is high. Therefore, even in the case where the second support plate 270 is thin, the warp and/or deformation of the heater plate 200 can be reduced. Thereby, for example, both "thermal capacity reduction" that affects high throughput and "warp reduction of the heater plate," which generally have an antinomic relationship, can be realized. Further, because the surface 211 of the first support plate 210 has the first unevenness, the distance between the heater element 230 and the processing object W can be shorter. Thereby, the speed of increasing the temperature of the processing object W can be increased.

For example, the first and second unevenness heights can be controlled by the compression-bonding conditions and/or the configuration (the materials, etc.) of the stacked body.

The first support plate 210 has the surface 213 on the second support plate 270 side, and the surface 211 on the side opposite to the surface 213. The surface 213 opposes the first resin layer 220 and contacts, for example, the first resin layer 220.

The surface 213 of the first support plate 210 includes a first region R1 and a second region R2. The first region R1 overlaps the heater electrode 239 (the heater element 230) when viewed along the Z-direction (when viewed in the top view). For example, the first region R1 overlaps the first electrically conductive portion 21 or the second electrically conductive portion 22 when viewed along the Z-direction. The second region R2 does not overlap the heater electrode 239 (the heater element 230) when viewed along the Z-direction.

In the electrostatic chuck 10, in a cross section parallel to the Z-direction shown in FIG. 23B, the second region R2 protrudes toward the second support plate 270 side compared to the first region R1. In other words, the position in the Z-direction of the second region R2 is between the second support plate 270 and the position in the Z-direction of the first region R1.

In other words, the surface 213 (the lower surface) of the first support plate 210 has an unevenness following the configuration of the heater element 230. The first region R1 corresponds to the recess of the first support plate 210; and the second region R2 corresponds to the protrusion of the first support plate 210. Similarly, in the surface 211 (the upper surface) of the first support plate 210 as well, an unevenness that follows the configuration of the heater element 230 is formed.

The second support plate 270 has the surface 275 (the upper surface) on the first support plate 210 side, and the surface 271 (the lower surface) on the side opposite to the surface 275. The surface 275 opposes the third resin layer 260 (or the second resin layer 240) and contacts, for example, the third resin layer 260 (or the second resin layer 240).

The surface 275 (the upper surface) of the second support plate 270 includes a third region R3 and a fourth region R4. The third region R3 overlaps the heater element 230 when viewed along the Z-direction. For example, the third region R3 overlaps the first electrically conductive portion 21 or the second electrically conductive portion 22 when viewed along the Z-direction. The fourth region R4 does not overlap the heater element 230 when viewed along the Z-direction.

In the cross section shown in FIG. 23B, the fourth region R4 protrudes toward the first support plate 210 side compared to the third region R3. In other words, the position in the Z-direction of the fourth region R4 is between the first support plate 210 and the position in the Z-direction of the third region R3.

In other words, the surface 275 (the upper surface) of the second support plate 270 has an unevenness following the configuration of the heater element 230. The third region R3 corresponds to the recess of the second support plate 270; and the fourth region R4 corresponds to the protrusion of the second support plate 270. Similarly, in the surface 271 (the lower surface) of the second support plate 270 as well, an unevenness that follows the configuration of the heater element 230 is formed.

A distance D5 along the Z-direction between the second region R2 and the fourth region R4 is shorter than a distance D6 along the Z-direction between the first region R1 and the third region R3.

Thus, an unevenness is formed in the first support plate 210 and the second support plate 270. Such an unevenness is formed by good adhesion of the members stacked in the heater plate 200. In other words, the adhesion between the surface 213 and the layers proximal to the surface 213 (e.g., the first resin layer 220) is high because the unevenness is formed in the surface 213 (the lower surface) of the first support plate 210. Also, the adhesion between the surface 275 and the layers proximal to the surface 275 (e.g., the third resin layer 260) is high because the unevenness is formed in the surface 275 (the upper surface) of the second support plate 270. Thereby, the peeling of the first support plate 210 and the peeling of the second support plate 270 can be suppressed; and the reliability can be increased. For example, nonuniformity of the heat and/or degradation of the withstand voltage characteristics due to the local peeling can be suppressed. The designed thermal uniformity and withstand voltage characteristics can be realized.

Also, because the adhesion is high, the thermal conductivity of the heater plate 200 can be improved. Also, due to the unevenness of the first support plate 210, for example, the distance between the heater element 230 and the processing object can be shortened. Thereby, the increase rate of the temperature of the processing object can be increased. Accordingly, for example, it is possible to realize both the "heating performance (the temperature increase rate) of the heater" and the "temperature uniformity" "withstand voltage reliability."

A distance D7 along the Z-direction between the first region R1 and the second region R2 is shorter than the distance D5. Also, a distance D8 along the Z-direction between the third region R3 and the fourth region R4 is shorter than the distance D5.

In the case where the distance D7 is too long, the unevenness that is formed in the surface 213 of the first support plate 210 may be too large; and the distortion that is generated in the first support plate 210 and/or the first resin layer 220 may be too large. Also, in the case where the distance D8 is too long, the unevenness that is formed in the second support plate 270 may be too large; and the distortion that is generated in the second support plate 270 and/or the second resin layer 240 may be too large.

Conversely, in the electrostatic chuck 10, the distance D7 and the distance D8 each are shorter than the distance D5. Thereby, the distortion that is generated in the first support plate 210 and/or the first resin layer 220 is prevented from becoming too large while ensuring the adhesion between the first support plate 210 and the layers proximal to the first support plate 210. Also, the distortion that is generated in the second support plate 270 and/or the third resin layer 260 is prevented from becoming too large while ensuring the adhesion between the second support plate 270 and the layers proximal to the second support plate 270.

In the heater plate 200, distortion (thermal distortion) occurs easily in the heater element 230 itself due to the heat generation of the heater element 230. Therefore, in the example shown in FIG. 23B, the distance D7 is set to be shorter than the distance D8. That is, the structural distortion of the first support plate 210, etc., on the heater element 230 side is smaller than the structural distortion of the second support plate 270, etc., on the bypass layer 250 side. Thereby, the resistance to thermal distortion of the entire heater plate 200 can be improved.

In the embodiment, one of the distance D7 or the distance D8 may be substantially zero. In other words, one of the surface 213 or the surface 275 may be flat. It is sufficient for an unevenness to be formed in one of the surface 213 or the surface 275.

Figure 24:
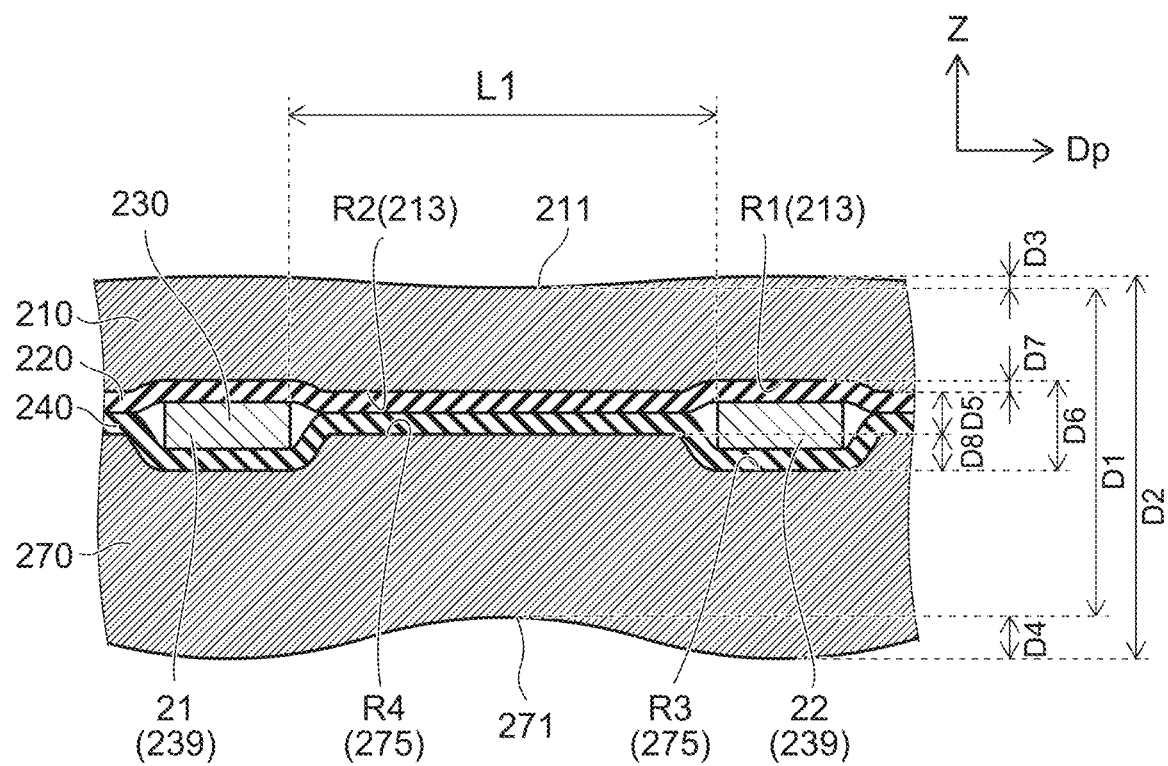
FIG. 24 is a schematic cross-sectional view illustrating the heater plate of the embodiment.

FIG. 24 is a schematic cross-sectional view illustrating the heater plate of the embodiment.

As illustrated in FIG. 24, in the heater plate 200 that does not include the bypass layer 250 and the third resin layer 260 as well, the first support plate 210 and the second support plate 270 have unevennesses following the configuration of the heater element 230.

In the example as well, the first unevenness occurs in the surface 211 of the first support plate 210. And, the second unevenness occurs in the surface 271 of the second support plate 270. Also, the third unevenness occurs in the surface 213 of the first support plate 210. The fourth unevenness occurs in the surface 275 of the second support plate 270. In a cross section parallel to the Z-direction, the second region R2 protrudes toward the second support plate 270 side compared to the first region R1. In a cross section parallel to the Z-direction, the fourth region R4 protrudes toward the first support plate 210 side compared to the third region R3. In the example as well, the relationship of the distances D1 to D8 is the same as the relationship of the distances D1 to D8 described in reference to FIG. 23.

Figure 25A:
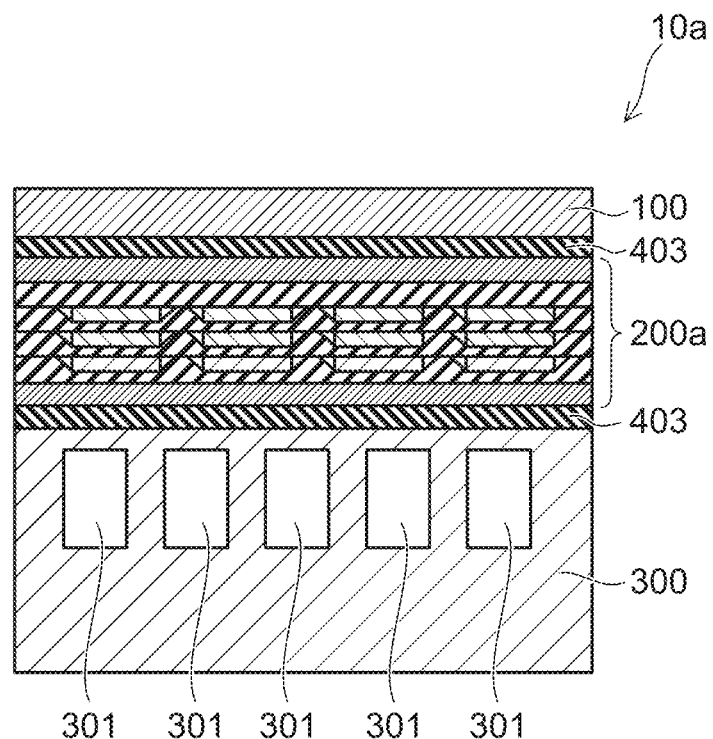
FIG. 25A and FIG. 25B are schematic cross-sectional views illustrating an electrostatic chuck according to a modification of the embodiment.
Figure 25B:
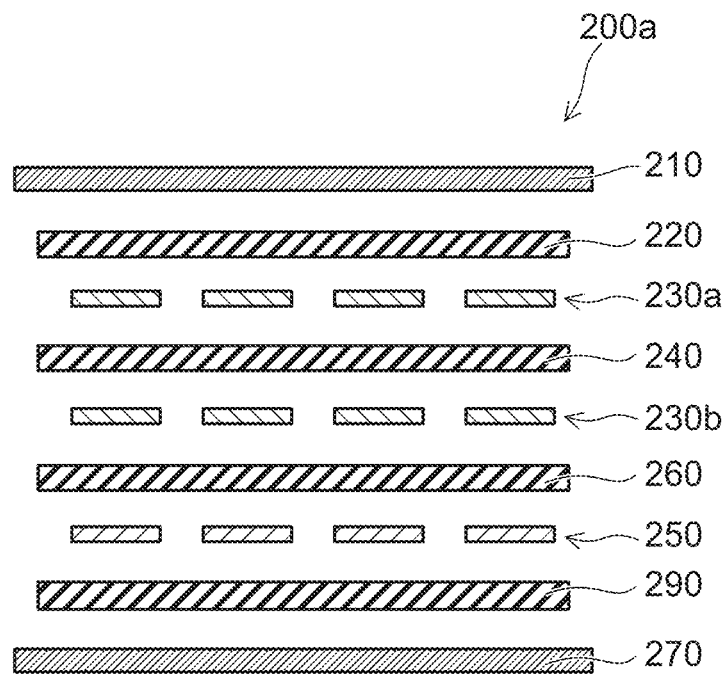

FIG. 25A and FIG. 25B are schematic cross-sectional views illustrating an electrostatic chuck according to a modification of the embodiment.

FIG. 25A is a schematic cross-sectional view illustrating the electrostatic chuck according to the modification of the embodiment. FIG. 25B is a schematic cross-sectional view illustrating the heater plate of the modification. For example, FIG. 24A and FIG. 25B correspond to schematic cross-sectional views of the A1-A1 cross section illustrated in FIG. 1.

The electrostatic chuck 10a illustrated in FIG. 25A includes the ceramic dielectric substrate 100, a heater plate 200a, and the base plate 300. The ceramic dielectric substrate 100 and the base plate 300 are as described above in reference to FIG. 1 and FIG. 2.

As illustrated in FIG. 25B, the heater plate 200a of this specific example includes multiple heater elements. The heater plate 200a illustrated in FIG. 25B includes the first resin layer 220, a first heater element (a heating layer) 230a, the second resin layer 240, a second heater element (a heating layer) 230b, the third resin layer 260, the bypass layer 250, a fourth resin layer 290, and the second support plate 270.

The first resin layer 220 is provided between the first support plate 210 and the second support plate 270. The first heater element 230a is provided between the first resin layer 220 and the second support plate 270. The second resin layer 240 is provided between the first heater element 230a and the second support plate 270. The second heater element 230b is provided between the second resin layer 240 and the second support plate 270. The third resin layer 260 is provided between the second heater element 230b and the second support plate 270. The bypass layer 250 is provided between the third resin layer 260 and the second support plate 270. The fourth resin layer 290 is provided between the bypass layer 250 and the second support plate 270. That is, in this specific example, the first heater element 230a is provided in an independent state in a layer different from the second heater element 230b.

The materials, thicknesses, and functions of the first support plate 210, the first resin layer 220, the second resin layer 240, the third resin layer 260, the bypass layer 250, and the second support plate 270 are as described above in reference to FIG. 3 to FIG. 5 and FIG. 13. The materials, thicknesses, and functions of the first heater element 230a and the second heater element 230b are the same as those of the heater element 230 described above in reference to FIG. 3 to FIG. 5. The fourth resin layer 290 is the same as the first resin layer 220 described above in reference to FIG. 3 to FIG. 5.

According to the modification, because the first heater element 230a is disposed independently in a layer different from that of the second heater element 230b, the temperature in the surface of the processing object W can be controlled independently for each prescribed region.

Figure 26A:
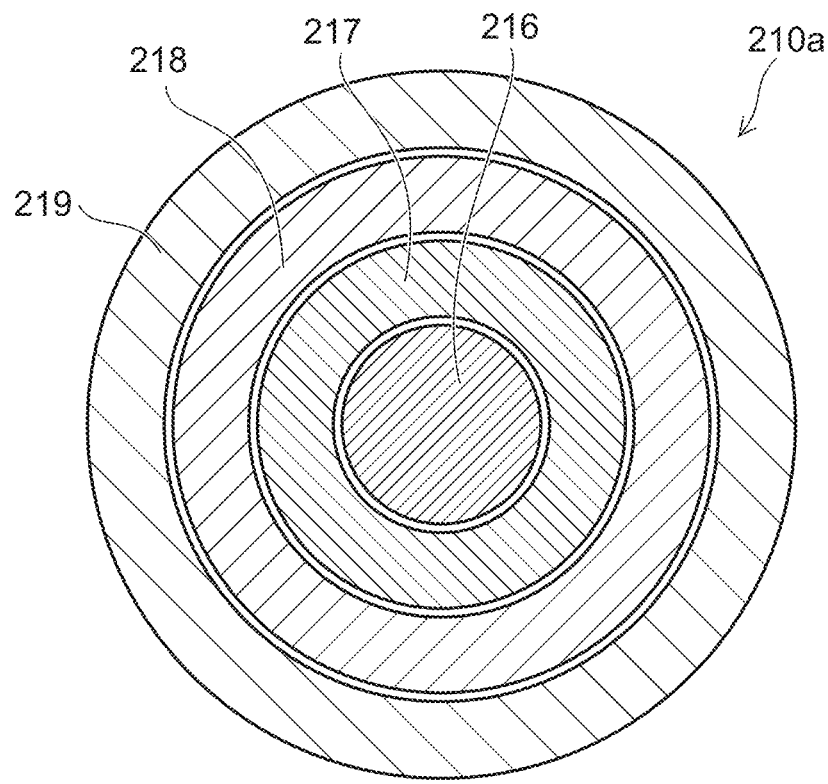
FIG. 26A and FIG. 26B are schematic plan views illustrating modifications of the first support plate of the embodiment.
Figure 26B:
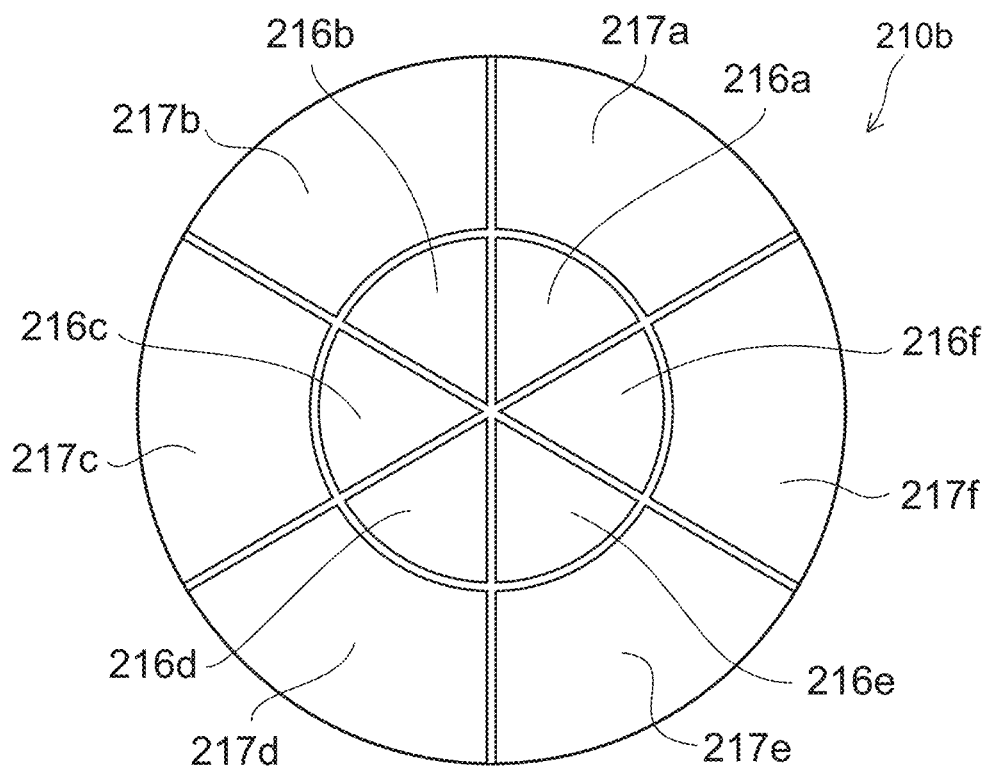
Figure 27:
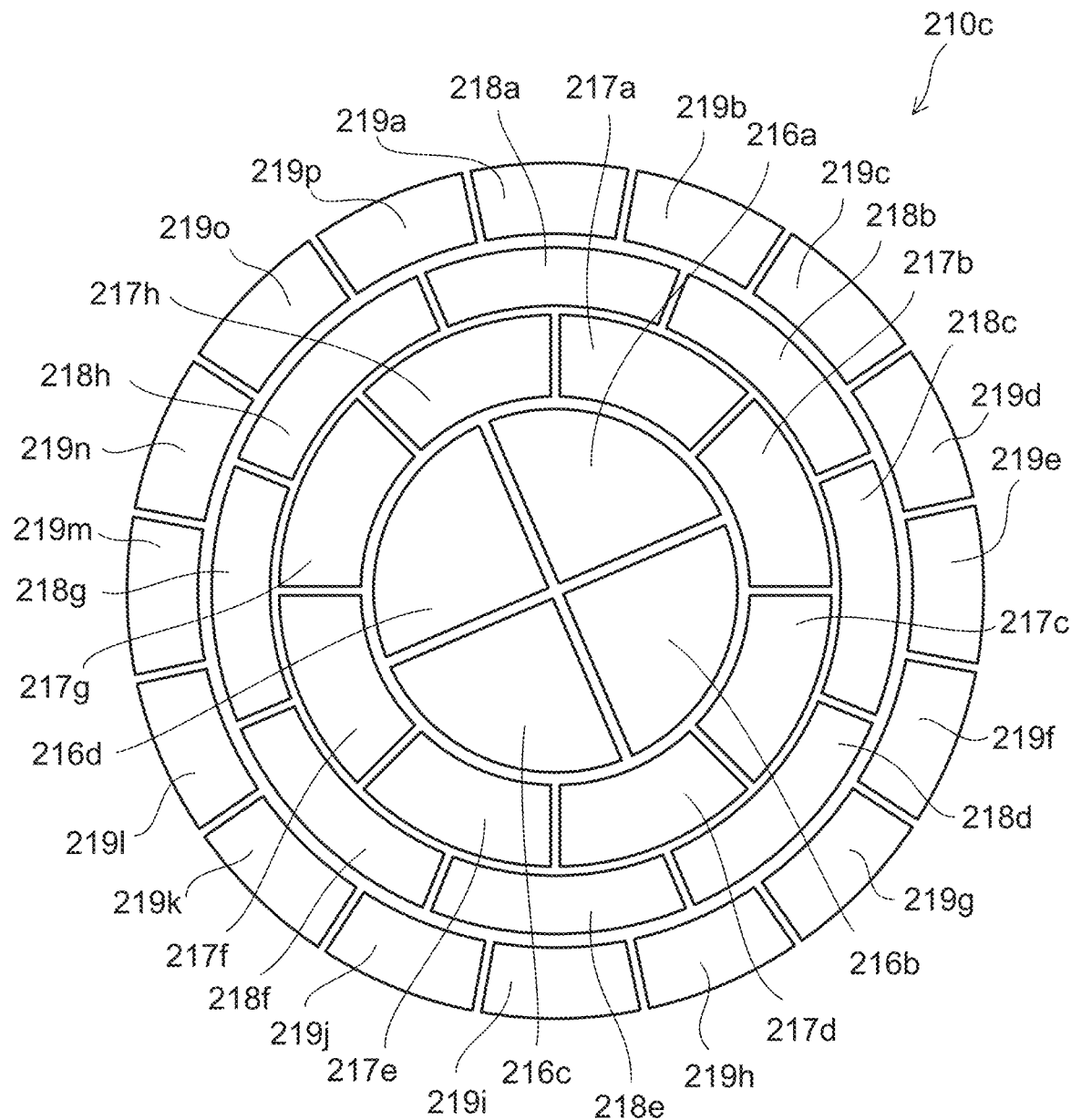
FIG. 27 is a schematic plan view illustrating modifications of the first support plate of the embodiment.

FIG. 26A, FIG. 26B, and FIG. 27 are schematic plan views illustrating modifications of the first support plate of the embodiment.

Figure 28:
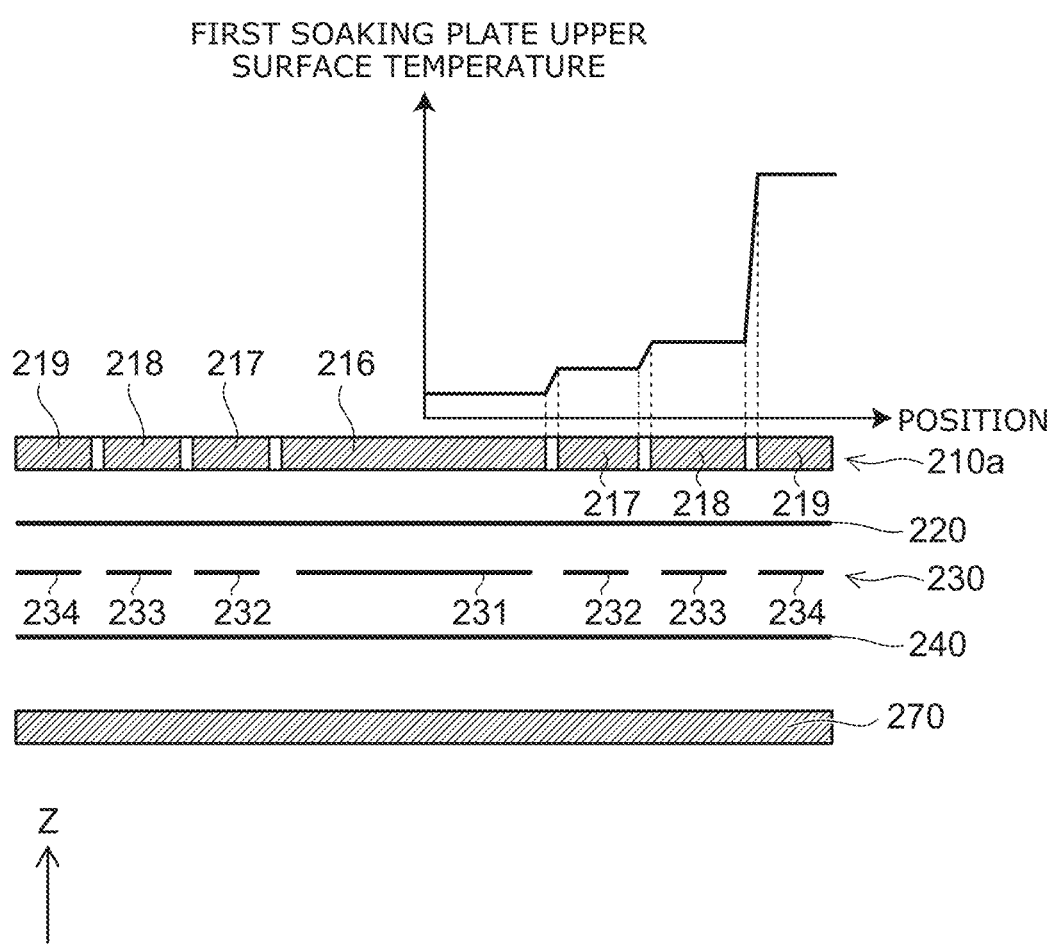
FIG. 28 is a schematic cross-sectional view illustrating the heater plate of the modification.

FIG. 28 is a schematic cross-sectional view illustrating the heater plate of the modification.

FIG. 26A illustrates an example in which the first support plate is subdivided into multiple supporters. FIG. 26B and FIG. 27 illustrate other examples in which the first support plate is subdivided into multiple supporters.

In FIG. 28, the heater plate illustrated in FIG. 26A and a graph of the temperature of the upper surface of the first support plate are illustrated together for convenience of description. The graph illustrated in FIG. 28 is an example of the temperature of the upper surface of the first support plate. The horizontal axis of the graph illustrated in FIG. 28 illustrates the position of the upper surface of a first support plate 210a. The vertical axis of the graph illustrated in FIG. 28 illustrates the temperature of the upper surface of the first support plate 210a. The bypass layer 250 and the third resin layer 260 are not illustrated in FIG. 28 for convenience of description.

In the modifications illustrated in FIG. 26A and FIG. 26B, the first support plate 210a is subdivided into multiple supporters. More specifically, in the modification illustrated in FIG. 26A, the first support plate 210a is subdivided into multiple supporters having concentric circular configurations, and includes a first supporter 216, a second supporter 217, a third supporter 218, and a fourth supporter 219. In the modification illustrated in FIG. 26B, a first support plate 210b is subdivided into multiple supporters having concentric circular configurations and radial configurations, and includes a first supporter 216a, a second supporter 216b, a third supporter 216c, a fourth supporter 216d, a fifth supporter 216e, a sixth supporter 216f, a seventh supporter 217a, an eighth supporter 217b, a ninth supporter 217c, a tenth supporter 217d, an eleventh supporter 217e, and a twelfth supporter 217f.

In the modification illustrated in FIG. 27, a first support plate 210c further includes many supporters. In the first support plate 210c of FIG. 27, the first supporter 216 shown in FIG. 26A is further subdivided into four supporters 216a to 216d. Also, the second supporter 217 shown in FIG. 26A is further subdivided into eight supporters 217a to 217h. Also, the third supporter 218 shown in FIG. 26A is further subdivided into eight regions 218a to 218h. Also, the fourth supporter 219 shown in FIG. 26A is further subdivided into sixteen supporters 219a to 219p. Thus, the number and configurations of the supporters provided in the first support plate 210 may be arbitrary.

The first resin layer 220, the heater element 230, the second resin layer 240, the bypass layer 250, the third resin layer 260, the second support plate 270, and the power supply terminal 280 each are as described above in reference to FIG. 3 to FIG. 5 and FIG. 13.

In the description hereinbelow relating to FIG. 26A to FIG. 28, the first support plate 210a illustrated in FIG. 26A is used as an example. As illustrated in FIG. 28, the first supporter 216 is provided on the first region 231 of the heater element 230 and corresponds to the first region 231 of the heater element 230. The second supporter 217 is provided on the second region 232 of the heater element 230 and corresponds to the second region 232 of the heater element 230. The third supporter 218 is provided on the third region 233 of the heater element 230 and corresponds to the third region 233 of the heater element 230. The fourth supporter 219 is provided on the fourth region 234 of the heater element 230 and corresponds to the fourth region 234 of the heater element 230.

The first supporter 216 is not coupled electrically to the second supporter 217. The second supporter 217 is not coupled electrically to the third supporter 218. The third supporter 218 is not coupled electrically to the fourth supporter 219. In other words, the multiple supporters 216 to 219 are provided in a mutually-independent state.

According to the modification, a temperature difference in the diametrical direction in the surfaces of the first support plates 210a, 210b, and 210c can be provided deliberately (temperature controllability). For example, the temperature difference can be provided in a step configuration from a first supporter 26 to the fourth supporter 219 as in the graph illustrated in FIG. 28. Thereby, the temperature difference can be provided deliberately in the surface of the processing object W (temperature controllability).

FIG. 29A to FIG. 29D are cross-sectional views illustrating modifications of the heater plate of the embodiment.

Figure 29A:
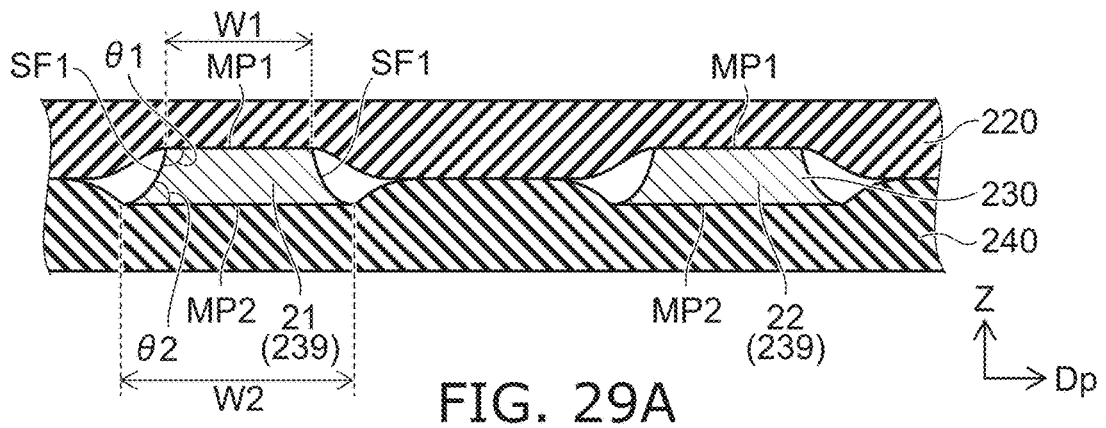
FIG. 29A to FIG. 29D are cross-sectional views illustrating modifications of the heater plate of the embodiment.
Figure 29B:
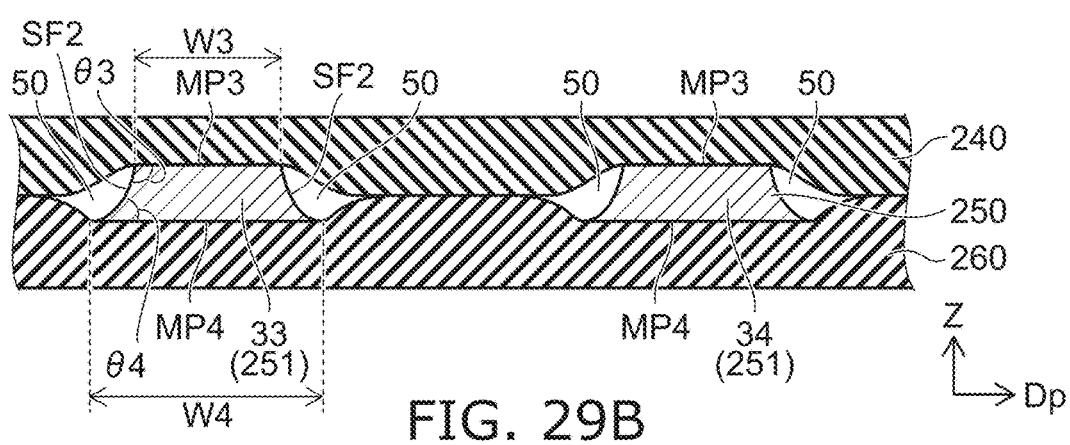
Figure 29C:
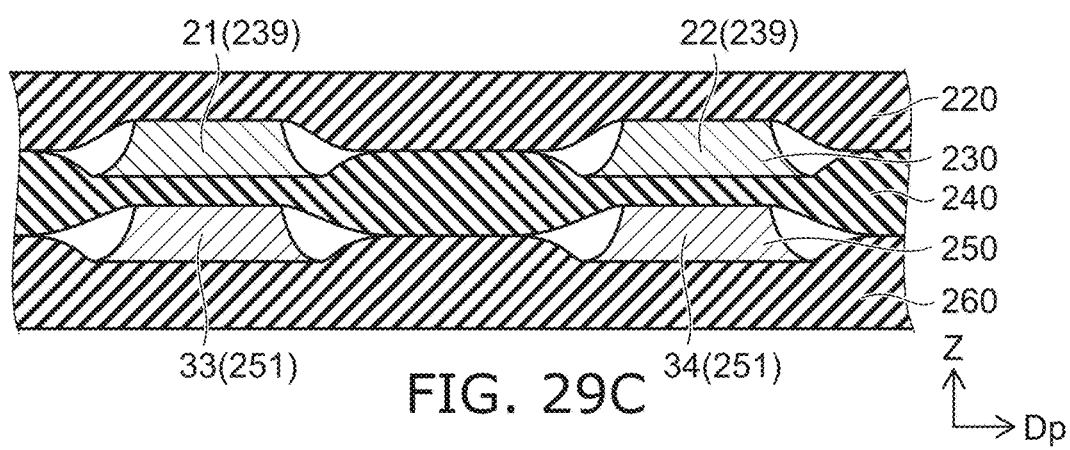
Figure 29D:
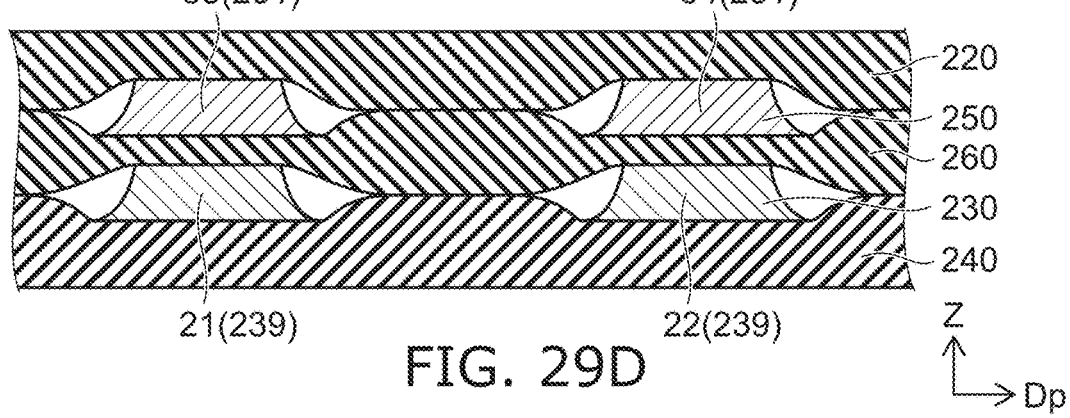

FIG. 29A illustrates a portion of the heater element 230; and FIG. 29B illustrates a portion of the bypass layer 250. Also, FIG. 29C illustrates a portion of the heater element 230 and the bypass layer 250; and FIG. 29D illustrates a modification of the heater element 230 and the bypass layer 250.

Each of the heater electrodes 239 has a first surface MP1 (the upper surface) on the first support plate 210 side, and a second surface MP2 (the lower surface) on the second support plate side. The first surface MP1 opposes the first resin layer 220. The second surface MP2 faces the side opposite to the first surface MP1. In other words, the second surface MP2 opposes the second resin layer 240.

A width W1 of the first surface MP1 is different from a width W2 of the second surface MP2. In the example, the width W1 of the first surface MP1 is narrower than the width W2 of the second surface MP2. In other words, the width of the heater electrode 239 becomes narrower upward (the ceramic dielectric substrate 100 side).

The heater electrodes 239 each have a pair of side surfaces SF1 connecting the first surface MP1 and the second surface MP2. In the cross section parallel to the Z-direction shown in FIG. 29A, the side surfaces SF1 have curved configurations. For example, the side surfaces SF1 each have a concave curved-surface configuration. For example, the side surfaces SF1 each may have a planar configuration. An angle θ1 between the first surface MP1 and the side surface SF1 is different from an angle θ2 between the second surface MP2 and the side surface SF1. Thereby, for example, both the thermal characteristic of the thermal uniformity and/or temperature responsiveness and the reduction of the peeling of the resin layers proximal to the heater element 230 by the relaxation of the stress on the resin layers due to the heater deformation due to the thermal expansion can be realized. Also, the surface roughness of the side surfaces SF1 is rougher than the surface roughness of at least one of the first surface MP1 or the second surface MP2. Thereby, for example, the adhesion at the side surface portions can be improved; and the peeling of the layers proximal to the heater element 230 can be suppressed further.

For example, the first surface MP1 contacts the first resin layer 220. For example, the second surface MP2 contacts the second resin layer 240.

As illustrated in FIG. 29B and FIG. 29C, the bypass portions 251 (the bypass layer 250) include a third electrically conductive portion 33 and a fourth electrically conductive portion 34. The fourth electrically conductive portion 34 is separated from the third electrically conductive portion 33 in the in-plane direction Dp (e.g., the X-direction). The third electrically conductive portion 33 and the fourth electrically conductive portion 34 are portions of the bypass portions 251. For example, the hollow portion 50 is provided at the side of each of the third electrically conductive portion 33 and the fourth electrically conductive portion 34. In other words, the hollow portion 50 is provided at the side of each of the multiple bypass portions 251.

The bypass portions 251 each have a third surface MP3 (the upper surface) on the first support plate 210 side, and a fourth surface MP4 (the lower surface) on the second support plate 270 side. The third surface MP3 opposes the second resin layer 240. The fourth surface MP4 faces the side opposite to the third surface MP3. In other words, the fourth surface MP4 opposes the third resin layer 260.

A width W3 of the third surface MP3 is different from a width W4 of the fourth surface MP4. In the example, the width W3 of the third surface MP3 is narrower than the width W4 of the fourth surface MP4. In other words, the width of the bypass portions 251 becomes narrower upward (the ceramic dielectric substrate 100 side). In the example, the width size relationship of the third surface MP3 to the fourth surface MP4 is the same as the width size relationship of the first surface MP1 to the second surface MP2.

The bypass portions 251 each have a pair of side surfaces SF2 connecting the third surface MP3 and the fourth surface MP4. For example, the side surfaces SF2 each have a concave curved-surface configuration. For example, the side surfaces SF2 each may have a planar configuration. An angle θ3 between the third surface MP3 and the side surfaces SF2 is different from an angle θ4 between the fourth surface MP4 and the side surfaces SF2. Also, the surface roughness of the side surfaces SF2 is rougher than the surface roughness of at least one of the third surface MP3 or the fourth surface MP4.

For example, the third surface MP3 contacts the second resin layer 240. For example, the fourth surface MP4 contacts the third resin layer 260.

Thus, in the electrostatic chuck 10 according to the embodiment, the width W1 of the first surface MP1 is different from the width W2 of the second surface MP2. Thereby, even when the heater element 230 deforms due to the thermal expansion, the stress that is applied to the first resin layer 220, etc., can be reduced. Thereby, the peeling of the layers (e.g., the first resin layer 220) proximal to the heater element 230 can be suppressed. The temperature change of the processing object occurring due to the peeling can be suppressed. Accordingly, the reliability of the electrostatic chuck can be increased.

Also, in the electrostatic chuck 10, the width W1 of the first surface MP1 is narrower than the width W2 of the second surface MP2. Thereby, the contact surface area to the first surface MP1 is small; the stress that is applied to the layer contacting the first surface MP1 is reduced; and the peeling of the layer contacting the first surface MP1 can be suppressed. For example, the peeling of the first resin layer 220 can be suppressed. Also, the heat generation amount on the second surface MP2 side where the heat escapes easily to the base plate 300 is more than the heat generation amount on the first surface MP1 side; and the fluctuation of the heat distribution in the vertical direction (the Z-direction) perpendicular to the first surface MP1 and the second surface MP2 can be suppressed. For example, the thermal uniformity can be improved further.

Also, in the electrostatic chuck 10, the side surface SF1 has a concave curved-surface configuration. Thereby, the stress that is applied to the layer proximal to the side surface SF1 can be reduced; and the peeling of the layer proximal to the side surface SF1 can be suppressed.

Also, in the electrostatic chuck 10, the angle θ1 between the first surface MP1 and the side surface SF1 is different from the angle θ2 between the second surface MP2 and the side surface SF1. Thereby, by relaxing the stress on the resin layers due to the heater deformation due to the thermal expansion, both the thermal characteristic of the thermal uniformity and/or temperature responsiveness and the reduction of the peeling of the first resin layer 220 and the second resin layer 240 proximal to the heater element 230 can be realized.

Also, in the electrostatic chuck 10, the width size relationship of the third surface MP3 to the fourth surface MP4 is the same as the width size relationship of the first surface MP1 to the second surface MP2. Also, in the electrostatic chuck 10, the widths of the first surface MP1 and the third surface MP3 are narrower than the widths of the second surface MP2 and the fourth surface MP4. In such a case, the fluctuation of the heat distribution in the Z-direction can be suppressed further.

The heater element 230 is provided on the bypass layer 250 in FIG. 29A to FIG. 29C. This is not limited thereto; for example, the bypass layer 250 may be provided on the heater element 230 as illustrated in FIG. 29D. In other words, the bypass layer 250 may be provided between the heater element 230 and the ceramic dielectric substrate 100.

In the example, the bypass layer 250 is provided between the first resin layer 220 and the heater element 230; and the third resin layer 260 is provided between the heater element 230 and the bypass layer 250. For example, the bypass layer 250 may be provided between the first support plate 210 and the first resin layer 220; and the third resin layer 260 may be provided between the first support plate 210 and the bypass layer 250.

As illustrated in FIG. 29D, in the case where the bypass layer 250 is provided on the heater element 230, the heat of the heater element 230 where the temperature is highest can be transferred quickly to the base plate 300 at the instant that the voltage supply to the heater plate 200 is cut off; and the temperature responsiveness (the ramp rate) when reducing the temperature of the processing object W can be improved further. The position where the bypass layer 250 is disposed may be any position between the first support plate 210 and the second support plate 270.

FIG. 30A to FIG. 30D are cross-sectional views illustrating modifications of the heater plate of the embodiment.

Figure 30A:
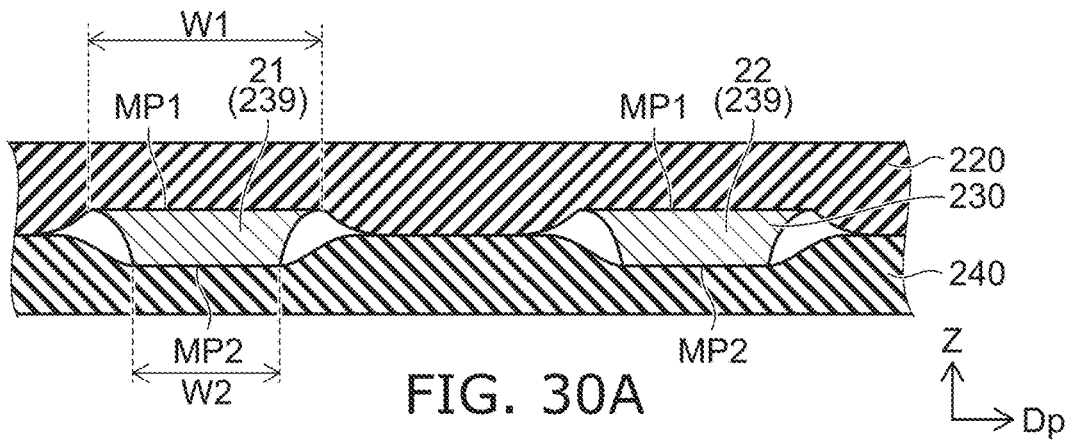
FIG. 30A to FIG. 30D are cross-sectional views illustrating modifications of the heater plate of the embodiment.
Figure 30B:
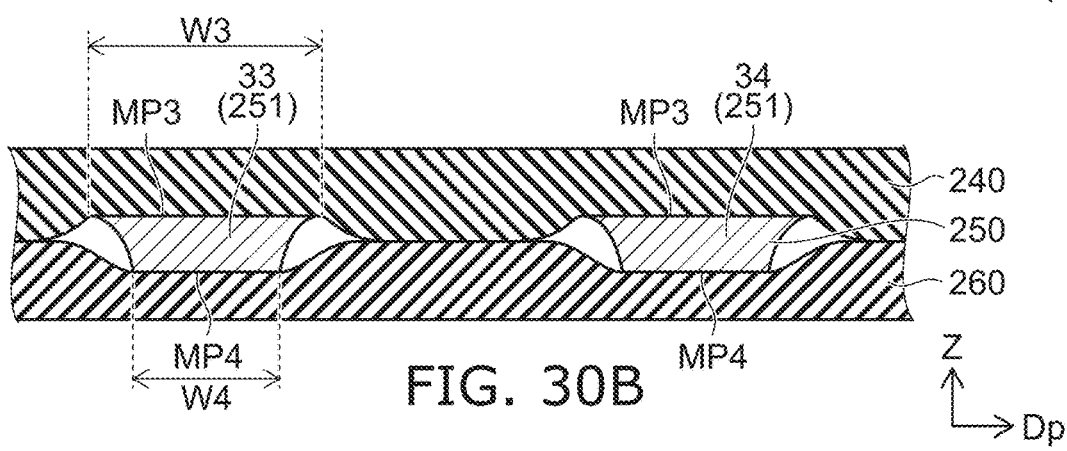
Figure 30C:
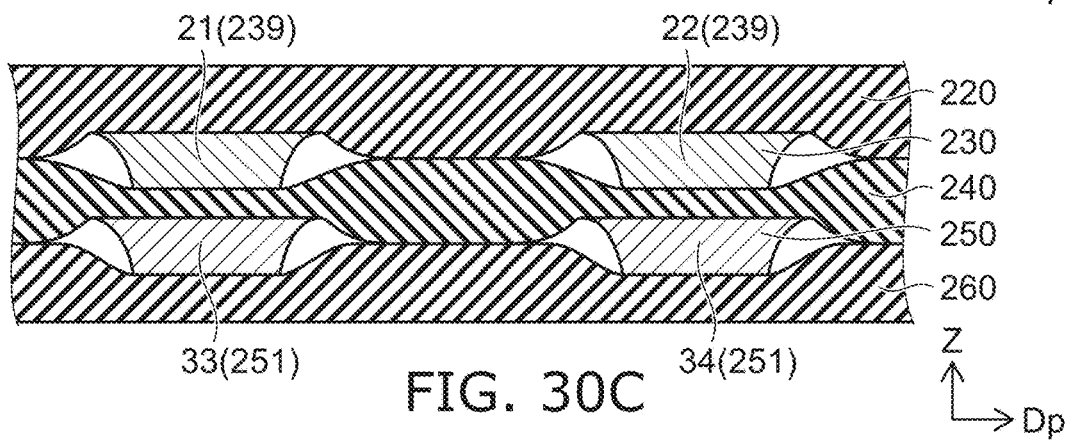

In the example as illustrated in FIG. 30A and FIG. 30C, the width W1 of the first surface MP1 is wider than the width W2 of the second surface MP2. In other words, the width of the heater electrode 239 becomes narrower downward (the base plate 300 side). Similarly, as illustrated in FIG. 30B and FIG. 30C, the width W3 of the third surface MP3 is wider than the width W4 of the fourth surface MP4. The width of the bypass portions 251 becomes narrower downward.

Thus, the width W1 of the first surface MP1 may be wider than the width W2 of the second surface MP2. In such a case, the stress that is applied to the layer contacting the second surface MP2 can be reduced; and the peeling of the layer contacting the second surface MP2 can be suppressed. Also, the heat on the first surface MP1 side is retained easily; the heat on the second surface MP2 side is cooled easily; and the temperature responsiveness (the ramp rate) can be improved further.

Figure 30D:
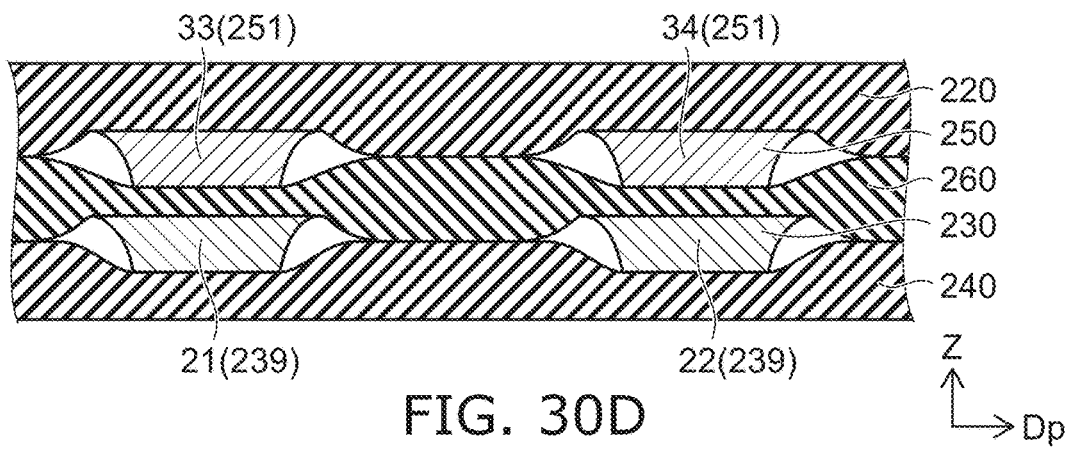

Also, in the example, the width size relationship of the third surface MP3 to the fourth surface MP4 is the same as the width size relationship of the first surface MP1 to the second surface MP2; and the widths of the first surface MP1 and the third surface MP3 are wider than the widths of the second surface MP2 and the fourth surface MP4. In such a case, the heat on the first surface MP1 side and on the third surface MP3 side is retained easily; the heat on the second surface MP2 side and on the fourth surface MP4 side is cooled easily; and the temperature responsiveness can be improved further. Also, as illustrated in FIG. 30D, the bypass layer 250 may be provided on the heater element 230.

FIG. 31A to FIG. 31D are cross-sectional views illustrating modifications of the heater plate of the embodiment.

Figure 31A:
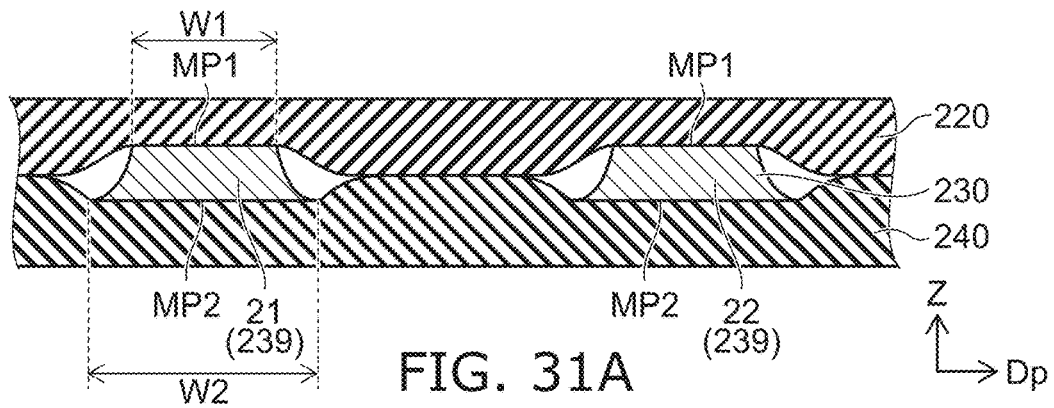
FIG. 31A to FIG. 31D are cross-sectional views illustrating modifications of the heater plate of the embodiment.
Figure 31B:
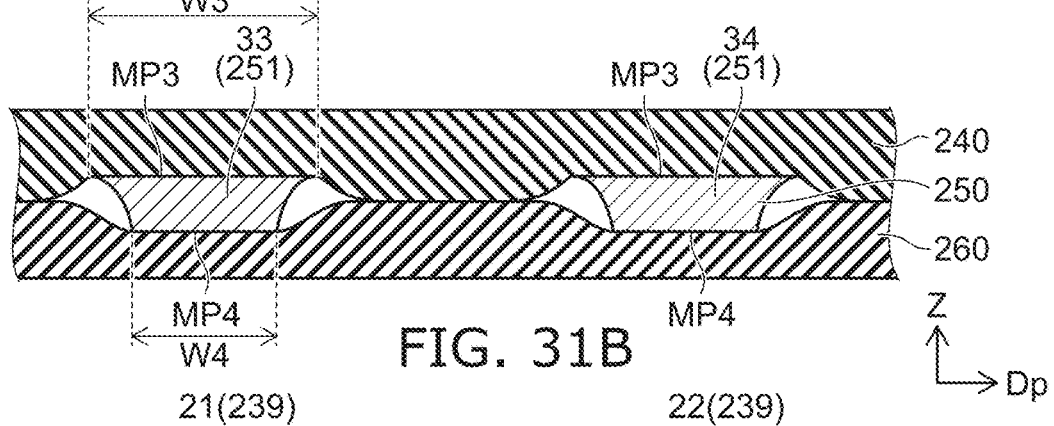
Figure 31C:
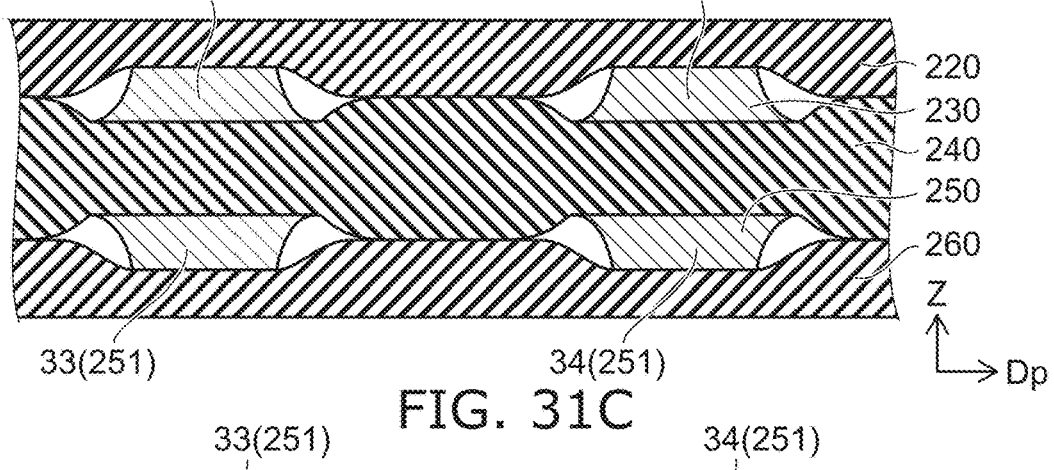

In the example as illustrated in FIG. 31A and FIG. 31C, the width W1 of the first surface MP1 is narrower than the width W2 of the second surface MP2. On the other hand, as illustrated in FIG. 31B and FIG. 31C, the width W3 of the third surface MP3 is wider than the width W4 of the fourth surface MP4. In the example, the width size relationship of the third surface MP3 to the fourth surface MP4 is the opposite of the width size relationship of the first surface MP1 to the second surface MP2.

Figure 31D:
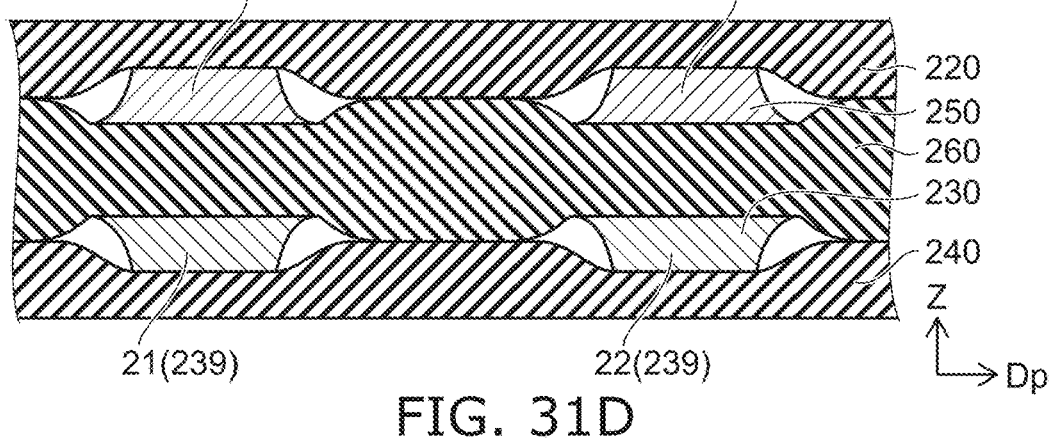

Thus, the width size relationship of the third surface MP3 to the fourth surface MP4 may be the opposite of the width size relationship of the first surface MP1 to the second surface MP2. In such a case, the direction of the stress applied by the thermal expansion of the bypass layer 250 can have the reverse orientation of the direction of the stress applied by the thermal expansion of the heater element 230. Thereby, the effects of the stress can be suppressed further. As illustrated in FIG. 31D, the bypass layer 250 may be provided on the heater element 230.

FIG. 32A to FIG. 32D are cross-sectional views illustrating modifications of the heater plate of the embodiment.

Figure 32A:
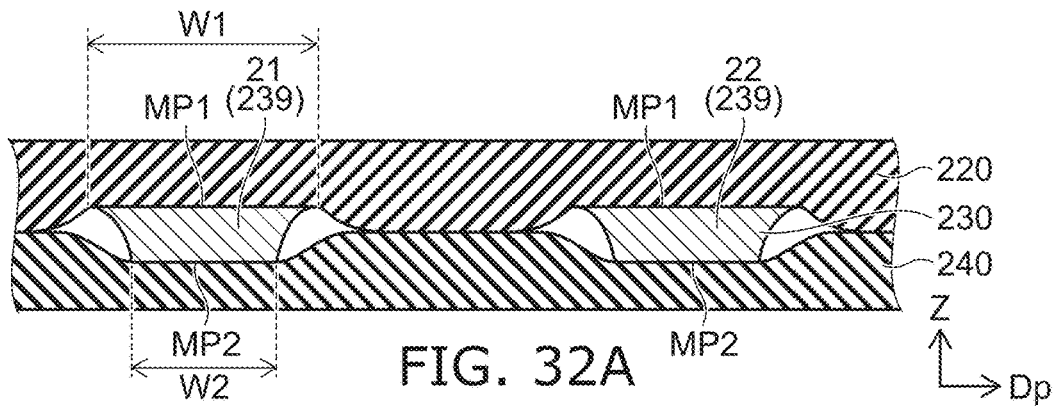
FIG. 32A to FIG. 32D are cross-sectional views illustrating modifications of the heater plate of the embodiment.
Figure 32B:
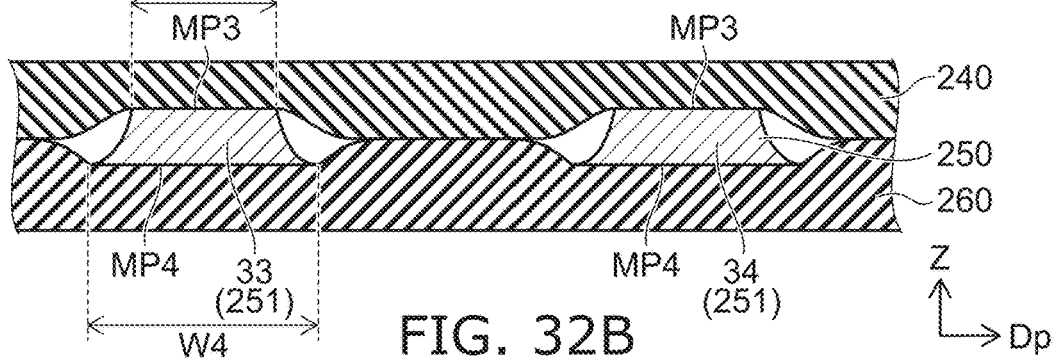
Figure 32C:
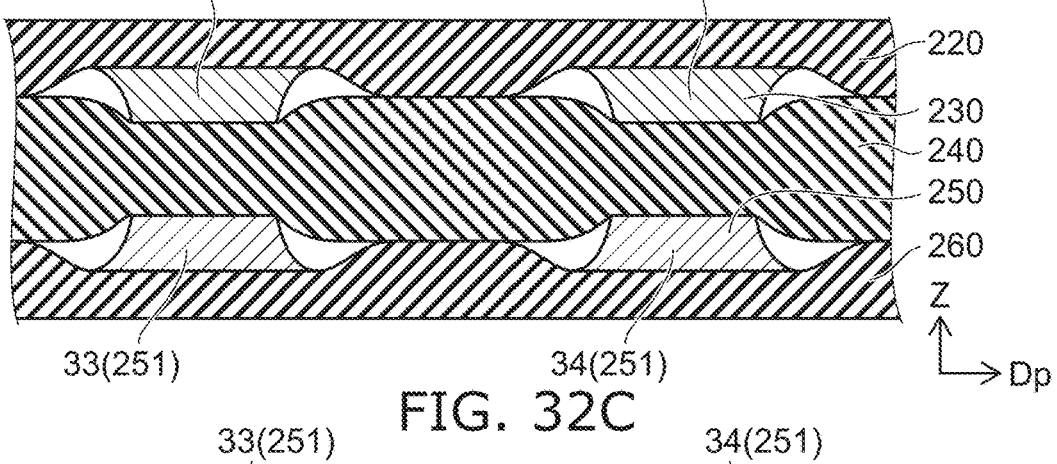
Figure 32D:
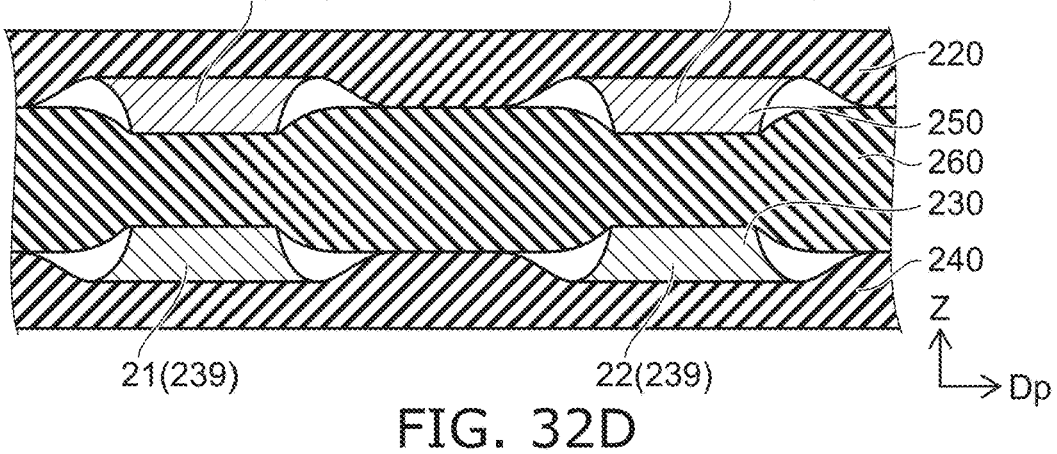

As illustrated in FIG. 32A to FIG. 32C, the width W1 of the first surface MP1 may be set to be wider than the width W2 of the second surface MP2; and the width W3 of the third surface MP3 may be set to be narrower than the width W4 of the fourth surface MP4. Also, as illustrated in FIG. 32D, the bypass layer 250 may be provided on the heater element 230.

This embodiment includes the following aspects.

Appendix A1

A first invention is an electrostatic chuck including a ceramic dielectric substrate, a base plate, and a heater plate, wherein a processing object is placed on the ceramic dielectric substrate; the base plate supports the ceramic dielectric substrate and is provided at a position separated from the ceramic dielectric substrate in a stacking direction; the heater plate is provided between the ceramic dielectric substrate and the base plate; the heater plate includes a first support plate, a second support plate, a first resin layer, a second resin layer, a heater element, and a first hollow portion; the first support plate includes a metal and is provided between the ceramic dielectric substrate and the base plate; the second support plate includes a metal and is provided between the first support plate and the base plate; the first resin layer is provided between the first support plate and the second support plate; the second resin layer is provided between the first resin layer and the second support plate; the heater element includes a first electrically conductive portion and a second electrically conductive portion; the first electrically conductive portion is provided between the first resin layer and the second resin layer; the second electrically conductive portion is separated from the first electrically conductive portion in an in-plane direction perpendicular to the stacking direction; the heater element generates heat due to a current flowing; the first hollow portion is defined by the second resin layer, the first resin layer, and a first side end portion in the in-plane direction of the first electrically conductive portion; and the first resin layer contacts the second resin layer between the first electrically conductive portion and the second electrically conductive portion.

According to the electrostatic chuck, the first hollow portion (a gap) is provided at the end portion of the first electrically conductive portion of the heater element. Even when the heater element undergoes thermal expansion, the first electrically conductive portion deforms to fill the first hollow portion. Therefore, the stress that is applied to the first resin layer and the second resin layer when the heater element deforms due to the thermal expansion can be reduced. Accordingly, peeling between the heater element and the first resin layer and peeling between the heater element and the second resin layer can be suppressed. Accordingly, the resistance to the load is high; and the reliability can be increased. The temperature change of the processing object occurring due to the peeling can be suppressed.

Appendix A2

A second invention is the chuck of the first invention, wherein the first electrically conductive portion includes a second side end portion separated from the first side end portion in the in-plane direction; and the heater plate has a second hollow portion defined by the second side end portion, the first resin layer, and the second resin layer.

According to the electrostatic chuck, the second hollow portion (a gap) is provided at the end portion of the first electrically conductive portion of the heater element. Even when the heater element undergoes thermal expansion, the first electrically conductive portion deforms to fill the second hollow portion. Therefore, the stress that is applied to the first resin layer and the second resin layer when the heater element deforms due to the thermal expansion can be reduced. Accordingly, peeling between the heater element and the first resin layer and peeling between the heater element and the second resin layer can be suppressed. The temperature change of the processing object occurring due to the peeling can be suppressed.

Appendix A3

A third invention is the electrostatic chuck of the first or second invention, wherein a width along the stacking direction of the first hollow portion is not more than a width along the stacking direction of the first electrically conductive portion.

According to the electrostatic chuck, even when the heater element deforms due to the thermal expansion, the stress that is applied to the first resin layer and the second resin layer can be reduced because the hollow portion is filled. Accordingly, peeling between the heater element and the first resin layer and peeling between the heater element and the second resin layer can be suppressed. The temperature change of the processing object occurring due to the peeling can be suppressed.

Appendix A4

A fourth invention is the electrostatic chuck of any one of the first to third inventions, wherein a width along the stacking direction of the first hollow portion becomes narrower away from the first side end portion in the in-plane direction.

According to the electrostatic chuck, even when the heater element deforms due to the thermal expansion, the stress that is applied to the first resin layer and the second resin layer can be reduced because the hollow portion is filled. Accordingly, peeling between the heater element and the first resin layer and peeling between the heater element and the second resin layer can be suppressed. The temperature change of the processing object occurring due to the peeling can be suppressed.

Appendix A5

A fifth invention is the electrostatic chuck of any one of the first to fourth inventions, wherein a boundary between the first hollow portion and the first resin layer approaches a virtual plane away from the first side end portion in the in-plane direction; the virtual plane extends in the in-plane direction and passes through a center in the stacking direction of the first electrically conductive portion; and a boundary between the first hollow portion and the second resin layer approaches the virtual plane away from the first side end portion in the in-plane direction.

According to the electrostatic chuck, even when the heater element deforms due to the thermal expansion, the stress that is applied to the first resin layer and the second resin layer can be reduced because the hollow portion is filled. Accordingly, peeling between the heater element and the first resin layer and peeling between the heater element and the second resin layer can be suppressed. The temperature change of the processing object occurring due to the peeling can be suppressed.

Appendix A6

A sixth invention is the electrostatic chuck of any one of the first to fourth inventions, wherein the first electrically conductive portion has an upper surface opposing the first resin layer; a boundary between the first hollow portion and the second resin layer approaches a virtual plane away from the first side end portion in the in-plane direction; and the virtual plane extends in the in-plane direction and passes through the upper surface.

According to the electrostatic chuck, even when the heater element deforms due to the thermal expansion, the stress that is applied to the first resin layer and the second resin layer can be reduced because the hollow portion is filled. Accordingly, peeling between the heater element and the first resin layer and peeling between the heater element and the second resin layer can be suppressed. The temperature change of the processing object occurring due to the peeling can be suppressed.

Appendix A7

The seventh invention is the electrostatic chuck of any one of the first to fourth inventions, wherein the first electrically conductive portion has a lower surface opposing the second resin layer; a boundary between the first hollow portion and the first resin layer approaches a virtual plane away from the first electrically conductive portion in the in-plane direction; and the virtual plane extends in the in-plane direction and passes through the lower surface.

According to the electrostatic chuck, even when the heater element deforms due to the thermal expansion, the stress that is applied to the first resin layer and the second resin layer can be reduced because the hollow portion is filled. Accordingly, peeling between the heater element and the first resin layer and peeling between the heater element and the second resin layer can be suppressed. The temperature change of the processing object occurring due to the peeling can be suppressed.

Appendix A8

An eighth invention is the electrostatic chuck of any one of the first to seventh inventions, wherein the first electrically conductive portion has an upper surface opposing the first resin layer, and a lower surface opposing the second resin layer; and a width along the in-plane direction of one surface of the upper surface or the lower surface is narrower than a width along the in-plane direction of the other surface of the upper surface or the lower surface.

According to the electrostatic chuck, even when the heater element deforms due to the thermal expansion, the stress that is applied to the first resin layer and the second resin layer can be reduced because the hollow portion is filled. Accordingly, peeling between the heater element and the first resin layer and peeling between the heater element and the second resin layer can be suppressed. The temperature change of the processing object occurring due to the peeling can be suppressed.

Appendix A9

A ninth invention is the electrostatic chuck of the eighth invention, wherein the length along the in-plane direction of the lower surface of the first electrically conductive portion is longer than the length along the in-plane direction of the upper surface of the first electrically conductive portion.

Because the base plate exists, the temperature below the heater element may become lower than the temperature above the heater element; and a bias may occur in the heat distribution in the vertical direction. According to the electrostatic chuck, such a bias of the heat distribution in the vertical direction can be suppressed.

Appendix A10

A tenth invention is the electrostatic chuck of the eighth invention, wherein the length along the in-plane direction of the upper surface of the first electrically conductive portion is longer than the length along the in-plane direction of the lower surface of the first electrically conductive portion.

According to the electrostatic chuck, because the upper surface of the heater element is long, it can be easier to heat above the heater element where the processing object is disposed. Also, because the lower surface of the heater element is relatively short, it can be easier to cool below the heater element. Thereby, the temperature responsiveness (the ramp rate) can be improved.

Appendix A11

An eleventh invention is the electrostatic chuck of any one of the eighth to tenth inventions, wherein the one surface and a side surface of the first electrically conductive portion are connected by a curved surface.

According to the electrostatic chuck, even when the heater element deforms due to the thermal expansion, the stress that is applied to the first resin layer and the second resin layer can be reduced because the hollow portion is filled. Accordingly, peeling between the heater element and the first resin layer and peeling between the heater element and the second resin layer can be suppressed. The temperature change of the processing object occurring due to the peeling can be suppressed.

Appendix A12

A twelfth invention is the electrostatic chuck of any one of the eighth to eleventh inventions, wherein a side surface of the first electrically conductive portion is rougher than the other surface.

According to the electrostatic chuck, even when the heater element deforms due to the thermal expansion, the stress that is applied to the first resin layer and the second resin layer can be reduced because the hollow portion is filled. Accordingly, peeling between the heater element and the first resin layer and peeling between the heater element and the second resin layer can be suppressed. The temperature change of the processing object occurring due to the peeling can be suppressed.

Appendix A13

A thirteenth invention is the electrostatic chuck of any one of the eighth to twelfth inventions, wherein a distance between a center virtual plane and one support plate of the first support plate or the second support plate is shorter than a distance between the center virtual plane and the other support plate of the first support plate or the second support plate; the center virtual plane extends in the in-plane direction and passes through a center in the stacking direction of the first electrically conductive portion; and the one surface is positioned between the one support plate and the center virtual plane.

According to the electrostatic chuck, even when the heater element deforms due to the thermal expansion, the stress that is applied to the first resin layer and the second resin layer can be reduced because the hollow portion is filled. Accordingly, peeling between the heater element and the first resin layer and peeling between the heater element and the second resin layer can be suppressed. The temperature change of the processing object occurring due to the peeling can be suppressed.

Appendix A14

A fourteenth invention is the electrostatic chuck of any one of the first to thirteenth inventions, wherein the first support plate is electrically coupled to the second support plate.

According to the electrostatic chuck, the heater element can be shielded from high frequency waves. Thereby, the heat generation of the heater element to an abnormal temperature can be suppressed. Also, the impedance of the heater plate can be suppressed.

Appendix A15

A fifteenth invention is the electrostatic chuck of the fourteenth invention, wherein a surface area of the region where the first support plate is coupled to the second support plate is narrower than a surface area of an upper surface of the first support plate and narrower than a surface area of a lower surface of the second support plate.

According to the electrostatic chuck, the heater element can be shielded from high frequency waves. Thereby, the heat generation of the heater element to an abnormal temperature can be suppressed. Also, the impedance of the heater plate can be suppressed.

Appendix A16

A sixteenth invention is the electrostatic chuck of any one of the first to fifteenth inventions, wherein an upper surface of the first support plate has a first unevenness; and a lower surface of the second support plate has a second unevenness.

According to the electrostatic chuck, because the upper surface of the first support plate has the first unevenness, the bonding surface area between the first support plate and the heater element can be wider; and the bonding strength between the first support plate and the heater element can be increased. Also, because the lower surface of the second support plate has the second unevenness, the bonding surface area between the second support plate and the heater element can be wider; and the bonding strength between the second support plate and the heater element can be increased. Further, because the upper surface of the first support plate has the first unevenness, the distance between the heater element and the processing object can be shorter. Thereby, the speed of increasing the temperature of the processing object can be increased.

Appendix A17

A seventeenth invention is the electrostatic chuck of the sixteenth invention, wherein the first unevenness follows a configuration of the heater element; and the second unevenness follows a configuration of the heater element.

According to the electrostatic chuck, the bonding surface area between the first support plate and the heater element can be wider; and the bonding strength between the first support plate and the heater element can be increased. Also, the bonding surface area between the second support plate and the heater element can be wider; and the bonding strength between the second support plate and the heater element can be increased. Further, the distance between the heater element and the processing object can be shorter. Thereby, the speed of increasing the temperature of the processing object can be increased.

Appendix A18

An eighteenth invention is the electrostatic chuck of the seventeenth invention, wherein a distance between a recess of the first unevenness and a recess of the second unevenness is shorter than a distance between a protrusion of the first unevenness and a protrusion of the second unevenness.

According to the electrostatic chuck, the bonding surface area between the first support plate and the heater element can be wider; and the bonding strength between the first support plate and the heater element can be increased. Also, the bonding surface area between the second support plate and the heater element can be wider; and the bonding strength between the second support plate and the heater element can be increased. Further, the distance between the heater element and the processing object can be shorter. Thereby, the speed of increasing the temperature of the processing object can be increased.

Appendix A19

A nineteenth invention is the electrostatic chuck of any one of the sixteenth to eighteenth inventions, wherein a height of the first unevenness is different from a height of the second unevenness.

According to the electrostatic chuck, the bonding surface area between the first support plate and the heater element can be wider; and the bonding strength between the first support plate and the heater element can be increased. Also, the bonding surface area between the second support plate and the heater element can be wider; and the bonding strength between the second support plate and the heater element can be increased. Further, the distance between the heater element and the processing object can be shorter. Thereby, the speed of increasing the temperature of the processing object can be increased.

Appendix A20

A twentieth invention is the electrostatic chuck of any one of the first to nineteenth inventions, wherein the heater element includes a heater electrode having a band configuration; and the heater electrode is provided in a state of being mutually-independent in multiple regions.

According to the electrostatic chuck, the temperature in the surface of the processing object can be controlled independently for each region because the heater electrode is provided in the state of being mutually-independent in multiple regions. Thereby, a difference of the temperature in the surface of the processing object can be provided deliberately (temperature controllability).

Appendix A21

A twenty-first invention is the electrostatic chuck of any one of the first to twentieth inventions, wherein the heater element is multiply provided; and the multiple heater elements are provided in a state of being independent in mutually-different layers.

According to the electrostatic chuck, the temperature in the surface of the processing object can be controlled independently for each region because the heater element is provided in the state of being independent in mutually-different layers. Thereby, a difference of the temperature in the surface of the processing object can be provided deliberately (temperature controllability).

Appendix A22

A twenty-second invention is the electrostatic chuck of any one of the first to twentieth inventions, wherein the heater plate further includes a bypass layer provided between the first support plate and the second support plate; and the bypass layer is electrically conductive.

According to the electrostatic chuck, the degrees of freedom of the arrangement of the terminals supplying electrical power to the heater element can be increased. By providing the bypass layer, terminals that have large thermal capacities may not be directly coupled to the heater element compared to the case where the bypass layer is not provided. Thereby, the uniformity of the temperature distribution in the surface of the processing object can be increased. Also, compared to the case where the bypass layer is not provided, the terminals may not be coupled to the thin heater element. Thereby, the reliability of the heater plate can be increased.

Appendix A23

A twenty-third invention is the electrostatic chuck of the twenty-second invention, wherein the heater element is electrically coupled to the bypass layer and electrically insulated from the first support plate and the second support plate.

According to the electrostatic chuck, the electrical power from the outside can be supplied to the heater element via the bypass layer.

Appendix A24

A twenty-fourth invention is the electrostatic chuck of the twenty-second or twenty-third invention, wherein a thickness of the bypass layer is thicker than a thickness of the first resin layer.

According to the electrostatic chuck, the degrees of freedom of the arrangement of the terminals supplying electrical power to the heater element can be increased. Also, the electrical resistance of the bypass layer can be suppressed; and the heat generation amount of the bypass layer can be suppressed.

Appendix A25

A twenty-fifth invention is the electrostatic chuck of any one of the twenty-second to twenty-fourth inventions, wherein a thickness of the bypass layer is thicker than a thickness of the heater element.

According to the electrostatic chuck, the degrees of freedom of the arrangement of the terminals supplying electrical power to the heater element can be increased. Also, the electrical resistance of the bypass layer can be suppressed; and the heat generation amount of the bypass layer can be suppressed.

Appendix A26

A twenty-sixth invention is the electrostatic chuck of any one of the twenty-second to twenty-fifth inventions, wherein the bypass layer is provided between the heater element and the base plate.

According to the electrostatic chuck, the bypass layer suppresses the transfer of the heat supplied from the heater element to the base plate. That is, the bypass layer has a thermal insulation effect for the base plate side when viewed from the bypass layer; and the uniformity of the temperature distribution in the surface of the processing object can be increased.

Appendix A27

A twenty-seventh invention is the electrostatic chuck of any one of the twenty-second to twenty-fifth inventions, wherein the bypass layer is provided between the heater element and the ceramic dielectric substrate.

According to the electrostatic chuck, the heat of the heater element where the temperature is highest can be transferred quickly to the base plate at the instant that the voltage supply to the heater plate is cut off; and the temperature responsiveness (the ramp rate) when reducing the temperature of the processing object can be improved further.

Appendix A28

A twenty-eighth invention is the electrostatic chuck of any one of the twenty-second to twenty-seventh inventions, wherein the heater plate further has a hollow portion provided at a side of the bypass layer.

According to the electrostatic chuck, even when the bypass layer undergoes thermal expansion, the bypass layer deforms to fill the hollow portion. Therefore, the stress that is applied to the resin layers, etc., adjacent to the bypass layer can be reduced. Accordingly, peeling of the resin layers, etc., adjacent to the bypass layer can be suppressed. For example, the resistance of the heater plate to the load can be improved; and the reliability of the electrostatic chuck can be increased further. Further, the temperature change of the processing object occurring due to the peeling of the layers adjacent to the bypass layer can be suppressed.

Appendix A29

A twenty-ninth invention is the electrostatic chuck of the twenty-eighth invention, wherein a size relationship between the cross-sectional area of the first hollow portion and the cross-sectional area of the hollow portion at the side of the bypass layer is the same as a size relationship between the thickness of the heater element and the thickness of the bypass layer.

In the case where the thickness is thick, the volume increase due to thermal expansion becomes large. Therefore, a larger cross-sectional area of the hollow portion is advantageous for peeling suppression of the adjacent layers. Accordingly, according to the electrostatic chuck, peeling of the layers adjacent to the first electrically conductive portion and the bypass layer can be suppressed further. The temperature change of the processing object due to the occurrence of the peeling can be suppressed more reliably.

Appendix A30

A thirtieth invention is the electrostatic chuck of the twenty-eighth or twenty-ninth inventions, wherein a side end of the first hollow portion is shifted toward the first support plate side or the second support plate side with respect to a center in a thickness direction of the first electrically conductive portion; and a side end of the hollow portion at the side of the bypass layer is shifted in the same direction as the side end of the first hollow portion with respect to a center in a thickness direction of the bypass layer.

According to the electrostatic chuck, it is unnecessary to use a complex method, etc., to form the first hollow portion and the hollow portion of the bypass layer; and the formation of the first hollow portion and the hollow portion of the bypass layer can be easy.

Appendix A31

The thirty-first invention is the electrostatic chuck of any one of the twenty-second to thirtieth inventions, wherein the heater element has a first surface on the first support plate side, and a second surface on the second support plate side; a width of the first surface is different from a width of the second surface; the bypass layer has a third surface on the first support plate side, and a fourth surface on the second support plate side; a width of the third surface is different from a width of the fourth surface; and a width size relationship of the third surface to the fourth surface is the same as a width size relationship of the first surface to the second surface.

According to the electrostatic chuck, in the case where the widths of the first surface and the third surface are narrow, the fluctuation of the heat distribution in a direction perpendicular to the first to fourth surfaces can be suppressed further. Conversely, in the case where the widths of the first surface and the third surface are wide, the first surface side and the third surface side retain heat easily; the heat of the second surface side and the fourth surface side is cooled easily; and the temperature responsiveness (the ramp rate) can be improved further.

Appendix A32

A thirty-second invention is the electrostatic chuck of any one of the twenty-second to thirtieth inventions, wherein the heater element has a first surface on the first support plate side, and a second surface on the second support plate side; a width of the first surface is different from a width of the second surface; the bypass layer has a third surface on the first support plate side, and a fourth surface on the second support plate side; a width of the third surface is different from a width of the fourth surface; and a width size relationship of the third surface to the fourth surface is the opposite of a width size relationship of the first surface to the second surface.

According to the electrostatic chuck, the direction of the stress applied by the thermal expansion of the bypass layer can have the reverse orientation of the direction of the stress applied by the thermal expansion of the heater element. Thereby, the effects of the stress can be suppressed further.

Appendix A33

A thirty-third invention is the electrostatic chuck of any one of the first to thirty-second inventions, wherein a surface area of an upper surface of the first support plate is greater than a surface area of a lower surface of the second support plate.

According to the electrostatic chuck, the terminals that supply electrical power to the heater element can be connected more easily on the second support plate side when viewed from the heater element.

Appendix A34

A thirty-fourth invention is the electrostatic chuck of any one of the first to thirty-third inventions, wherein the first support plate includes multiple supporters; and the multiple supporters are provided in a mutually-independent state.

According to the electrostatic chuck, a temperature difference in the diametrical direction can be provided deliberately in the surface of the first support plate (temperature controllability). For example, a temperature difference can be provided in a step configuration from the central portion to the outer perimeter portion in the surface of the first support plate. Thereby, a temperature difference can be provided deliberately in the surface of the processing object (temperature controllability).

Appendix A35

A thirty-fifth invention is the electrostatic chuck of any one of the first to thirty-fourth inventions, wherein a surface of the first support plate on the second support plate side includes a first region and a second region; when viewed along the stacking direction, the first region overlaps the heater element, and the second region does not overlap the heater element; and in a cross section parallel to the stacking direction, the second region protrudes toward the second support plate side compared to the first region.

According to the electrostatic chuck, the adhesion between the first support plate and the layers proximal to the first support plate can be improved. Thereby, the designed thermal uniformity and withstand voltage characteristics can be realized.

Appendix A36

A thirty-sixth invention is the electrostatic chuck of the thirty-fifth invention, wherein a surface of the second support plate on the first support plate side includes a third region and a fourth region; when viewed along the stacking direction, the third region overlaps the heater element, and the fourth region does not overlap the heater element; and in a cross section parallel to the stacking direction, the fourth region protrudes toward the first support plate side compared to the third region.

According to the electrostatic chuck, the adhesion between the second support plate and the layers proximal to the second support plate can be improved. Thereby, the designed thermal uniformity and withstand voltage characteristics can be realized.

Appendix A37

A thirty-seventh invention is the electrostatic chuck of the thirty-fifth or thirty-sixth invention, wherein a surface of the first support plate on the second support plate side has an unevenness following a configuration of the heater element; and a surface of the second support plate on the first support plate side has an unevenness following a configuration of the heater element.

According to the electrostatic chuck, the designed thermal uniformity and withstand voltage characteristics can be realized. Also, the speed of increasing the temperature of the processing object can be increased. Accordingly, for example, it is possible to realize both the "heating performance (the temperature increase rate) of the heater" and the "temperature uniformity" "withstand voltage reliability."

Appendix A38

A thirty-eighth invention is the electrostatic chuck of the thirty-sixth invention, wherein a distance along the stacking direction between the second region and the fourth region is shorter than a distance along the stacking direction between the first region and the third region.

According to the electrostatic chuck, the adhesion between the first support plate and the layers proximal to the first support plate is high. Also, the adhesion between the second support plate and the layers proximal to the second support plate is high. Thereby, the designed thermal uniformity and withstand voltage characteristics can be realized. Also, the speed of increasing the temperature of the processing object can be increased. Accordingly, for example, it is possible to realize both the "heating performance (the temperature increase rate) of the heater" and the "temperature uniformity" "withstand voltage reliability."

Appendix B1

An electrostatic chuck being of a structure layered in a thickness direction and extensive in parallel to a horizontal plane, comprising:
a ceramic dielectric substrate extensive in parallel to the horizontal plane and layered in the electrostatic chuck, the ceramic dielectric substrate being configured such that a processing object is placed thereon;
a base plate extensive in parallel to the horizontal plane and layered in the electrostatic chuck at a vertical distance measured from the ceramic dielectric substrate in the thickness direction so as to support the ceramic dielectric substrate from below the ceramic dielectric substrate; and
a heater plate extensive in parallel to the horizontal plane and layered in the electrostatic chuck between the ceramic dielectric substrate and the base plate,
wherein the heater plate comprising:
a first support plate extensive in the heater plate in parallel to the horizontal plane and layered between the ceramic dielectric substrate and the base plate, the first support plate being metallic;
a second support plate extensive in the heater plate in parallel to the horizontal plane and layered between the first support plate and the base plate, the second support plate being metallic;
a heater layer extensive in the heater plate in parallel to the horizontal plane and layered between the first and second support plates, the heater layer being energized by electric current to emit heat, the heater including a first electrically conductive segment and a second electrically conductive segment lying in the heater layer in separation from each other, the first and second electrically conductive segments each having first and second side surfaces arranged in a lying direction of the first and second electrically conductive segments in the heater layer;
a first resin layer extensive in the heater plate in parallel to the horizontal plane and layered between the first support plate and the heater layer to electrically isolate the heater layer from the first support plate; and
a second resin layer extensive in the heater plate in parallel to the horizontal plane and layered between the heater layer and the second support plate to electrically isolate the heater from the second support plate,
wherein the first and second resin layers are in contact to each other in a region extensive in the lying direction of the first and second electrically conductive segments between the first and second electrically conductive segments, except a hollow space, which separates the first and second resin layers in the thickness direction, formed adjacent to at least one of the first or second side surface of at least one of the first or second electrically conductive segment.

Appendix B2

The electrostatic chuck according to appendix B1, wherein the first electrically conductive segment has a hollow space to separate the first and second resin layers adjacent to both first and second side surfaces of the first electrically conductive segment.

Appendix B3

The electrostatic chuck according to appendix B1, wherein the hollow space has a height measured in the thickness direction which is not greater than a height of the first electrically conductive segment.

Appendix B4

The electrostatic chuck according to appendix B1, wherein the hollow space has a height measured in the thickness direction which becomes progressively narrower as a point at which the height is measured becomes away in the lying direction from the first side surface of the first electrically conductive segment.

Appendix B5

The electrostatic chuck according to appendix B1, wherein the first and second resin layers being in contact with each other form a bound between the first and second layers, the bound being extensive in a contact plane parallel to the horizontal plane, the contact plane passing through a center, in the thickness direction, of the first electrically conductive segment, and the first and resin layers are inclined toward the contact plane in the hollow space from the first side surface of the first electrically conductive segment to meet each other at the contact plane.

Appendix B6

The electrostatic chuck according to appendix B1, wherein the first electrically conductive segment has an upper surface being in contact with the first resin layer, and the first and second resin layers being in contact with each other form a bound between the first and second layers, the bound being extensive in a contact plane parallel to the horizontal plane, the contact plane passing along the upper surface of the first electrically conductive segment.

Appendix B7

The electrostatic chuck according to appendix B1, wherein the first electrically conductive segment has a lower surface being in contact with the second resin layer, and the first and second resin layers being in contact with each other form a bound between the first and second layers, the bound being extensive in a contact plane parallel to the horizontal plane, the contact plane passing along the lower surface of the first electrically conductive segment.

Appendix B8

The electrostatic chuck according to appendix B1, wherein the first electrically conductive segment has an upper surface being in contact with the first resin layer and a lower surface being in contact with the second resin layer, and one of the upper or lower surface is narrower in the lying direction of the first electrically conductive segment than the other of the upper or lower surface.

Appendix B9

The electrostatic chuck according to appendix B8, wherein the upper surface is narrower in the lying direction than the lower surface.

Appendix B10

The electrostatic chuck according to appendix B8, wherein the lower surface is narrower in the lying direction than the upper surface.

Appendix B11

The electrostatic chuck according to appendix B8, wherein said one of the upper or lower surface of the first electrically conductive segment is connected to one of the first or second side surface thereof with a curved surface.

Appendix B12

The electrostatic chuck according to appendix B8, wherein the first and second side surfaces of the first electrically conductive portion are rougher than the upper and lower surfaces thereof.

Appendix B13

The electrostatic chuck according to appendix B5, wherein the first and second resin layers each have an inner surface facing the heater layer, and a distance between the inner surface of one of the first or second resin layer and the contact plane passing through the center of the first electrically conductive segment is greater than a distance between the inner surface of the other of the first or second resin layer and the contact plane passing through the center of the first electrically conductive segment.

Appendix B14

The electrostatic chuck according to appendix B1, wherein the first support plate is electrically coupled to the second support plate with a conductive pillar.

Appendix B15

The electrostatic chuck according to appendix B14, wherein a cross-section of the conductive pillar measured between the first and second support plates is narrower than an upper surface of the first support plate and narrower than a lower surface of the second support plate.

Appendix B16

The electrostatic chuck according to appendix B15, wherein the upper surface of the first support plate has convex regions where the upper surface is shaped to separate away from the second support plate, and a concave region between two adjacent convex regions where the upper surface is shaped to approach toward the second support plate, and the lower surface of the second support plate has convex regions where the lower surface is shaped to separate away from the first support plate, and a concave region between two adjacent convex regions where the lower surface is shaped to approach toward the first support plate.

Appendix B17

The electrostatic chuck according to appendix B16, wherein the convex regions of the upper surface of the first support plate and the lower surface of the second support plate are formed where the first and second resin layers are in contact with the first and second electrically conductive segments, and the concave regions of the upper surface of the first support plate and the lower surface of the second support plate are formed wherein the first and second resin layers are in contact with each other between the first and second electrically conductive segments.

Appendix B18

The electrostatic chuck according to appendix B17, wherein a distance measured in the thickness direction between the concave regions of the upper and lower surfaces of the first and second support plates is shorter than a distance measured in the thickness direction between the convex regions of the upper and lower surfaces of the first and second support plates.

Appendix B19

The electrostatic chuck according to appendix B16, wherein a maximum height measured in the thickness direction between the convex and concave regions of the upper surface of the first support plate is different from a maximum height measured in the thickness direction between the convex and concave regions of the lower surface of the second support plate.

Appendix B20

The electrostatic chuck according to appendix B1, further comprising a plurality of heater electrodes connected to different sections of the heater layer.

Appendix B21

The electrostatic chuck according to appendix B20, wherein the plurality of heater electrodes are provided in different layers of the electrostatic chuck.

Appendix B22

The electrostatic chuck according to appendix B1, wherein the heater plate further includes an electrically conductive bypass layer extensive in parallel to the horizontal plane and layered in the thickness direction between the first support plate and the second support plate.

Appendix B23

The electrostatic chuck according to appendix B22, wherein the heater layer is electrically coupled to the bypass layer and electrically insulated from the first support plate and the second support plate.

Appendix B24

The electrostatic chuck according to appendix B22, wherein the bypass layer has a thickness in the thickness direction that is thicker than a thickness of the first resin layer.

Appendix B25

The electrostatic chuck according to appendix B22, wherein the bypass layer has a thickness in the thickness direction that is thicker than a thickness of the heater layer.

Appendix B26

The electrostatic chuck according to appendix B22, wherein the bypass layer is layered between the heater and the base plate.

Appendix B27

The electrostatic chuck according to appendix B22, wherein the bypass layer is layered between the heater and the ceramic dielectric substrate.

Appendix B28

The electrostatic chuck according to appendix B22, wherein the bypass layer comprises a plurality of bypass segments lying in the bypass layer, a hollow space being formed adjacent to at least one of sides of a bypass segment arranged in a lying direction of the bypass segments.

Appendix B29

The electrostatic chuck according to appendix B28, wherein a size ratio between the hollow space measured at the first side surface of the first electrically conductive segment and the hollow space measured at the side of the bypass segment is equal to a ratio between a thickness, in the thickness direction, of the first electrically conductive segment and a thickness, in the thickness direction, of the bypass segment.

Appendix B30

The electrostatic chuck according to appendix B28, wherein the hollow space formed at the first side surface of the first electrically conductive segment comprises a side parallel to one of the first support plate or the second support plate and another side tapered toward said one of the first support plate or the second support plate, and
the hollow space formed at the side of the bypass segment comprises a side parallel to said one of the first support plate or the second support plate and another side tapered toward said one of the first support plate or the second support plate.

Appendix B31

The electrostatic chuck according to appendix B22, wherein
the first electrically conductive segment has a first surface facing the first support plate and a second surface facing the second support plate, and
the bypass segment has a third surface facing the first support plate side and a fourth surface facing the second support plate side, wherein the first surface and the third surface are shorter or longer in the lying direction than the second surface and the fourth surface, respectively.

Appendix B32

The electrostatic chuck according to appendix B22, wherein
the first electrically conductive segment has a first surface facing the first support plate side and a second surface facing the second support plate side, and
the bypass segment has a third surface facing the first support plate side and a fourth surface facing the second support plate side, wherein the first surface and the fourth surface are shorter or longer in the lying direction than the second surface and the third surface, respectively Appendix B33

The electrostatic chuck according to appendix B1, wherein the first support plate has an upper surface larger than a lower surface of the second support plate.

Appendix B34

The electrostatic chuck according to appendix B1, wherein the first support plate comprises a plurality of support sections, the plurality of support sections being electrically isolated from one another.

Appendix B35

The electrostatic chuck according to any one of appendixes B1 to B34, wherein
the first support plate has a lower surface facing the second support plate, the lower surface comprising first regions located directly above the first and second electrically conductive segments in the thickness direction and a second region located directly above a region between the first and second electrically conductive segments in the thickness direction, the second region being situated lower in the thickness direction than the first regions.

Appendix B36

The electrostatic chuck according to appendix B35, wherein
the second support plate has an upper surface facing the first support plate, the upper surface comprising third regions located directly below the first and second electrically conductive segments in the thickness direction and a fourth region located directly below a region between the first and second electrically conductive segments, the fourth region being situated higher in the thickness direction than the third regions.

Appendix B37

The electrostatic chuck according to appendix B35, wherein
the lower surface of the first support plate has (i) first convex regions located directly above the first and second electrically conductive segments in the thickness direction, the first convex regions being shaped to separate away from the second support plate, and (ii) a first concave region located directly above a region between the first and second electrically conductive segments, the first concave region being shaped to approach toward the second support plate, and
the upper surface of the second support plate has (i) second concave regions located directly below the first and second electrically conductive segments in the thickness direction, the second concave regions being shaped to separate away from the first support plate, and (ii) a second convex region located directly below a region between the first and second electrically conductive segments, the second convex region being shaped to approach toward the first support plate.

Appendix B38

The electrostatic chuck according to appendix B36, wherein a distance measured in the thickness direction between the second region and the fourth region is shorter than a distance measured in the thickness direction between the first region and the third region.

Hereinabove, embodiments of the invention are described. However, the invention is not limited to these descriptions. Appropriate design modifications made by one skilled in the art in regard to the embodiments described above also are within the scope of the invention to the extent that the features of the invention are included. For example, the configurations, the dimensions, the material properties, the dispositions, etc., of components included in the heater plate 200, 200a, 200b, the disposition methods of the heater element 230, the first heater element 230a, the second heater element 230b, and the bypass layer 250, etc., are not limited to those illustrated and may be modified appropriately.

The components included in the embodiments described above can be combined within the extent of technical feasibility; and such combinations are included in the scope of the invention to the extent that the features of the invention are included.

What is claimed is:
1. An electrostatic chuck, comprising:
a ceramic dielectric substrate where a processing object is placed;
a base plate supporting the ceramic dielectric substrate and being provided at a position separated from the ceramic dielectric substrate in a stacking direction; and
a heater plate provided between the ceramic dielectric substrate and the base plate,
the heater plate including
a first support plate including a metal and being provided between the ceramic dielectric substrate and the base plate,
a second support plate including a metal and being provided between the first support plate and the base plate,
a first resin layer provided between the first support plate and the second support plate,
a second resin layer provided between the first resin layer and the second support plate,
a heater element provided between the first resin layer and the second resin layer, the heater element emitting heat due to a current flowing, the heater element including a first electrically conductive portion and a second electrically conductive portion, the second electrically conductive portion being separated from the first electrically conductive portion in an in-plane direction perpendicular to the stacking direction, and
a first hollow portion defined by the second resin layer, the first resin layer, and a first side end portion in the in-plane direction of the first electrically conductive portion,
the first resin layer contacting the second resin layer between the first electrically conductive portion and the second electrically conductive portion,
the first electrically conductive portion having an upper surface opposing the first resin layer, and
a boundary between the first hollow portion and the second resin layer approaching a virtual plane away from the first side end portion in the in-plane direction, the virtual plane extending in the in-plane direction and passing through the upper surface.
2. The electrostatic chuck according to claim 1, wherein
the first electrically conductive portion includes a second side end portion separated from the first side end portion in the in-plane direction, and
the heater plate has a second hollow portion, the second hollow portion being defined by the second side end portion, the first resin layer, and the second resin layer.
3. The electrostatic chuck according to claim 1, wherein a width along the stacking direction of the first hollow portion is not more than a width along the stacking direction of the first electrically conductive portion.
4. The electrostatic chuck according to claim 1, wherein a width along the stacking direction of the first hollow portion becomes narrower away from the first side end portion in the in-plane direction.

5. The electrostatic chuck according to claim 1, wherein
the first electrically conductive portion has a lower surface opposing the second resin layer, and
a width along the in-plane direction of one surface of the upper surface or the lower surface is narrower than a width along the in-plane direction of the other surface of the upper surface or the lower surface.

6. The electrostatic chuck according to claim 5, wherein the one surface and a side surface of the first electrically conductive portion are connected by a curved surface.

7. The electrostatic chuck according to claim 5, wherein a side surface of the first electrically conductive portion is rougher than the other surface.

8. The electrostatic chuck according to claim 5, wherein
a distance between a center virtual plane and one support plate of the first support plate or the second support plate is shorter than the distance between the center virtual plane and the other support plate of the first support plate or the second support plate, the center virtual plane extending in the in-plane direction and passing through a center in the stacking direction of the first electrically conductive portion, and
the one surface is positioned between the one support plate and the center virtual plane.

9. The electrostatic chuck according to claim 1, wherein the first support plate is electrically coupled to the second support plate.

10. The electrostatic chuck according to claim 9, wherein a surface area of a region where the first support plate is coupled to the second support plate is narrower than a surface area of an upper surface of the first support plate and narrower than a surface area of a lower surface of the second support plate.

11. The electrostatic chuck according to claim 1, wherein
an upper surface of the first support plate includes a first unevenness, and
a lower surface of the second support plate includes a second unevenness.

12. The electrostatic chuck according to claim 11, wherein
the first unevenness follows a configuration of the heater element, and
the second unevenness follows a configuration of the heater element.

13. The electrostatic chuck according to claim 12, wherein a distance between a recess of the first unevenness and a recess of the second unevenness is shorter than a distance between a protrusion of the first unevenness and a protrusion of the second unevenness.

14. The electrostatic chuck according to claim 11, wherein a height of the first unevenness is different from a height of the second unevenness.

15. The electrostatic chuck according to claim 1, wherein
the heater element includes a heater electrode having a band configuration, and
the heater electrode is provided in a state of being mutually-independent in a plurality of regions.

16. The electrostatic chuck according to claim 1, wherein
a plurality of the heater elements is provided, and
the plurality of heater elements is provided in a state of being independent in mutually-different layers.

17. The electrostatic chuck according to claim 1, wherein the heater plate further includes a bypass layer provided between the first support plate and the second support plate, the bypass layer being electrically conductive.

18. The electrostatic chuck according to claim 17, wherein the heater element is electrically coupled to the bypass layer and electrically insulated from the first support plate and the second support plate.

19. The electrostatic chuck according to claim 17, wherein the heater plate further has a hollow portion provided at a side of the bypass layer.

20. The electrostatic chuck according to claim 19, wherein
a side end of the first hollow portion is shifted toward the first support plate side or the second support plate side with respect to a center in a thickness direction of the first electrically conductive portion, and
a side end of the hollow portion at the side of the bypass layer is shifted in the same direction as the side end of the first hollow portion with respect to a center in a thickness direction of the bypass layer.

21. The electrostatic chuck according to claim 17, wherein
the heater element has a first surface on the first support plate side, and a second surface on the second support plate side,
a width of the first surface is different from a width of the second surface,
the bypass layer has a third surface on the first support plate side, and a fourth surface on the second support plate side,
a width of the third surface is different from a width of the fourth surface, and
a width size relationship of the third surface to the fourth surface is the same as a width size relationship of the first surface to the second surface.

22. The electrostatic chuck according to claim 17, wherein
the heater element has a first surface on the first support plate side, and a second surface on the second support plate side,
a width of the first surface is different from a width of the second surface,
the bypass layer has a third surface on the first support plate side, and a fourth surface on the second support plate side,
a width of the third surface is different from a width of the fourth surface, and
a width size relationship of the third surface to the fourth surface is the opposite of a width size relationship of the first surface to the second surface.

23. The electrostatic chuck according to claim 1, wherein a surface area of an upper surface of the first support plate is greater than a surface area of a lower surface of the second support plate.

24. The electrostatic chuck according to claim 1, wherein the first support plate includes a plurality of supporters, and
the plurality of supporters is provided in a mutually-independent state.

25. The electrostatic chuck according to claim 1, wherein
a surface of the first support plate on the second support plate side includes a first region and a second region, the first region overlapping the heater element when viewed along the stacking direction, the second region not overlapping the heater element when viewed along the stacking direction, and
in a cross section parallel to the stacking direction, the second region protrudes toward the second support plate side compared to the first region.

26. The electrostatic chuck according to claim 25, wherein
a surface of the second support plate on the first support plate side includes a third region and a fourth region, the third region overlapping the heater element when viewed along the stacking direction, the fourth region not overlapping the heater element when viewed along the stacking direction, and in a cross section parallel to the stacking direction, the fourth region protrudes toward the first support plate side compared to the third region.

27. An electrostatic chuck, comprising:

a ceramic dielectric substrate where a processing object is placed;

a base plate supporting the ceramic dielectric substrate and being provided at a position separated from the ceramic dielectric substrate in a stacking direction; and a heater plate provided between the ceramic dielectric substrate and the base plate, the heater plate including
- a first support plate including a metal and being provided between the ceramic dielectric substrate and the base plate,
- a second support plate including a metal and being provided between the first support plate and the base plate,
- a first resin layer provided between the first support plate and the second support plate,
- a second resin layer provided between the first resin layer and the second support plate,
- a heater element provided between the first resin layer and the second resin layer, the heater element emitting heat due to a current flowing, the heater element including a first electrically conductive portion and a second electrically conductive portion, the second electrically conductive portion being separated from the first electrically conductive portion in an in-plane direction perpendicular to the stacking direction, and
- a first hollow portion defined by the second resin layer, the first resin layer, and a first side end portion in the in-plane direction of the first electrically conductive portion, the first resin layer contacting the second resin layer between the first electrically conductive portion and the second electrically conductive portion, the first electrically conductive portion having a lower surface opposing the second resin layer, a boundary between the first hollow portion and the first resin layer approaching a virtual plane away from the first electrically conductive portion in the in-plane direction, the virtual plane extending in the in-plane direction and passing through the lower surface.

* * * * *